United States Patent [19]

Okamoto

[11] Patent Number: 5,636,150
[45] Date of Patent: Jun. 3, 1997

[54] DATA DRIVEN TYPE DIGITAL FILTER UNIT AND DATA DRIVEN TYPE INFORMATION PROCESSOR INCLUDING THE SAME

[75] Inventor: Toshiya Okamoto, Souraku-gun, Japan

[73] Assignee: Sharp Kabushiki Kaisha, Osaka-fu, Japan

[21] Appl. No.: 416,538

[22] Filed: Apr. 3, 1995

Related U.S. Application Data

[63] Continuation of Ser. No. 84,000, Jun. 29, 1993, abandoned.

[30] Foreign Application Priority Data

Aug. 6, 1992 [JP] Japan ................................. 4-209918
Dec. 7, 1992 [JP] Japan ................................. 4-326742

[51] Int. Cl.⁶ ............................................... G06F 17/10
[52] U.S. Cl. ............................ 364/724.01; 364/724.17
[58] Field of Search ....................... 364/736, 724.01, 364/724.02, 724.03, 724.13, 724.15, 724.16, 724.17

[56] References Cited

U.S. PATENT DOCUMENTS

| | | | |
|---|---|---|---|
| 4,561,065 | 12/1985 | Matsuda | 364/724.17 |
| 4,675,806 | 6/1987 | Uchida | 395/375 |
| 4,943,916 | 7/1990 | Asano et al. | 395/775 |
| 5,043,880 | 8/1991 | Yoshida | 395/375 |
| 5,210,705 | 5/1993 | Chauvel et al. | 364/724.01 X |
| 5,241,492 | 8/1993 | Girardeau, Jr. | 364/736 |
| 5,257,392 | 10/1993 | Okamoto | 395/800 |
| 5,260,897 | 11/1993 | Toriumi et al. | 364/736 |
| 5,307,300 | 4/1994 | Komoto et al. | 364/736 |
| 5,327,569 | 7/1994 | Shima et al. | 395/800 |

FOREIGN PATENT DOCUMENTS 471085  3/1992  Japan .

*Primary Examiner*—Chuong D. Ngo

[57] ABSTRACT

A data driven filter unit includes a register file including a plurality of registers, a first computing element group including a multiplier, a second computing element group including an add/shift composite computing element, an input part for writing externally received data in a register, specified by a program, in the register file, and an output part for outputting register data, specified by a program, in the register file to the exterior of the unit. The register file includes a plurality of registers, and a single entry corresponds to a single fir or iir instruction. The register file stores external data, data being processed, a constant and an initial value. This register file executes reading and writing along a rule of single substitution/single readout. This program is read from a program memory provided in the filter unit, so that required data is stored in the register file. Connection between the register file and a computing element is decided by the program. This filter unit is especially suited for use combination with a data driven type information processor, achieving easy and high speed implementation of filters having arbitrary structure.

41 Claims, 52 Drawing Sheets

FIG. 10

| ROW NUMBER | | PROGRAM NUMBER |
|---|---|---|
| 0 | initial | 1(A2)=0, 2(A2)=0 ------1 |
| 1 | input | 1(B) ------2 |
| 2 | iir(,,0,5,0) | 2(B) !4(A1) ------3 |
| 3 | iir(,,0,6,0) | 2(A2), 3(B) !1(A2), 3(A1) ------4 |
| 4 | iir(,,0,7,0) | 4(B) !absorb ------5 |
| | iir(,,0,8,2) | output !absorb ------6 |

| | A1 | A2 | C | B | X | D |
|---|---|---|---|---|---|---|
| 1 | 1 | 0 | 0.5 | 1 | | 0 |
| 2 | | 0 | 0.6 | 0 | 0 | 0 |
| 3 | | UNUSED | 0.7 | | | 0 |
| 4 | | UNUSED | 0.8 | 0 | | 2 |

INPUT RETARDING

FIG. 16A

|   | A1 | A2 | C | B | X | D |
|---|----|----|---|---|---|---|
| 1 | 0  |    | 0.5 | 1 | 0.5 | 0 |
| 2 |    | 0  | 0.6 | 0 | 0 | 0 |
| 3 |    | UNUSED | 0.7 |   |   | 0 |
| 4 | 0  | UNUSED | 0.8 | 0 |   | 2 |

FIG. 16B

|   | A1 | A2 | C | B | X | D |
|---|----|----|---|---|---|---|
| 1 | 0  | 0  | 0.5 | 1 | 0.5 | 0 |
| 2 | 0  |    | 0.6 | 0 | 0 | 0 |
| 3 | 0  | UNUSED | 0.7 |   |   | 0 |
| 4 | 0  | UNUSED | 0.8 | 0 |   | 2 |

FIG. 16C

|   | A1 | A2 | C | B | X | D |
|---|----|----|---|---|---|---|
| 1 | 0  | 0  | 0.5 | 1 | 0.5 | 0 |
| 2 | 0  | 0  | 0.6 |   |   | 0 |
| 3 | 0  | UNUSED | 0.7 | 0 |   | 0 |
| 4 | 0  | UNUSED | 0.8 | 0 |   | 2 |

+shift

FIG. 17A
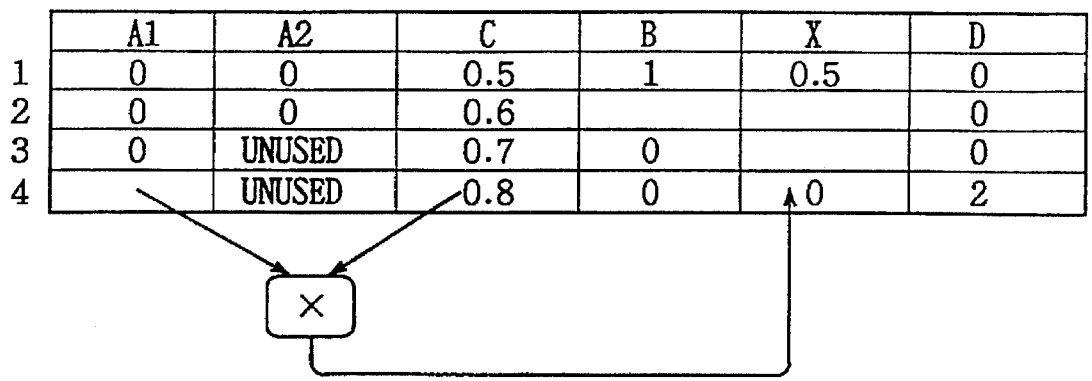
FIG. 17B
INPUT RETARDING
| | A1 | A2 | C | B | X | D |
|---|---|---|---|---|---|---|
| 1 | 0 | 0 | 0.5 | 1 | 0.5 | 0 |
| 2 | 0 | 0 | 0.6 | | | 0 |
| 3 | 0 | UNUSED | 0.7 | 0 | | 0 |
| 4 | | UNUSED | 0.8 | 0 | 0 | 2 |
FIG. 17C
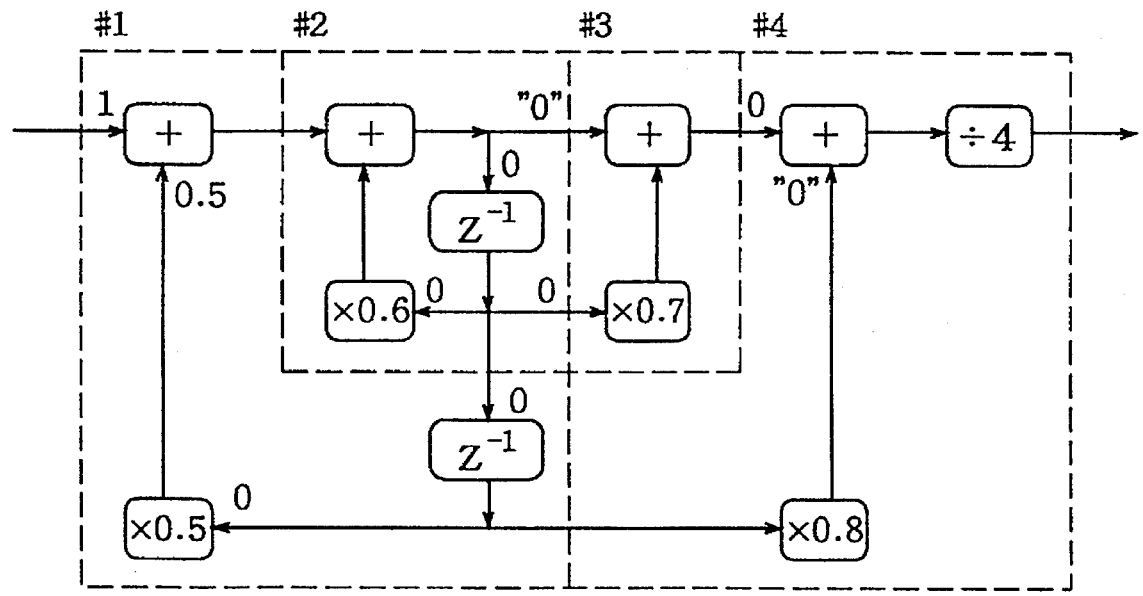

| | A1 | A2 | C | B | X | D |
|---|---|---|---|---|---|---|
| | | | | INPUT RETARDING → | | |
| 1 | 0 | 0 | 0.5 | 1 | 0.5 | 0 |
| 2 | 0 | 0 | 0.6 | | | 0 |
| 3 | | UNUSED | 0.7 | 0 | 0 | 0 |
| 4 | | UNUSED | 0.8 | | | 2 |
| | | | | | OUTPUT 0 | |

INPUT RETARDING

|   | A1 | A2 | C | B | X | D |
|---|----|----|---|---|---|---|
| 1 | 0 | 0 | 0.5 | 1 | 0.5 | 0 |
| 2 |  | 0 | 0.6 |  | 0 | 0 |
| 3 |  | UNUSED | 0.7 |  |  | 0 |
| 4 |  | UNUSED | 0.8 | 0 |  | 2 |

| | A1 | A2 | C | B | X | D |
|---|---|---|---|---|---|---|
| 1 | | 0 | 0.5 | 2 | 0 | 0 |
| 2 | | 0 | 0.6 | 1.5 | 0 | 0 |
| 3 | | UNUSED | 0.7 | | | 0 |
| 4 | | UNUSED | 0.8 | 0 | | 2 |

INPUT 2 → (B column)

FIG. 24

INPUT 3 ↓

|   | A1 | A2 | C | B | X | D |
|---|----|----|---|---|---|---|
| 1 |    | 0  | 0.5 | 3 | 0 | 0 |
| 2 |    | 1.5 | 0.6 | 2 | 0 | 0 |
| 3 |    | UNUSED | 0.7 |   |   | 0 |
| 4 |    | UNUSED | 0.8 | 1.5 |   | 2 |

FIG. 25

INPUT RETARDING ↓

|   | A1 | A2 | C | B | X | D |
|---|----|----|---|---|---|---|
| 1 | 0  | 1.5 | 0.5 | 3 | 0 | 0 |
| 2 | 1.5 | 2 | 0.6 |   |   | 0 |
| 3 | 1.5 | UNUSED | 0.7 | 2 |   | 0 |
| 4 |    | UNUSED | 0.8 | 1.5 | 0 | 2 |

FIG. 26

INPUT RETARDING ↓

|   | A1 | A2 | C | B | X | D |
|---|----|----|---|---|---|---|
| 1 | 0  | 1.5 | 0.5 | 3 | 0 | 0 |
| 2 | 1.5 | 2 | 0.6 |   |   | 0 |
| 3 |    | UNUSED | 0.7 | 2 | 1.05 | 0 |
| 4 |    | UNUSED | 0.8 |   |   | 2 |

OUTPUT 0.38

FIG. 27

INPUT RETARDING ⟶

|   | A1 | A2     | C   | B    | X   | D |
|---|----|--------|-----|------|-----|---|
| 1 | 0  | 1.5    | 0.5 | 3    | 0   | 0 |
| 2 |    | 2      | 0.6 |      | 0.9 | 0 |
| 3 |    | UNUSED | 0.7 |      |     | 0 |
| 4 |    | UNUSED | 0.8 | 3.05 |     | 2 |

FIG. 28

INPUT 4 ⟶

|   | A1 | A2     | C   | B    | X   | D |
|---|----|--------|-----|------|-----|---|
| 1 |    | 1.5    | 0.5 | 4    | 0   | 0 |
| 2 |    | 2      | 0.6 | 3    | 0.9 | 0 |
| 3 |    | UNUSED | 0.7 |      |     | 0 |
| 4 |    | UNUSED | 0.8 | 3.05 |     | 2 |

FIG. 29

| EXECUTION CYCLE | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA INPUT | ○ | | | | | | | ○ | | | | ○ | | | | ○ |
| × (MULTIPLIER) | ○ | ○ | ○ | ○ | ○ | ○ | ○ | ○ | ○ | ○ | ○ | ○ | ○ | ○ | ○ | ○ |
| +shift (COMPOSITE COMPUTING ELEMENT) | ○ | ○ | | ○ | ○ | ○ | ○ | ○ | ○ | ○ | ○ | ○ | ○ | ○ | ○ | ○ |
| DATA OUTPUT | | | | | | ○ | | | | ○ | | | | ○ | | |

|   | A1 | A2     | C   | B | X | D |
|---|----|--------|-----|---|---|---|
| 1 | 1  | 0      | 0.5 | 1 |   | 0 |
| 2 | 0  | 0      | 0.6 | 0 |   | 0 |
| 3 | 0  | UNUSED | 0.7 | 0 |   | 0 |
| 4 | 1  | UNUSED | 0.8 | 0 |   | 2 |

| | A1 | A2 | C | B | X | D |
|---|---|---|---|---|---|---|
| 1 | 0 | | 0.5 | 1 | 0.5 | 0 |
| 2 | | 0 | 0.6 | 0 | 0 | 0 |
| 3 | | UNUSED | 0.7 | 0 | 0 | 0 |
| 4 | 0 | UNUSED | 0.8 | 0 | 0.8 | 2 |

| | A1 | A2 | C | B | X | D |
|---|---|---|---|---|---|---|
| 1 | 0 | 0 | 0.5 | 1 | 0.5 | 0 |
| 2 | 0 | | 0.6 | 0 | 0 | 0 |
| 3 | 0 | UNUSED | 0.7 | 0 | 0 | 0 |
| 4 | 0 | UNUSED | 0.8 | 0 | 0.8 | 2 |

| | A1 | A2 | C | B | X | D |
|---|----|----|----|----|----|----|
| 1 | 0 | 0 | 0.5 | 2 | | 0 |
| 2 | 0 | 0 | 0.6 | 1.5 | | 0 |
| 3 | 0 | UNUSED | 0.7 | 0 | | 0 |
| 4 | 0 | UNUSED | 0.8 | 0 | | 2 |
| | | | | OUTPUT 0 | | |

|   | A1 | A2 | C | B | X | D |
|---|----|----|----|----|----|----|
| 1 |    | 0  | 0.5 | 2   | 0 | 0 |
| 2 |    | 0  | 0.6 | 1.5 | 0 | 0 |
| 3 |    | UNUSED | 0.7 | 0 | 0 | 0 |
| 4 |    | UNUSED | 0.8 | 0 | 0 | 2 |

|   | A1 | A2 | C | B | X | D |
|---|----|----|---|---|---|---|
| 1 | 0 | 0 | 0.5 | 3 |   | 0 |
| 2 | 0 | 1.5 | 0.6 | 2 |   | 0 |
| 3 | 0 | UNUSED | 0.7 | 1.5 |   | 0 |
| 4 | 0 | UNUSED | 0.8 | 0 |   | 2 |

OUTPUT 0

|   | A1 | A2 | C | B | X | D |
|---|----|----|---|---|---|---|
| 1 |   | 0 | 0.5 | 3 | 0 | 0 |
| 2 |   | 1.5 | 0.6 | 2 | 0 | 0 |
| 3 |   | UNUSED | 0.7 | 1.5 | 0 | 0 |
| 4 |   | UNUSED | 0.8 | 0 | 0 | 2 |

|   | A1 | A2 | C | B | X | D |
|---|----|----|---|---|---|---|
| 1 | 0 | 1.5 | 0.5 | 4 | | 0 |
| 2 | 1.5 | 2 | 0.6 | 3 | | 0 |
| 3 | 1.5 | UNUSED | 0.7 | 2 | | 0 |
| 4 | 0 | UNUSED | 0.8 | 1.5 | | 2 |

OUTPUT 0

|   | A1 | A2 | C | B | X | D |
|---|----|----|---|---|---|---|
| 1 | | 1.5 | 0.5 | 4 | 0 | 0 |
| 2 | | 2 | 0.6 | 3 | 0.9 | 0 |
| 3 | | UNUSED | 0.7 | 2 | 1.05 | 0 |
| 4 | | UNUSED | 0.8 | 1.5 | 0 | 2 |

FIG. 40

| ROW NUMBER | | PROGRAM NUMBER |
|---|---|---|
| 0 | initial | 2(A)=3(A)=4(A)=0 ------1 |
| 1 | input | 1(B), 2(B), 3(B), 4(B) ------2 |
| 2 | fir(0., 0.1, 0) | absorb!2(A) ------3 |
| 3 | fir(., 0.2, 0) | absorb!3(A) ------4 |
| 4 | fir(., 0.3, 0) | absorb!4(A) ------5 |
| 5 | fir(., 0.4, 2) | absorb!output ------6 |

FIG. 42A
INPUT 1
|   | B | C   | A | X | D |
|---|---|-----|---|---|---|
| 1 | 1 | 0.1 | 0 |   | 0 |
| 2 | 1 | 0.2 | 0 |   | 0 |
| 3 | 1 | 0.3 | 0 |   | 0 |
| 4 | 1 | 0.4 | 0 |   | 2 |
FIG. 42B
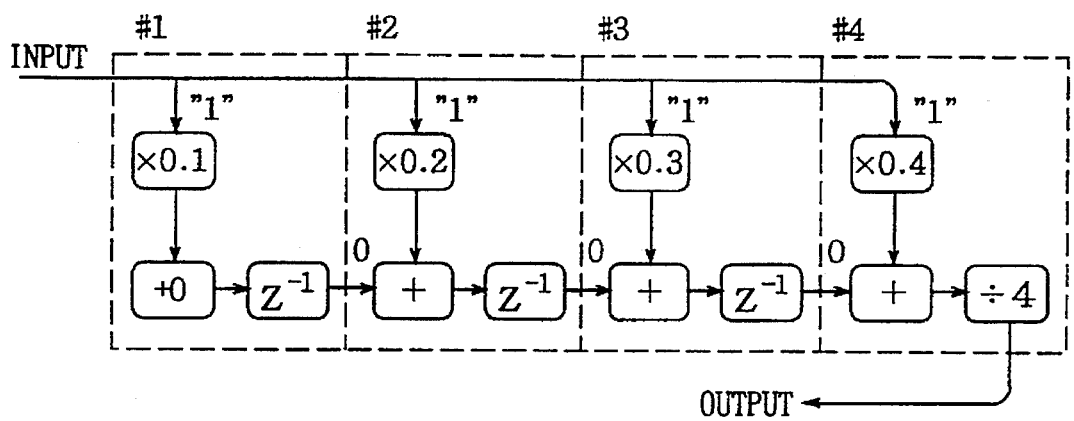
FIG. 43A
INPUT RETARDING
|   | B | C   | A | X      | D |
|---|---|-----|---|--------|---|
| 1 | 1 | 0.1 | 0 |        | 0 |
| 2 | 1 | 0.2 | 0 |        | 0 |
| 3 | 1 | 0.3 | 0 |        | 0 |
| 4 |   | 0.4 | 0 | //0.4//| 2 |
FIG. 43B
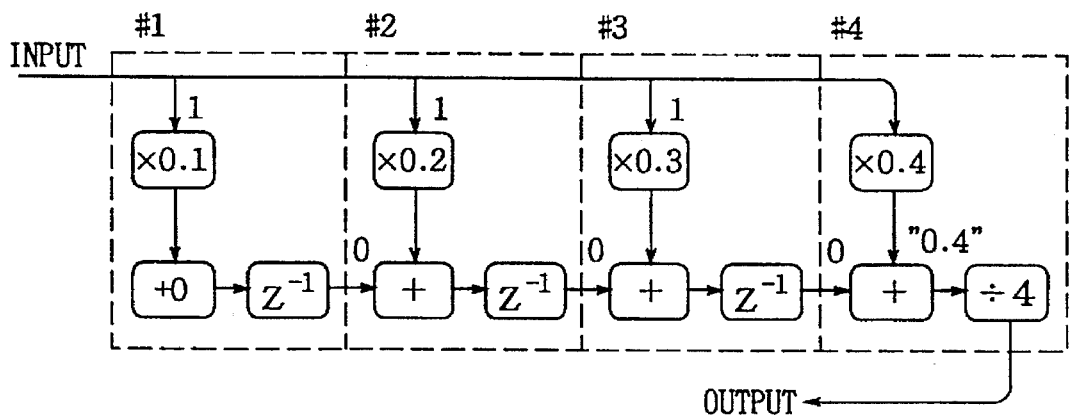

FIG. 45A
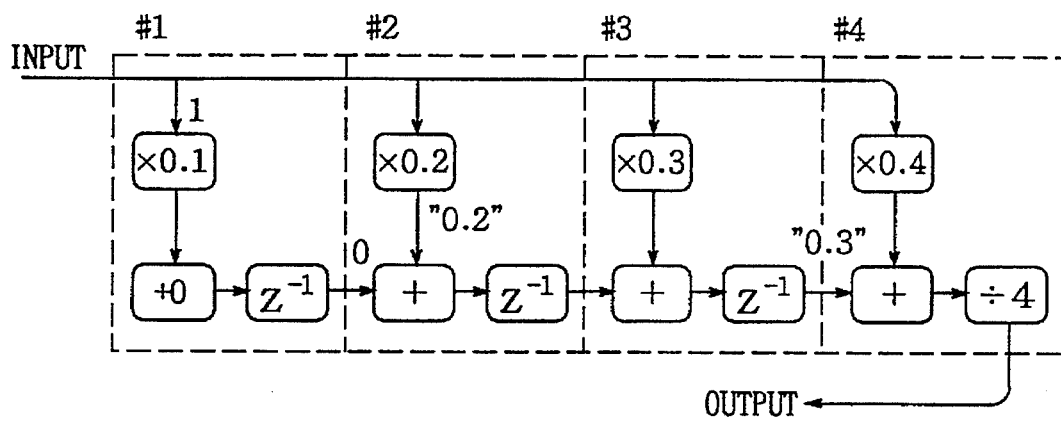
FIG. 45B
FIG. 46A
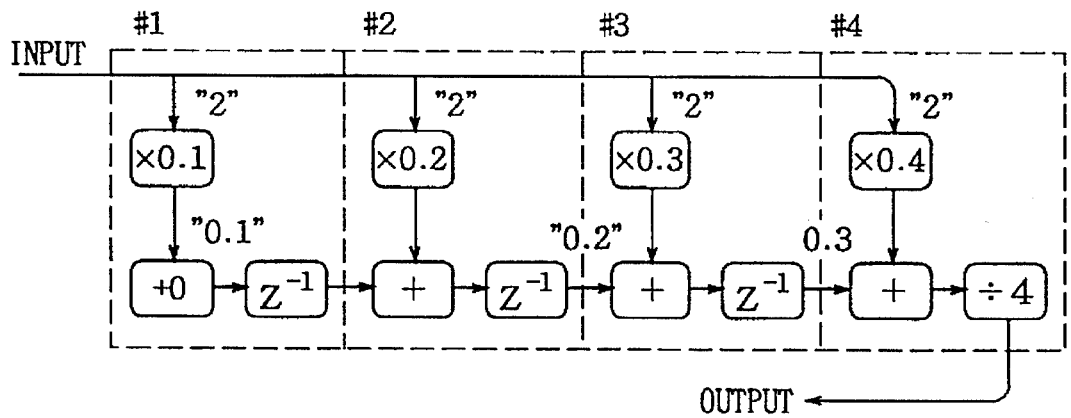
FIG. 46B

FIG. 49A
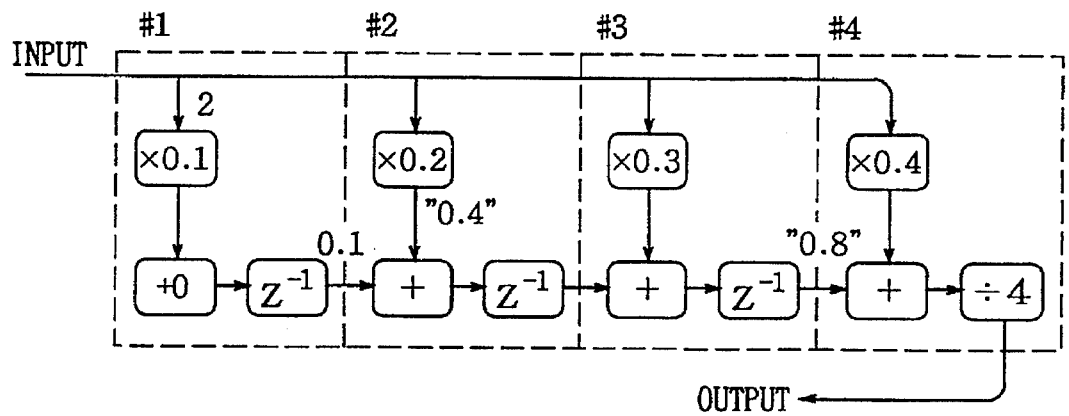
FIG. 49B
FIG. 50A
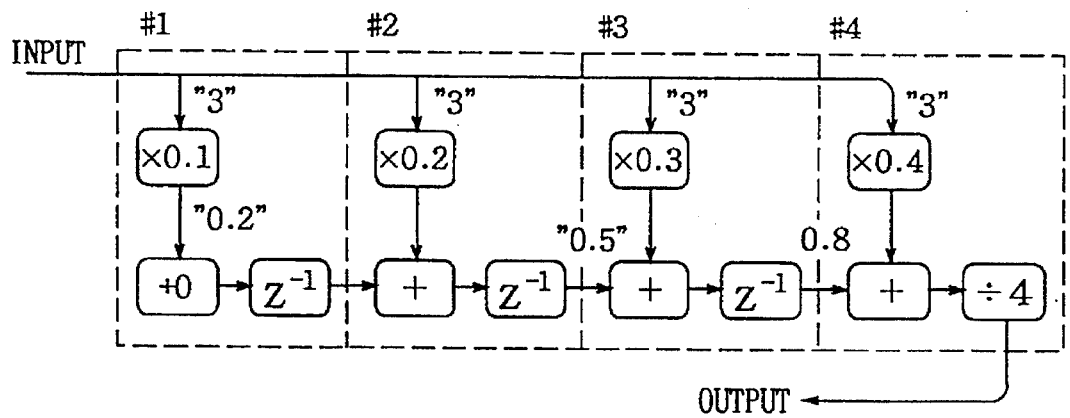
FIG. 50B

INPUT RETARDING

|   | B | C   | A   | X   | D |
|---|---|-----|-----|-----|---|
| 1 | 3 | 0.1 | 0   |     | 0 |
| 2 | 3 | 0.2 | 0.2 |     | 0 |
| 3 | 3 | 0.3 | 0.5 |     | 0 |
| 4 |   | 0.4 | 0.8 | 1.2 | 2 |

FIG. 53A
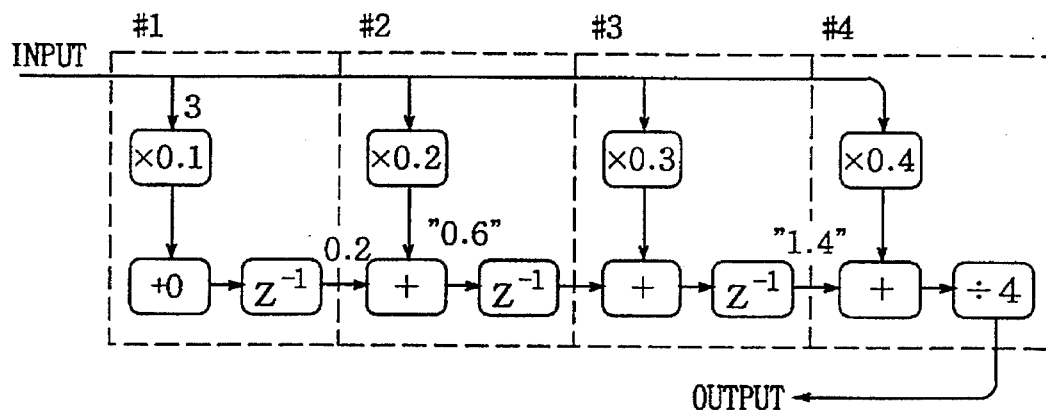
FIG. 53B
FIG. 54A
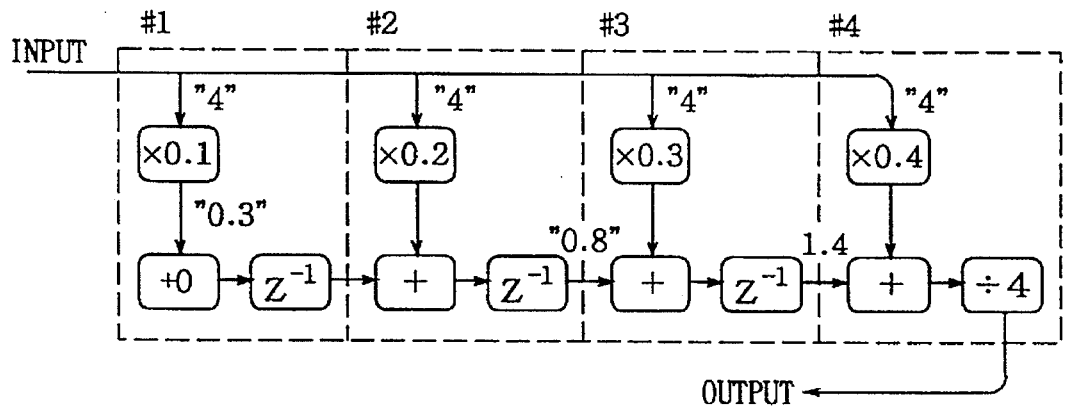
FIG. 54B

| | B | C | A | X | D |
|---|---|---|---|---|---|
| | INPUT RETARDING ↓ | | | | |
| 1 | 4 | 0.1 | 0 | | 0 |
| 2 | 4 | 0.2 | 0.3 | | 0 |
| 3 | 4 | 0.3 | 0.8 | | 0 |
| 4 | | 0.4 | 1.4 | 1.6 | 2 |

| EXECUTION CYCLE | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|
| DATA INPUT | ○ | | | | ○ | | | | ○ | | | | ○ | | |
| × (MULTIPLIER) | | ○ | ○ | ○ | ○ | ○ | ○ | ○ | ○ | ○ | ○ | ○ | ○ | ○ | ○ |
| +shift(COMPOSITE COMPUTING ELEMENT) | | | ○ | ○ | ○ | ○ | ○ | ○ | ○ | ○ | ○ | ○ | ○ | ○ | ○ |
| DATA OUTPUT | | | | ○ | | | | ○ | | | | ○ | | | ○ |

FIG. 58
|   | B | C   | A | X | D |
|---|---|-----|---|---|---|
| 1 | 1 | 0.1 | 0 |   | 0 |
| 2 | 1 | 0.2 | 0 |   | 0 |
| 3 | 1 | 0.3 | 0 |   | 0 |
| 4 | 1 | 0.4 | 0 |   | 2 |
FIG. 59A
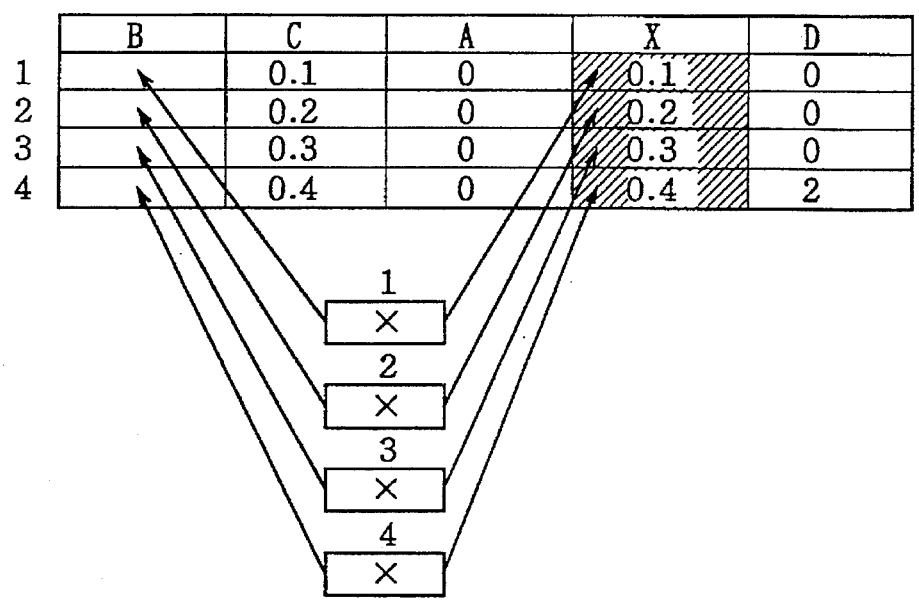
FIG. 59B
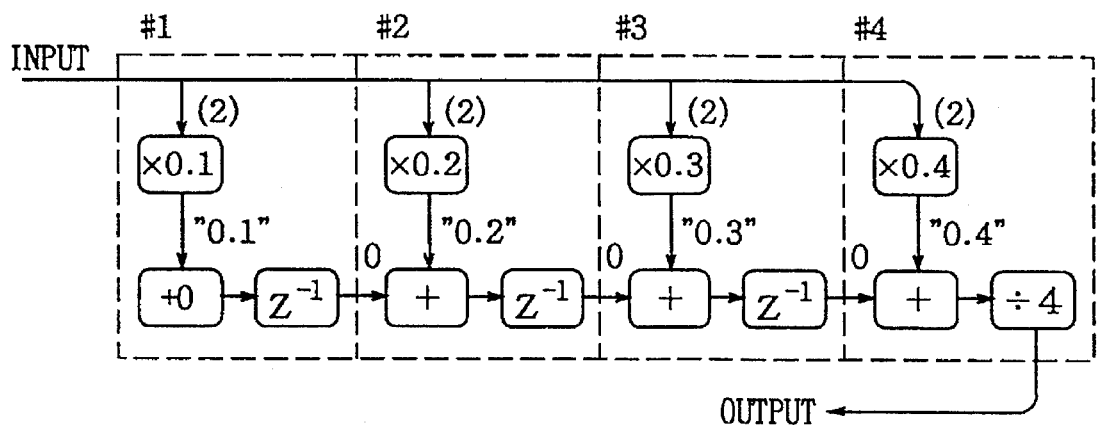

DATA DRIVEN TYPE DIGITAL FILTER UNIT AND DATA DRIVEN TYPE INFORMATION PROCESSOR INCLUDING THE SAME

This application is a continuation, of application Ser. No. 08/084,000 filed on Jun. 29, 1993, now abandoned.

BACKGROUND OF THE INVENTION

1. Field of the Invention

The present invention relates to a unit for processing digital signals, and more particularly, it relates to a data driven type information processor which executes programs, including filter processing of digital signals such as picture and sound signals, according to data driven system.

2. Description of the Background Art

In the field of signal processing, waveform shaping, removal of noise components and extraction of desired signal components are carried out in order to correctly perform desired signal processing. Such processing is carried out through filters, such as an LCR filter employing passive elements (an inductance L, a capacitor C and a resistor R) and an active filter employing an operational amplifier, a resistor R and a capacitor C. The LCR filter and the active filter, which are adapted to filter analog signals in an analog mode, are called analog filters.

In the field of processing of picture and/or sound signals, the signals are generally processed in digital modes in order to attain precision, simplification and improvement of the signal processing. In this case, analog signals are converted to digital signals, so that desired signal processing is carried out on these digital signals. Also in the field of such digital signal processing, filter processing is executed in order to remove noise components and extract desired signal components. This filter processing is digitally executed through a digital circuit, which is called a digital filter.

A digital filter basically comprises adders/subtracters and delay elements, D, each D for delaying a signal by a single sampling period (sampling period in analog-to-digital conversion, or supply period of input digital signals). Such a digital filter has been widely employed in general.

When a hardware structure of such a digital filter is fixedly set, a filter factor and a tap number cannot be easily changed, dissimilar to an analog filter circuit. This is because the filter factor is expressed in coefficients of multipliers in the digital filter and it is difficult to change such a multiplication coefficient when the hardware structure is fixed. In the digital filter, further, the tap number is decided by the number of stages of delay circuits (or the number of multipliers). Thus, the tap number cannot be easily changed since it is necessary to change the number of stages of the delay circuits (or the number of the multipliers) in this case.

The aforementioned disadvantage of the digital filter having a fixed hardware structure may be overcome by two types of methods, i.e., that using a dedicated LSI which can arbitrarily change the factor (multiplication coefficients), and that using a programmable processor.

In the first method, a tap coefficient (multiplication coefficient, i.e., the filter factor) is supplied from an exterior. In this case, the tap coefficient is changeable, while the structure of the digital filter itself is fixed. When the filter is formed by an FIR (Finite Impulse Response) filter, an IIR (Infinite Impulse Response) filter, or a combination of these filters, its structure is unchangeable. Therefore, its application is disadvantageously restricted.

The second method utilizes a signal processor such as a DSP (Digital Signal Processor) or a conventional data driven type processor. When the digital filter is formed by such a signal processor, the contents of its processing can be varied with programs. However, a program for carrying out data processing includes instructions other than those for carrying out the filter processing itself. With a digital filter which is formed by a processor basic operational instructions are those for an addition, a subtraction and a multiplication, and hence the number of the instructions is increased.

In a data driven type processor, a certain node fires when conditions required for this node are satisfied. Operational instructions are allotted to respective nodes. When a digital filter is formed with such unit operational instructions, therefore, the number of the nodes is equivalently increased in response to the increased number of such instructions, and hence it is necessary to carry out data processing, such as discrimination of firing conditions and waiting for required data, other than filter processing. Consequently, a time for executing such processing provides overhead, to hinder high-speed filter processing.

When a digital filter is formed by a dedicated LSI as hereinabove described, it is impossible to structure an arbitrary filter since its hardware structure is fixed and non-programmable.

Thus, the digital filter which is formed by a dedicated LSI cannot be employed for a complicated application program including filter processing in the contents of its processing.

When a programmable processor is employed, on the other hand, overhead is provided by an instruction executing time since the content of the instruction forms no basic element of filter processing, and hence the filter processing cannot be carried out at a high speed.

SUMMARY OF THE INVENTION

An object of the present invention is to provide a digital filter unit which can execute filter processing at a high speed.

Another object of the present invention is to provide a digital filter unit which can easily implement an arbitrary filter structure.

Still another object of the present invention is to provide an information processor which can execute a program including filter processing as its contents at a high speed.

A further object of the present invention is to provide an information processor including a digital filter unit which implements an arbitrary filter structure.

A digital filter unit according to the present invention includes a register file having a plurality of registers which are directed to filter processing, arithmetic means for carrying out prescribed arithmetic processing on data stored in prescribed registers of the register file, and connection control means which establishes a connection path between the arithmetic means and the register file.

The arithmetic means includes multiplication circuitry and add/shift means.

The register file includes a plurality of entries each having a plurality of registers. One entry corresponds to one filter processing instruction.

Each filter processing instruction preferably has a four-input two-output structure, and has a data driven structure including add, delay, multiply and divide operations in internal nodes thereof.

Each entry includes a data field having registers storing to-be-processed data and a destination field formed by registers indicating entries for storing arithmetic results.

This digital filter unit is preferably combined with a data driven type processor.

The arithmetic means includes a multiplier and an add/shift composite computing element which are required for filter processing. This arithmetic means forms a basic unit of the digital filter. Contents of the registers provided in the data field of the register file are supplied to the arithmetic means, to be subjected to prescribed arithmetic operation. The arithmetic means carries out arithmetic operations forming basic units of the filter. Therefore, read/write instructions for the data registers form basic unit instructions of filter processing, whereby it is not necessary to execute instructions other than those for filter processing. Thus, it is possible to carry out the filter processing at a high speed.

Further, not only both of FIR and IIR filters can be implemented by changing read/write destinations of the data registers, but a filter of a desired structure can be constructed.

In addition, a filter factor can be changed through multiplication coefficients (filter factors) held in the data registers, so that the filter characteristics can be easily changed.

Further, the tap number of the filter can be easily changed by adjusting the number of entries of the register file.

According to the present invention, it is possible to execute a program at a high speed since instructions are carried out in a data driven system. Further, it is possible to execute a program including filter processing in its contents at a high speed since a filter structure can be defined by the instructions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 illustrates program coding of the flow graph, shown in FIG. 9, described in a text format

FIGS. 16A to 16C illustrate operations in a fifth execution cycle for the IIR filter processing in detail;

FIGS. 17A to 17C illustrate detailed operations in the fifth execution cycle for the IIR filter processing, data stored in the registers upon completion of this cycle, and corresponding data distribution in the digital filter;

FIG. 24 illustrates data stored in the registers in a twelfth execution cycle for the IIR filter processing;

FIG. 25 illustrates data stored in the registers in a thirteenth execution cycle for the IIR filter processing;

FIG. 26 illustrates data stored in the registers in a fourteenth execution cycle for the IIR filter processing;

FIGS. 27 and 28 illustrate data stored in the registers in fifteenth and sixteenth execution cycles for the IIR filter processing;

FIG. 29 illustrates operating states of respective computing elements in the second to sixteenth execution cycles for the IIR filter processing;

FIG. 40 illustrates program coding of the flow graph, shown in FIG. 39, described in a text format;

FIGS. 42A and 42B illustrate data stored in the registers in a first execution cycle for the FIR filter processing and corresponding data distribution in the digital filter;

FIGS. 43A and 43B illustrate data stored in the registers in a second execution cycle for the FIR filter processing and corresponding data distribution in the digital filter;

FIGS. 45A and 45B illustrate data stored in the registers in a fourth execution cycle for the FIR filter processing and corresponding data distribution in the digital filter;

FIGS. 46A and 46B illustrate data stored in the registers in a fifth execution cycle for the FIR filter processing and corresponding data distribution in the digital filter;

FIGS. 49A and 49B illustrate data stored in the registers in an eighth execution cycle for the FIR filter processing and corresponding data distribution in the digital filter;

FIGS. 50A and 50B illustrate data stored in the registers in a ninth execution cycle for the FIR filter processing and corresponding data distribution in the digital filter;

FIGS. 53A and 53B illustrate data stored in the registers in a twelfth execution cycle for the FIR filter processing and corresponding data distribution in the digital filter;

FIGS. 54A and 54B illustrate data stored in the registers in a thirteenth execution cycle for the FIR filter processing and corresponding data distribution in the digital filter;

FIG. 58 illustrates data stored in the registers in execution of FIR filter processing with a plurality of computing elements;

FIGS. 59A and 59B illustrate data stored in the registers in a first execution cycle for the FIR filter processing with a plurality of computing elements and corresponding data distribution in the digital filter;

DESCRIPTION OF THE PREFERRED EMBODIMENTS

[First Embodiment]

Figure 1:
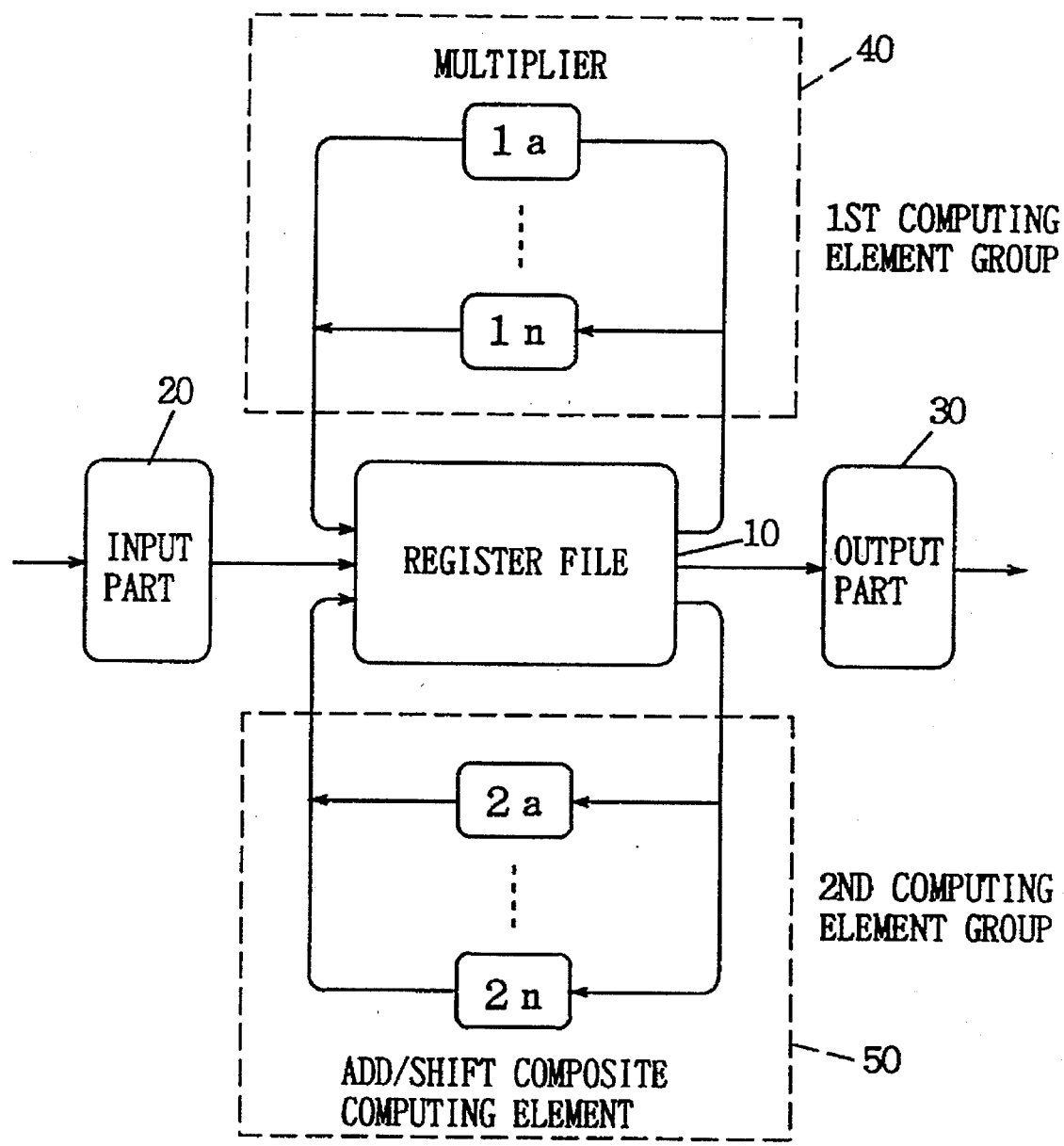
FIG. 1 is a block diagram schematically showing an overall structure of a data driven filter unit according to the present invention.

FIG. 1 schematically illustrates an overall structure of a data driven filter unit according to an embodiment of the present invention. Referring to FIG. 1, the data driven filter unit comprises an input part 20 for receiving input data, a register file 10 which includes a plurality of registers for storing data to be processed and the processed data, and an output part 30 which reads final arithmetic result stored in the register file 10 for outputting the same to an exterior of the unit.

The register file 10, the structure of which is described later in detail, comprises registers for storing not only processed data but destination information for specifying write destinations of the processed data, in order to implement a data driven structure. Namely, the register file 10 includes a data field for storing processed data and a destination field for storing destination information specifying specific registers in the data field. Each of the data and destination fields includes a plurality of registers.

The input part 20 writes input data in prescribed registers, which are designated by programs and varied with filter structures to be implemented, provided in the register file 10. This input part 20 has a function of retarding input of next data until processing for single input data is completed, as described later.

The output part 30 reads the content of a prescribed register, corresponding to a final unit of the filter, of the register file 10 and outputs the same to the exterior. This structure is also described later in detail.

The data driven filter unit further comprises a first computing element group 40 including multipliers 1a to 1n, and a second computing element group 50 including add/shift composite computing elements 2a to 2n. The first and second computing element groups 40 and 50 may include not plural but single multiplier and add/shift composite computing element. A single multiplier 1 (generically indicating the multipliers 1a to 1n) and a single add/shift composite computing element 2 (generically indicating the add/shift composite computing elements 2a to 2n) implement a single unit filter structure. The contents of the data registers provided in the register file 10 are transmitted to the first and second computing element groups 40 and 50. The result of processing is written in a register which is designated by the contents of a destination register of the same entry as the data supplied to the first and second computing element groups 40 and 50. In particular, registers in which the results of processing in the first computing element group 40 are written are previously set in a fixed manner.

In the register file 10, data are written in and read from the registers along a rule of single substitution/single readout so that data once read out is consumed and not utilized again. According to this rule, no writing is carried out until reading is completed, except constant data such as filter or multiplication coefficients. When the constant data are overwritten, new data are valid.

Figure 2:
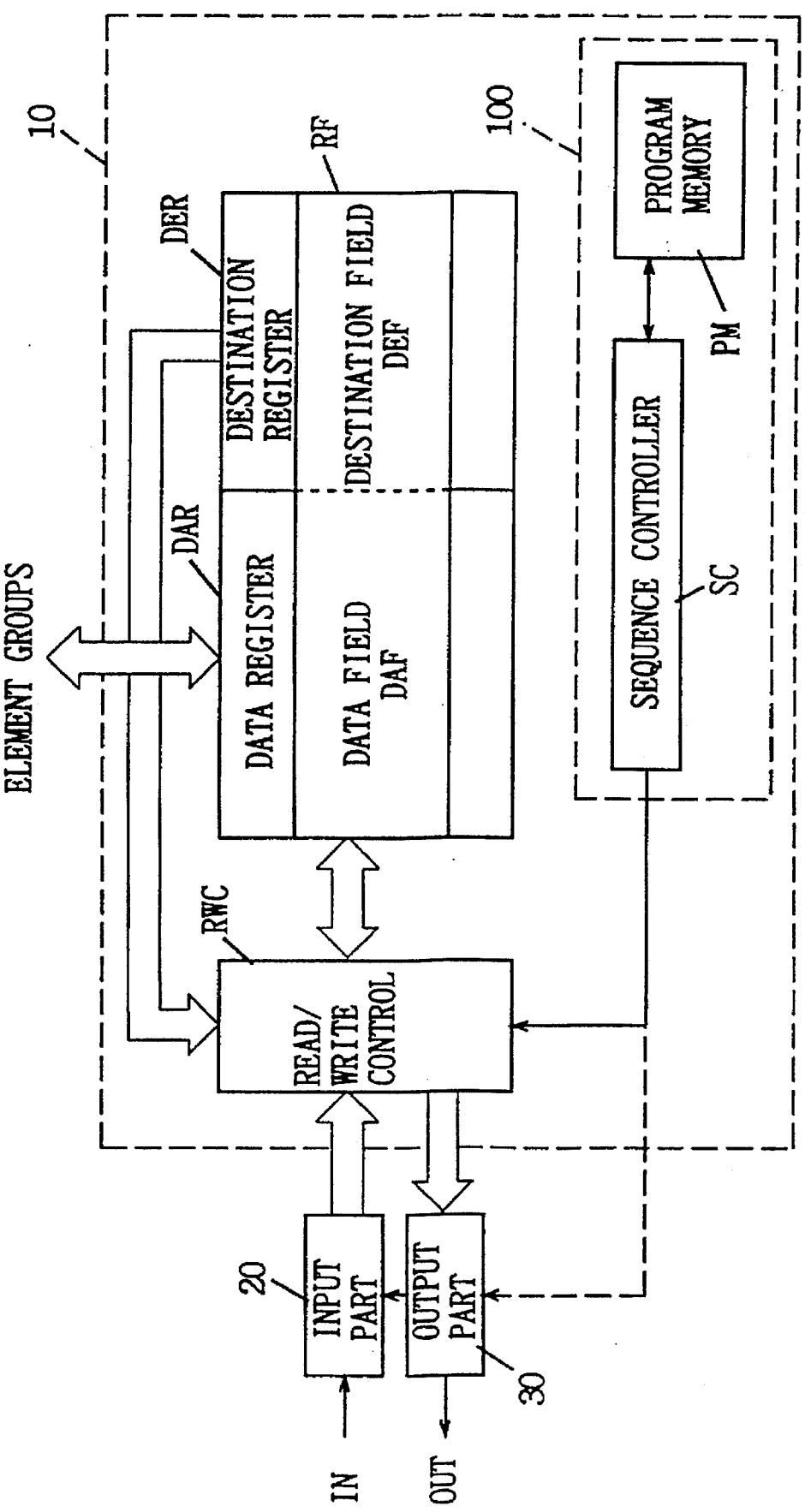
FIG. 2 illustrates a schematic structure of a register file shown in FIG. 1.

FIG. 2 specifically illustrates the internal structure of the register file 10 shown in FIG. 1. Referring to FIG. 2, the register file 10 includes a register file RF for storing information, and a read/write control part RWC for controlling data writing and data reading in the register file RF. The register file RF includes a data field DAF and a destination field DEF. The data field DAF includes a plurality of data registers DAR, and the destination field DEF includes a plurality of destination registers DER.

Registers which are arranged on the same row in FIG. 2 form a single entry of the register file 10. When data is read from a data register DAR and supplied to the first or second computing element group 40 or 50, the content of an associated designation register DER is also read and supplied to the read/write control part RWC. The read/write control part RWC writes output data from the first or second computing element group 40 or 50 in a corresponding data register DAR along designation information from the designation register DER. The read/write control part RWC can control read/write operations of the data registers DAR and the designation registers DER independently of each other.

The register file 10 further includes a program control part 100 which controls operations of the read/write control part RWC. This program control part 100 includes a program memory PM which stores programs for deciding filter processing contents implemented by this filter unit, and a sequence controller SC which controls the operations of the read/write control part RWC according to the programs stored in the program memory PM. Thus, the read/write control part RWC successively or parallely controls write and read operations for the contents of the register file RF and bus connection.

In the structure shown in FIG. 2, both of the input and output parts 20 and 30 carry out input/output of data through the read/write control part RWC, which serves also as an input/output interface circuit. Referring to FIG. 2, further, the input and output parts 20 and 30 are controlled by the sequence controller SC. This is because an address for specifying a data register DAR, in which input data IN is written by the input part 20, and an address for designating a specific data register DAR in the data field DAF employed for generating output data OUT by the output part 30 along programs written in the program memory PM are set under control by the sequence controller SC respectively.

The sequence controller SC may not set the addresses of the data registers DAR provided in this register file RF in the input and output parts 20 and 30, but the read/write control part RWC may carry out input/output of data with respect to the input and output parts 20 and 30 under control by the sequence controller SC. In this case, the read/write control part RWC writes input data IN and reads output data OUT with respect to the register file RF under control by the sequence controller SC.

Programs can be written in the program memory PM from an exterior (the write path is not shown). Thus, it is possible to implement a filter structure according to application.

In the structure shown in FIG. 2, further, the program controller 100 is provided in the register file 10. Alternatively, the program controller 100 may be provided in an exterior of the register file 10, to control the read/write control part RWC from the exterior.

[Structure of Register]

Figure 3:
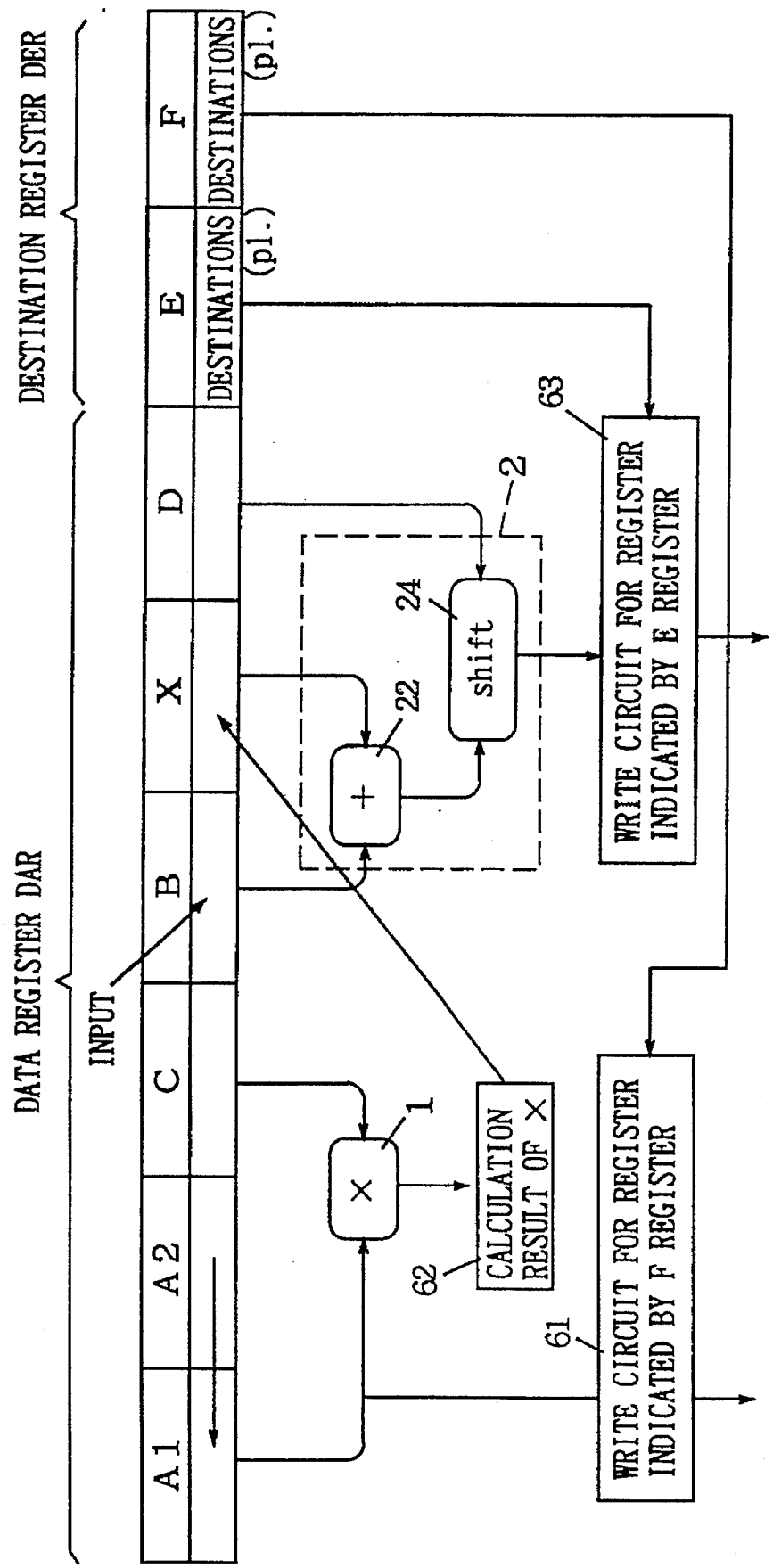
FIG. 3 illustrates connection between registers in the register file and structures of the registers in an iir instruction.

FIG. 3 illustrates a structure and a connection mode of the register file 10. Referring to FIG. 3, the register file 10 includes data registers DAR and designation registers DER in a single entry.

As to the arrangement of the data registers DAR, the meaning thereof iS varied with iir and fir instructions. The iir instruction is adapted to execute IIR filter processing, while the fir instruction is adapted to execute FIR filter processing. FIG. 3 shows arrangement of the registers upon specification of the iir instruction.

Referring to FIG. 3, the data registers DAR include an A1 register, an A2 register and a C register for storing data to be processed, a B register for storing input data, an X register for storing a multiplication result (calculation result of X), and a D register for storing processed data.

The data stored in the A1 and C registers are supplied to a multiplier 1 which is included in the first computing element group 40. The result of multiplication (calculation result of X) in the multiplier 1 is stored in the X register of this entry through a write circuit 62.

The data stored in the B, X and D registers are supplied to an add/shift composite computing element 2 which is included in the second computing element group 50. The add/shift composite computing element 22 includes an adder 22 and a shift circuit 24 for shifting an output of the adder 22 by prescribed number of bits. The data stored in the B and X registers are supplied to the adder 22, while the data stored in the D register decides a shift bit number (the number of bits to be shifted) in the shift circuit 24. The shift circuit 24, which is a circuit having a shift bit number programmable, executes a division through its shift operation.

The destination register DER includes an E register for storing destination information indicating positions for storing the output of the add/shift composite computing element 2, and an F register for storing destination information for specifying registers in which the data of the A1 register is written. Each of the E and F registers can specify a plurality of destinations. The destination information stored in the E and F registers is programmable so that corresponding destination information is programmed along instructions, stored in the program memory PM (see FIG. 2) under control by the sequence controller SC and the read/write control part RWC.

FIG. 3 further illustrates write circuits 61, 62 and 63 for reading and writing the data. The write circuit 61 decodes the destination information stored in the F register, and writes the data which is stored in the A1 register in a corresponding register. The write circuit 62 writes the output of the multiplier 1 in the X register of this entry. The write circuit 63 decodes the destination information stored in the E register, and writes the output of the add/shift composite computing element 2 in a corresponding register. These write circuits 61, 62 and 63 are included in the read/write control part RWC shown in FIG. 2. The data are read from the data registers DAR and the destination registers DER by the read/write control part RWC shown in FIG. 2 independently of each other. The respective registers are connected to corresponding data buses respectively, under control by the read/write control part RWC. Connection between the registers and the data buses is decided by programs.

In the registers provided in a single entry of the register file 10, the programs fixedly set arithmetic operations to which the registers are assigned. Namely, the A and C registers are employed for storing data for multiplications, while the B and D registers are employed for add/shift composite operations. These registers are not allotted to other arithmetic operations. Further, the registers can store initial values and constants only for reading. The data are written in and read from the registers along the rule of single substitution/single readout. A register storing a constant is not subjected to writing, while the constant can be read out a plurality of times.

The destination information in the E and F registers which are included in the destination registers DER is programmable. Thus, it is possible to easily form a filter of an arbitrary structure.

Figure 4:
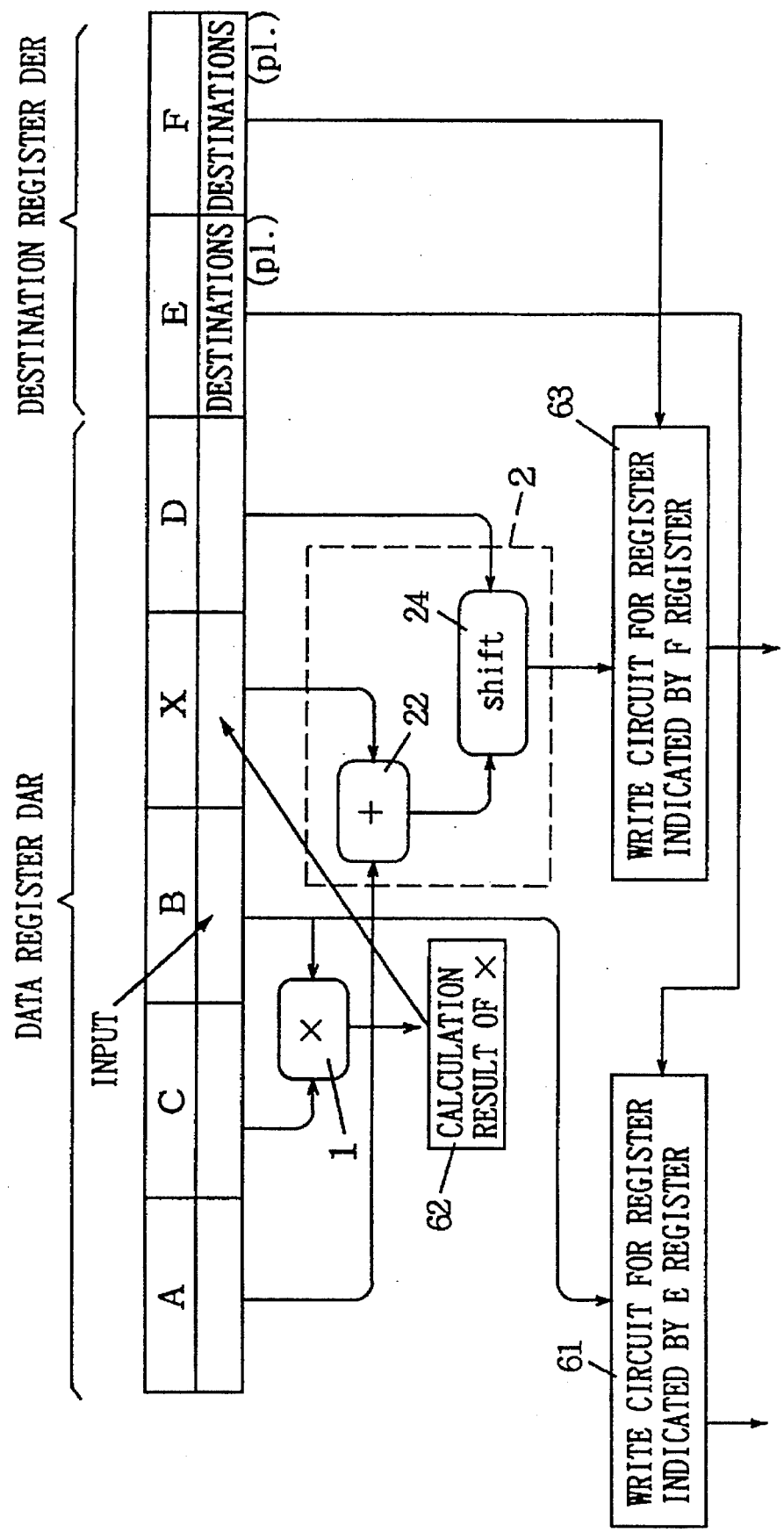
FIG. 4 illustrates connection between the registers in the register file and a structure of the register file in an fir instruction.

FIG. 4 illustrates a connection structure of the registers by an fir operation. In the case of the fir instruction, data registers DAR include A, C, B, X and D registers. Data stored in the C and B registers are supplied to a multiplier 1. Namely, the C and B registers store data which are employed only for multiplications. On the other hand, data stored in the A, X and D registers are supplied to an add/shift composite computing element 2. The result of a multiplication in the multiplier 1 is written in the X register through a write circuit 62.

Also in the fir instruction, the data registers are employed for only predetermined arithmetic operations, as hereinabove described.

In destination registers DER, an E register stores destination information for specifying registers in which data stored in the B register is written, while an F register stores destination information for specifying registers for storing output data of the add/shift composite computing element 2.

Also in the fir instruction, the respective registers can store initial values and constants only for reading. The data are written in and read from the respective registers (data registers) along the rule of single substitution/single readout (excluding read-only constants).

The data stored in the E and F registers are programmable. Also in the fir instruction, therefore, it is possible to easily change the structure of the filter.

The registers each shown in FIGS. 3 and 4 form a single entry in the register file 10. A single entry corresponds to a single iir or fir instruction. The instructions decide connection between the registers and the multipliers or the add/shift composite computing elements.

Figure 5:
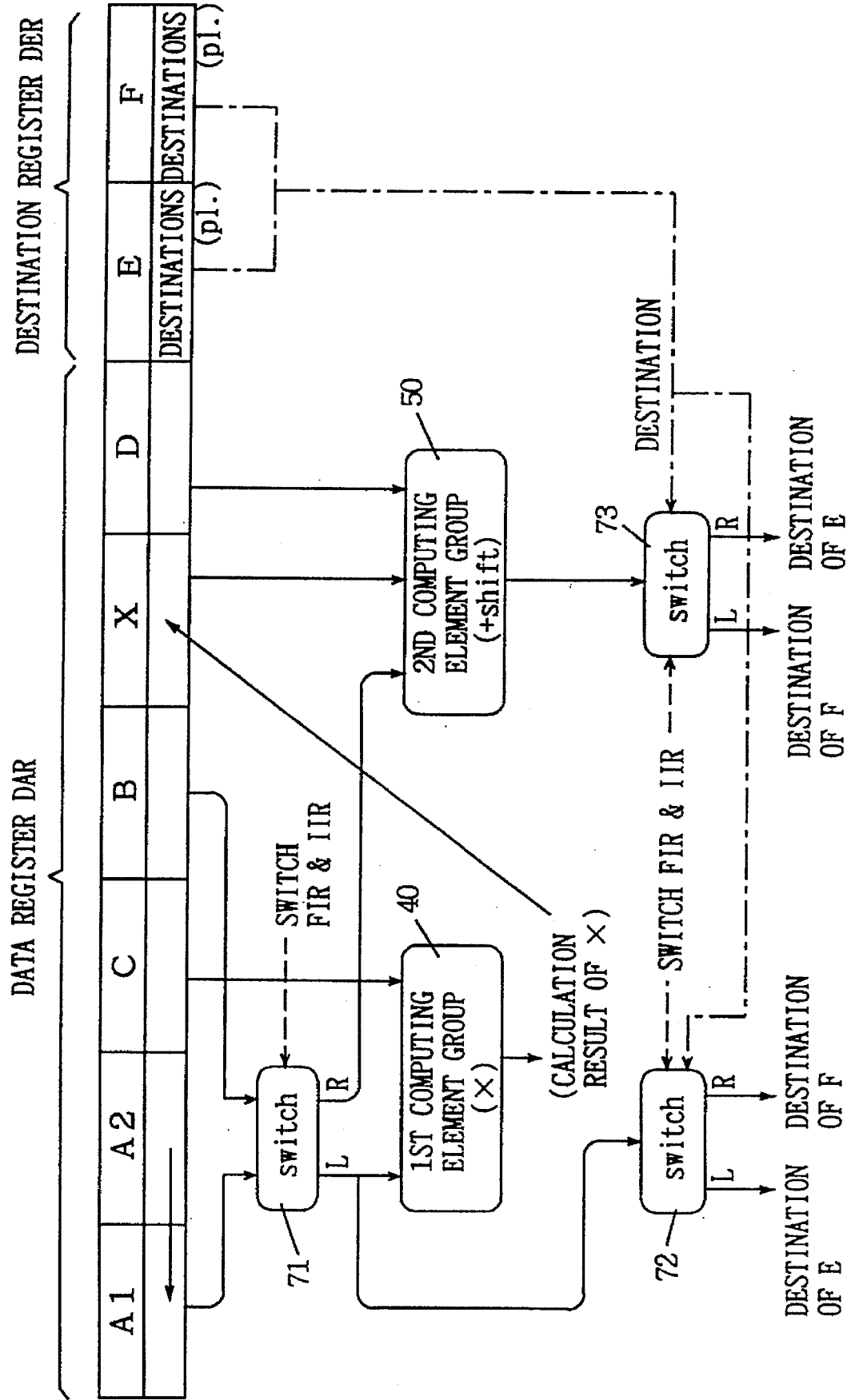
FIG. 5 illustrates connection between the registers in the register file and a structure of the register file for both of iir and fir instructions.

FIG. 5 illustrates a structure of a single entry in the register file 10 for implementing both of iir and fir instructions and connection between registers. Referring to FIG. 5, data registers DAR include A1, A1, C, B, X and D registers, similarly to the structure shown in FIG. 3. On the other hand, destination registers DER include E and F registers. The A1, A2, C, B, X, D, E and F registers form a single entry.

Switching circuits 71, 72 and 73 are provided in order to switch data which are supplied to the computing element groups 40 and 50 along fir and iir instructions. The switching circuit 71 switches transfer paths of the A1 and B registers along the fir and iir instructions. Namely, the switching circuit 71 outputs data of the B register to its left output L, and transfers data stored in the A1 register to its right output R in the case of the fir instruction. In the case of the iir instruction, on the other hand, the switching circuit 71 transfers the data stored in the B register to the right output R, and transfers the data stored in the A1 register to the left output L.

The switching circuit 72 transfers data received from the left output L of the switching circuit 71 to its left output L in the case of the fir instruction, and transfers supplied data to its right output R in the case of the iir instruction. The switching circuit 73 carries out operations similar to those of the switching circuit 72, to transfer input data to its left output L in the case of the fir instruction while transferring input data to its right output R in the case of the iir instruction.

In the structure shown in FIG. 5, the data stored in the E and F registers which are included in the destination registers DER are transferred to the switching circuits 72 and 73. Namely, the switching circuits 72 and 73 have functions of decoding destination information and sorting data transfer lines (functions of the write circuits shown in FIGS. 3 and 4). Alternatively, the switching circuits 72 and 73 may have only functions of switching the data transfer paths so that the write circuits 61 and 63 shown in FIGS. 3 and 4 are provided on the outputs of these circuits.

As shown in FIG. 5, the data transfer paths of the switching circuits 71, 72 and 73 are so switched along the iir and fir instructions that both of these instructions can be carried out with the same register structure to implement both of FIR and IIR filters while also forming a combined filter.

[Operation Block Structure]

The iir and fir instructions are expressed in data flow modes. Description and internal structures of these instructions are now described.

Figure 6A:
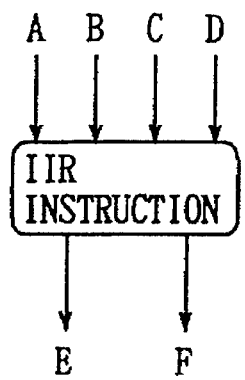
FIGS. 6A and 6B illustrate a symbolic convention and an internal structure of an iir instructions.
Figure 6B:
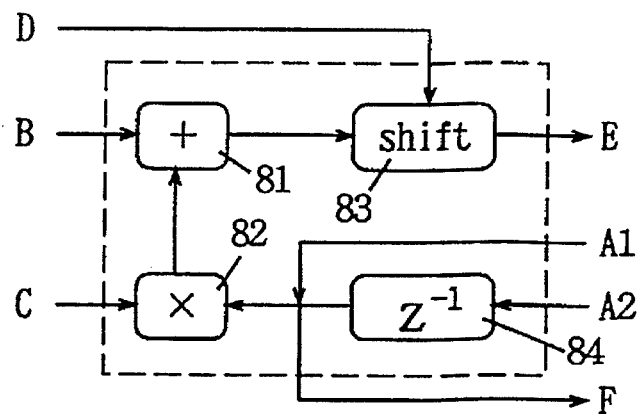

FIGS. 6A and 6B illustrate description and the internal structure of the iir instruction. The iir instruction shown in FIG. 6A is a four-input two-output instruction. Inputs A, B, C and D correspond to the registers shown in FIG. 3, while outputs E and F correspond the E and F registers. Input data may include an initial value or a constant.

Referring to FIG. 6B, the iir instruction includes four nodes 81, 82, 83 and 84. The node 81 is an addition node, and the node 82 is a node for carrying out a multiplication. The node 83 is that for carrying out a shift operation of shifting data by prescribed number of bits, while the node 84 is that for executing a delay operation ($Z^{-1}$) for delaying received data by a prescribed time.

The node 81 adds an output of the multiplication node (X node) 82 to data received at a B input. The node 82 multiplies a C input by an output of the node 84 or an A1 input. The node 83 shifts an output of the node 81 (addition node: + node) by a bit number received at a D input. The node 84 delays an A2 input by a prescribed time (1T; T: one sampling period). As to the inputs A1 and A2, either one is inputted while simultaneous supply of the inputs A1 and A2 is inhibited. The output of the node 84 is transferred to an F output (register specified by destination information of the F register), while the output of the node 83 is transferred to an E output (register specified by destination information of the E register).

FIG. 3 shows no computing element for implementing the delay operation ($Z^{-1}$) carried out by the node 84. This is equivalently implemented by data transfer from the A2 register to the A1 register in the data register DAR (shown by arrow from the A2 register to the A1 register in FIG. 3).

Figure 7A:
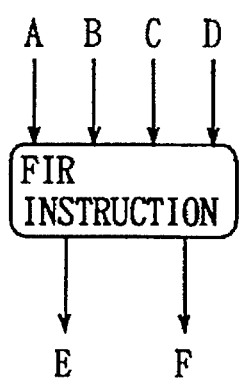
FIGS. 7A and 7B illustrate a symbolic convention and an internal structure of an fir instruction.
Figure 7B:
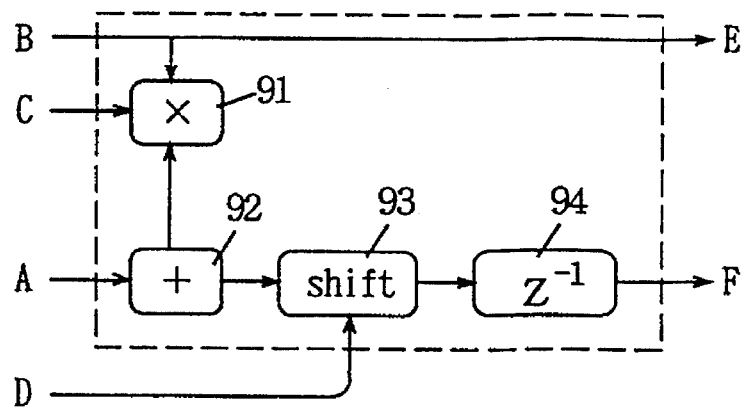

FIGS. 7A and 7B illustrate description and the structure of the fir instruction. Referring to FIG. 7A, the fir instruction is expressed in a four-input two-output instruction. Inputs A, B, C and D correspond to the A, B, C and D registers shown in FIG. 4, while E and F outputs are coupled to destinations specified by destination information stored in the E and F registers.

Referring to FIG. 7B, the fir instruction includes a node 91 for carrying out a multiplication (×), a node 92 for carrying out an addition (+), a node 93 for carrying out a shift operation of shifting input data by prescribed number of bits, and a node 94 for carrying out a delay operation ($Z^{-1}$) of delaying an output of the node 93 by a prescribed time. The node 91 multiplies an input B by an input C. The node 92 adds an output of the node 91 to an input A. The node 93 shifts an output of the node 92 by a bit number specified by a D input, and outputs the same. The node 94 delays an output of the node 93 by one sampling period, and outputs the same.

Each of the addition nodes 81 and 92 and the shift operation nodes 83 and 93 shown in FIGS. 6B and 7B is expressed by a single computing element as an add/shift composite computing element, as shown in FIG. 1.

The internal structures of the iir and fir instructions shown in FIGS. 6B and 7B correspond to unit structures of IIR and FIR filters respectively. Description is now made on a method of decomposing general filters to the internal structures shown by the iir and fir instructions.

[Program Embodiment of Filter]

A basic structure of the digital filter is now described.

It is assumed that an input series $\{xn\}=x0, x1, x2, \ldots,$ xn is sampled in a sampling period T, and an output series of the filter is expressed as $\{yn\}=y0, y2, \ldots, yn \ldots$ In such a digital filter, the input series $\{xn\}$ and the output series $\{yn\}$ are generally related to each other in the following difference equation:

$$yn = \Sigma ak \cdot x_{n-k} - \Sigma bk \cdot y_{n-k}$$

Summation of the first term is carried out with respect to k=0 to M, and that of the second term is executed with respect to k=1 to N.

Namely, an output yn of the filter at a time t=nT is decided by difference between (M+1) past and current inputs of inputs $X_{n-M}$ to $x_n$ and N past fed-back outputs of outputs $Y_{n-N}$ to $y_{n-1}$ (for a factor bk which is not zero).

The input series $\{xn\}$ and the output series $\{yn\}$ are z-transformed in general. Due to such z-transformation, the sampling value input series $\{xn\}$ is expressed as follows:

$$X(z) = \Sigma xn \cdot z^{-n}$$

Summation is executed with respect to n=0 to infinity. The operator $z^{-n}$ is called a unit delay operator. Due to such z-transformation, an output Y(z) is expressed as follows:

$$Y(z) = H(z) \cdot X(z)$$

The function H(z) is called a transfer function. When all factors bk are zero in the above expression, the output signal yn is decided using no past output signal. A digital filter which implements such filter processing is called a non-recursive filter. A transversal filter, which has a structure of obtaining a weighted sum of respective tap outputs of delay elements, has been generally known in the art.

When the factors bk include at least one factor which is not zero, i.e., a past output influences a current output, and this structure is called a recursive digital filter. Transfer functions of such a recursive filter are generally expressed in an infinite series of $z^{-1}$ upon exponential development. Namely, outputs infinitely continue with respect to impulse inputs. Thus, the recursive filter is called an infinite impulse response filter (IIR filter). On the other hand, the series of the transfer functions is finite in the non-recursive filter. Thus, the non-recursive filter is called a finite impulse response filter (FIR filter).

Description is now made on a structure of a typical filter, and then a procedure of decomposing the same to the operation structure shown in FIGS. 6A and 6B is described. First, description is made on formation of a second order IIR filter, which has delays up to a second term.

Figure 8:
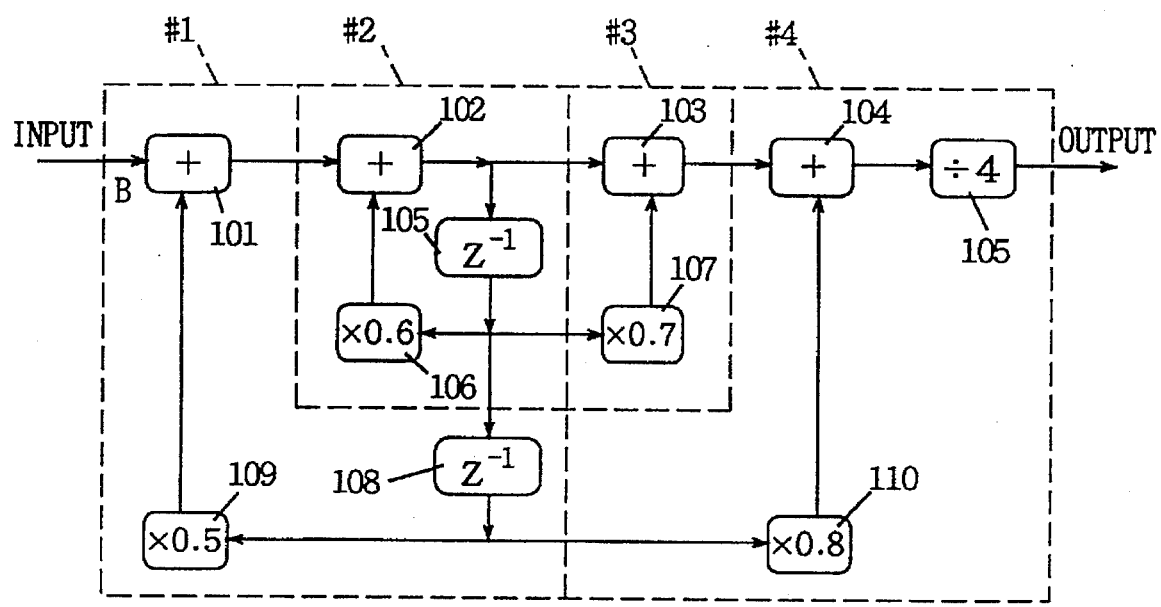
FIG. 8 illustrates a structure of a second order IIR filter and a procedure of decomposition to iir instructions in the present invention.

FIG. 8 illustrates the structure of the second order IIR filter and a procedure of decomposition to instructions. Referring to FIG. 8, the second order IIR filter includes cascaded adders 101, 102, 103 and 104, and a divider 105 which divides an output of the adder 104 by a factor 4. The IIR filter further includes a delay circuit 105 which delays an output of the adder 102 by one sampling period, a multiplier 106 which multiplies an output of the delay circuit 105 by a prescribed factor 0.6 and supplies the result to the adder 102, a multiplier 107 which multiplies the output of the delay circuit 105 by a factor 0.7 and supplies the result to the adder 103, a delay circuit 108 which delays the output of the delay circuit 105 further by one sampling period, a multiplier 109 which multiplies an output of the delay circuit 108 by a factor 0.5 and supplies the result to the adder 101, and a multiplier 110 which multiplies the output of the delay circuit 108 by a factor 0.8 and supplies the result to the adder 104.

The second order IIR filter shown in FIG. 8 is then decomposed to iir instructions shown in FIGS. 6A and 6B. The iir instruction includes an add operation (+), a shift operation, a multiply operation (×), and a delay operation. A division can be executed by the shift operation. The second order IIR filter shown in FIG. 8 is divided into a unit of the add, shift, multiply and delay operations.

Figure 9:
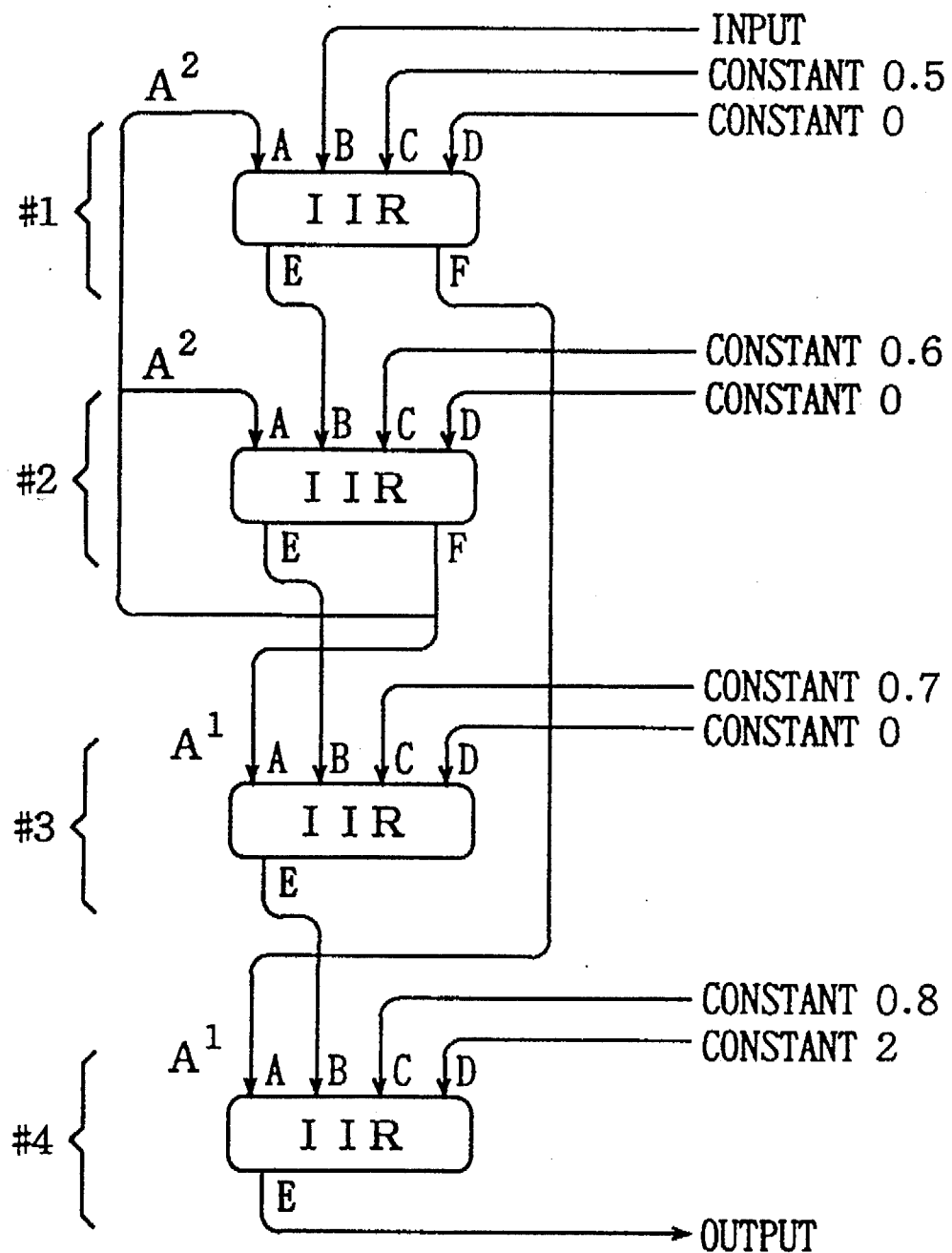
FIG. 9 illustrates a flow graph of the second order IIR filter, shown in FIG. 8, described with iir instructions.

Namely, the adder 101, the delay circuit 108 and the multiplier 109 are expressed by a first iir instruction #1. The adder 102, the delay circuit 105 and the multiplier 106 are expressed by a second iir instruction #2. The adder 103 and the multiplier 107 are expressed by a third iir instruction #3. The adder 104, the divider 105 and the multiplier 110 are expressed by a fourth iir instruction #4. FIG. 9 illustrates a flow graph describing the first to fourth iir instructions #1 to #4.

Multiplication factors of the multipliers 106, 107, 109 and 110 are expressed by constants which are supplied to C inputs in the respective operations.

Referring to FIG. 9, the IIR filter is expressed by four tandem-connected iir instructions #1 to #4. The first iir instruction #1 receives an F output of the second iir instruction #2 in its A input and receives external input data in its B input, while receiving a constant 0.5 in its C input and receiving a constant 0 in its D input. The A2 input shown in FIG. 6B is employed for the A input of the first iir operation #1.

The second iir instruction #2 receives its own F output in its A input and receives an E output of the first iir instruction #1 in its B input, while receiving a constant 0.6 in its C input and receiving a constant 0 in its D input. The A2 input is employed for the A input of the second iir instruction #2.

The third iir instruction #3 receives the F output of the second iir instruction in its A input and receives an E output of the second iir instruction #2 in its B input, while receiving a constant 0.7 in its C input and receiving a constant 0 in its D input. The A1 input is employed for the A input of the third iir instruction #3.

The fourth iir instruction #4 receives the F output of the first iir instruction in its A input and receives the E output of the third iir instruction #3 in its B input, while receiving a constant 0.8 in its C input and receiving a constant 2 in its D input. A filter processing result is outputted from an E output of the fourth iir instruction #4.

Data deciding a shift bit number in a shift operation is supplied to the D inputs of the iir instructions. A division of the data is implemented by the shift operation. In the filter structure shown in FIG. 8, the division is executed only in the divider 105. A division by a factor 4 is implemented by shifting the data by two bits to a lower bit direction. Therefore, a constant 2 is supplied to the D input of the fourth iir instruction #4. On the other hand, constants 0 are supplied to the D inputs of the remaining iir instructions #1 to #3 since no divisions are executed with respect to these instructions.

FIG. 10 illustrates programs describing the flow graph shown in FIG. 9 in a text format. Referring to FIG. 10, numerals 1 to 6 on the right end denote program numbers, while numerals 0 to 4 on the left end denote row numbers (entry numbers) in the register file. The row numbers are in one-to-one correspondence to numbers of rows indicating data destinations. The contents of the programs are now described.

(1) In the program No. 1, "initial" indicates declaration of an initial value. "1(A2)=0" indicates that a value stored in the A2 register in the first iir instruction #1, i.e., an input initial value for a delay operation $Z^{-1}$ is zero.

Further, "2(A2)=0" indicates that an initial value of the A2 register in the second iir instruction #2 is zero, i.e., an initial value for its operation ($Z^{-1}$) is zero.

(2) In the program No. 2, "input" indicates data input from an exterior. "1(B)" indicates that the input data is stored in the B register of the first row corresponding to the first iir instruction #1.

(3) In the program No. 3, "iir" indicates an iir instruction. "iir(, , 0.5, 0)" indicates constants utilized for the iir instruction. The values in the parentheses express constants of respective inputs, i.e., constants for corresponding inputs of iir(A2, B, C, D). The program No. 3 indicates the following:

No constant value is set for the A2 input (only a variable). No constant value is set for the B input either. A constant 0.5 is set for the C input. A constant 0 is set for the D input. Presence of no constant value is expressed only by ",". Namely, 0.5 is set as a multiplication factor and zero is set as a shift bit number while neither shift operation nor division is carried out with respect to the first iir operation (program No. 1).

"2(B)!4(A1)" indicates destinations of the data of this iir instruction. The numbers in front of the parentheses indicate the destination row numbers, i.e., the destinations of the E and F outputs, which are distinguished by !. The program No. 3 further indicates the following:

2(B): The E output is supplied to the B input of the second iir instruction of the second row.

The F output is supplied to the A1 input of the fourth iir instruction of the fourth row.

(4) As to the program No. 4, respective constants of iir instructions are similar to those of the iir instructions of the program No. 3. A plurality of data output destinations are present. Namely, the E output is supplied to the A2 input of the second row as well as to the B input of the iir instruction of the third row. The first to fourth iir instructions correspond to respective rows in the register file, and hence the E output of the second iir instruction is transferred to the A2 and B registers of the second and third rows of the register file.

The F output is transferred to the A2 input of the first iir instruction and the A1 input of the third iir instruction. Namely, the F output of the second iir operation is inputted in the A2 and A1 registers of the first and third rows in the register file.

(5) As to the iir instructions of the program No. 5, constants thereof and definitions of the E output are identical to those described above. "Absorb" indicates that there is no destination. Namely, this indicates that the F output of the third iir instruction is not outputted.

(6) In the program No. 6, definition of iir instruction and the destinations of the F output are similar to those of the aforementioned third iir instruction. "Output" indicates that the E output of the fourth iir instruction is outputted to the exterior of the unit as output data, to be utilized as data indicating the result of filter processing.

The programs described in the text format correspond to the rows of the register file respectively. Namely, the first to fourth iir instructions correspond to the entries of the first to fourth rows of the register file respectively. Data are written in and read from the register file along these programs.

[Concrete Operation of Filter Unit]

Specific operations of the filter unit are now described in the following order:

(a) The rule of the operations is described. (b) The states of the registers are shown along execution order. (c) Performance is examined to prove that no wasteful overhead is incurred. (d) Operations with a plurality of (four) computing elements are described.

<Basic Rule>

(1) Initial values are stored in the A2, A1 and B registers. These data stored in the A2, A1 and B registers are updated by newly inputted data. The constants stored in the C and D registers are not updated. Data which are not constants are updated by newly received input data. A determination as to whether or not certain data is a constant is made by the iir instruction.

(2) Values of all registers are restricted to single writing/single readout. Namely, the rule of single substitution/single readout is applied to the values excluding the constants.

(3) The data stored in the A1 register and the result of calculation of the computing element including addition/shifting can be written in a plurality of arbitrary rows (programmable). In programming (see FIG. 10), the destinations are specified by the program as E and F outputs respectively in correspondence to the respective instructions.

(4) The results of arithmetic operations excluding add/shift composite arithmetic operations are written in predetermined registers (X registers).

In the following example of calculation, it is assumed that the first computing element group 40 includes a single multiplier and the second computing element group 50 includes a single add/shift composite computing element.

[Calculation Rules]

(1) Arithmetic operations are successively carried out from that having required data completely collected, regardless of the row numbers, i.e., the program numbers.

(2) The arithmetic operations are carried out with priority of addition/shifting and then multiplication.

(3) When data for the same arithmetic operation are simultaneously completely collected, the arithmetic operations are carried out in reverse order of the row numbers. In other words, an arithmetic operation along an operation having a larger row number is carried out in advance.

(4) Data transfer from the A2 register to the A1 register (expression of delay) and data copy in the F output (if the F register includes information on a plurality of destinations) are carried out in advance of the arithmetic operations.

(5) An arithmetic operation having a plurality of destinations is not carried out unless all destinations are empty. In other words, the arithmetic operations are carried out when the destinations are empty and the required data are completely collected. In the following description, this rule is applied to the case of transfer by the E output of the add/shift composite arithmetic operation and the F output of the multiplication result.

(6) No later arithmetic operation takes precedence over a former arithmetic operation (no passing-over is caused in the order of arithmetic operations).

Description is now made on data movement in the register file carrying out the second order IIR filter processing shown in FIG. 8.

Figure 11:
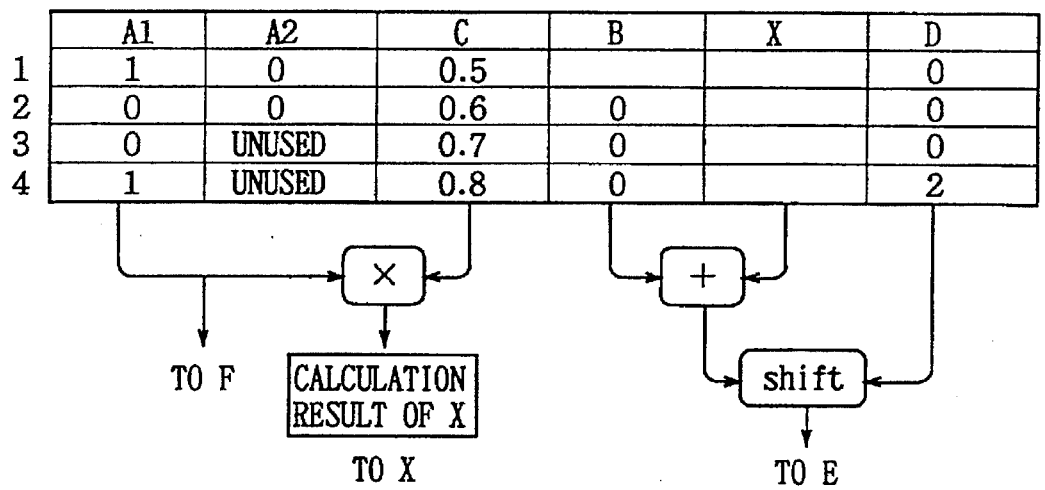
FIG. 11 illustrates states of data stored in the registers provided in the register file in an initial state for implementation of the filter processing shown in FIG. 8 and structures of connection with computing elements.

FIG. 11 illustrates initial states of the registers and relation between the respective registers and the computing elements. The programs shown in FIG. 10 are written in the registers to initialize the internal states thereof. In such states, constants are written in the C and D registers respectively. The A1 and C registers are coupled to multipliers. The B and X registers are coupled to adders, while the D registers are coupled to shift circuits. Data read from the A1 registers are written in corresponding registers along destination information stored in the F registers.

Outputs from the shift circuits, i.e., add/shift composite computing elements, are written in corresponding registers along destination information stored in the E registers. Referring to FIG. 11, numerals shown on the left end denote row numbers in the register file, in one-to-one correspondence to the row numbers of the respective programs shown in FIG. 10. The A1 registers of the first to fourth rows store data 1, 0, 0 and 1 as initial values. These data are mere examples, and the values initialized in the A1 registers are processed as invalid data in execution of filter processing.

Figure 12A:
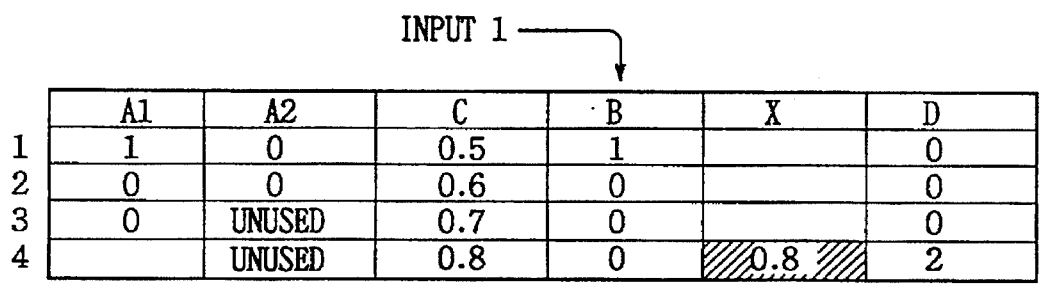
FIGS. 12A and 12B illustrate data stored in the registers provided in the register file in a first execution cycle for IIR filter processing and corresponding data distribution in the digital filter.
Figure 12B:
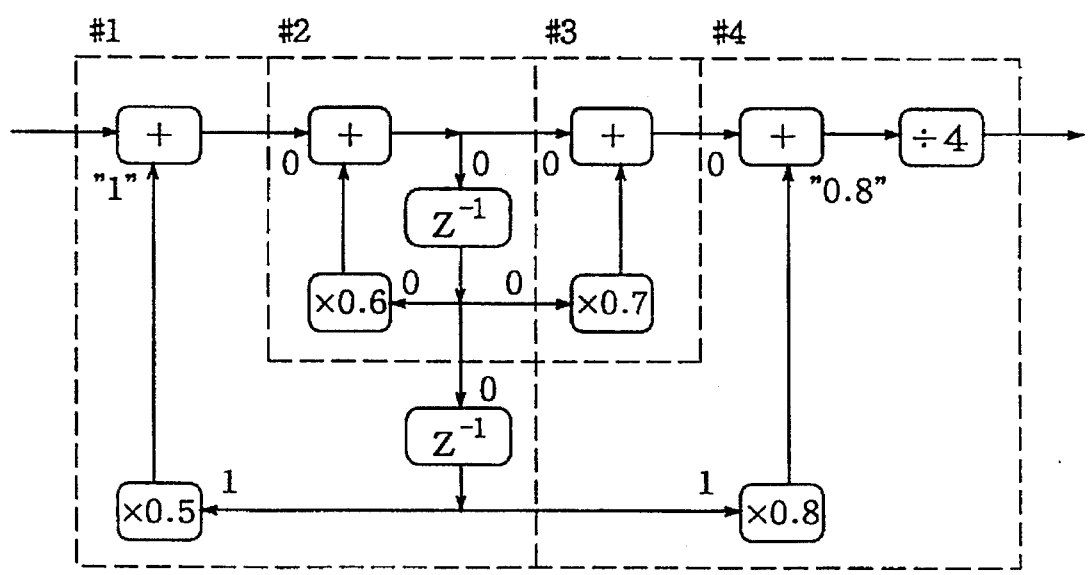

FIGS. 12A and 12B illustrate operations in a first cycle. Referring to FIG. 12A, data "1" is stored in the B register of the first row. In parallel with this input operation, a multiplication using the data "1" in the A1 register of the fourth row is carried out, so that the result of this multiplication is stored in the X register.

Namely, data "1" is supplied to an input of the adder in a block #1 while data "0.8" is supplied to an input of the adder in a block #4, as shown in FIG. 12B.

Figure 13A:
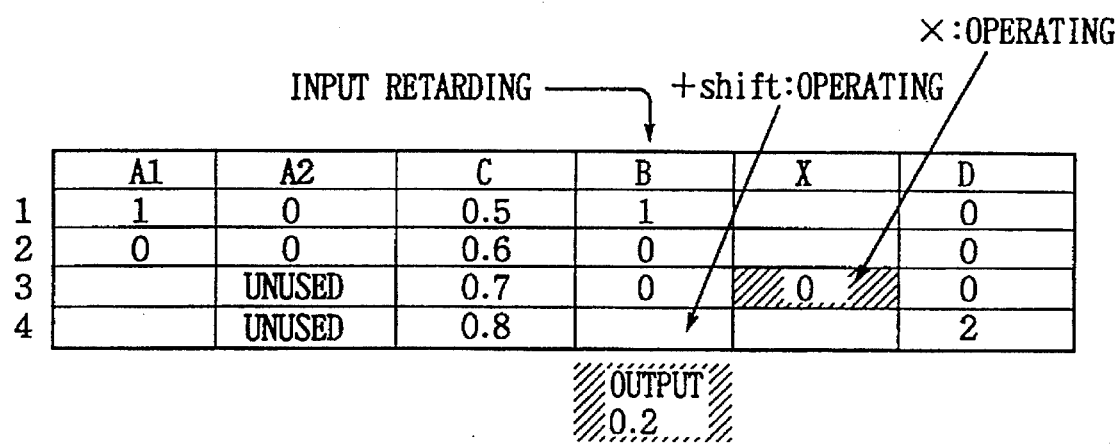
FIGS. 13A and 13B illustrate data stored in the registers in a second execution cycle for the IIR filter processing and corresponding data distribution in the digital filter.
Figure 13B:
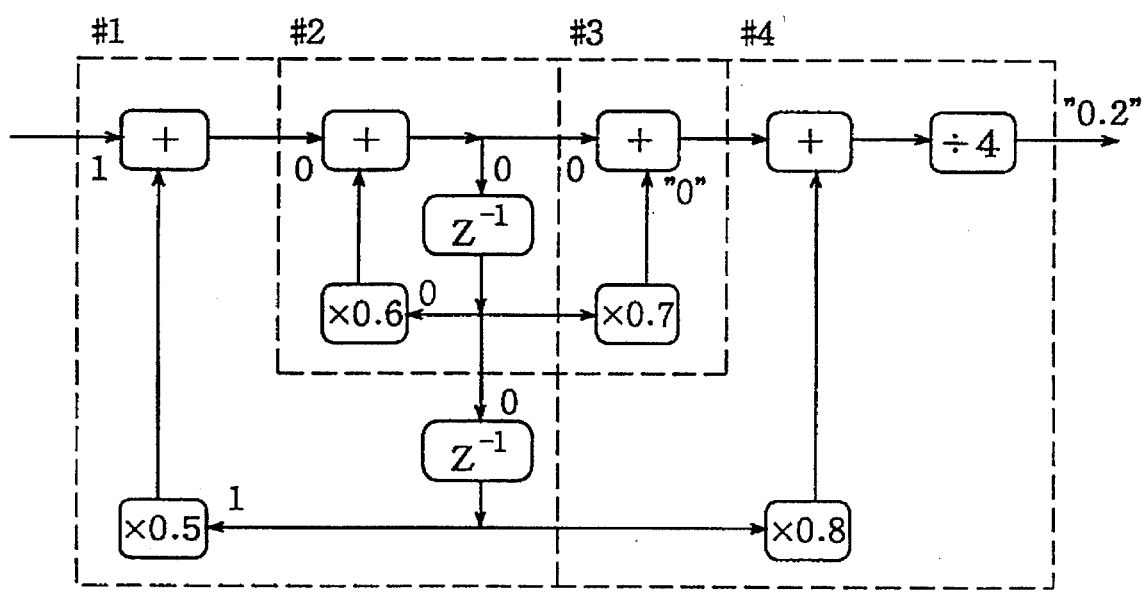

FIGS. 13A and 13B illustrates contents of the registers in a second execution cycle and the data distribution in the digital filter. Referring to FIG. 13A, no new data is received from the input part and the digital filter enters an input wait state. In the entry of the fourth row, an add/shift arithmetic operation is carried out since data are completely collected in the B and X registers. The result of an operation corresponding to the fourth row is written in a register which is decided by the content of the E register. "Output" is specified for the E register of the fourth iir instruction. Therefore, data "0.2" is outputted to the exterior.

In the entry (corresponding to the instruction #3) of the third row, on the other hand, the data "0" of the A1 register is multiplied by the data "0.7" in the C register, so that the result of this multiplication is stored in the corresponding X register.

Referring to FIG. 13A, blank portions of the registers indicate that data stored therein have been consumed. Since the data are written in and read from the register file along the rule of single substitution/single readout, already written and read data are not re-used. This also applies to the following description.

The data states shown in FIG. 13A are related to the data in the digital filter as shown in FIG. 13B. In the block #4, the adder adds the data "0" and "0.8", and then a division is carried out by a shift operation, so that "0.2" is outputted.

In the block #3, on the other hand, the multiplier carries out a multiplication of the factors 0.7 and 0, and supplies the multiplication result "0" to the adder. The multiply operation and the add/shift composite operation, which are carried out by different computing elements, can be carried out in parallel with each other.

Figures 14A, 14B:
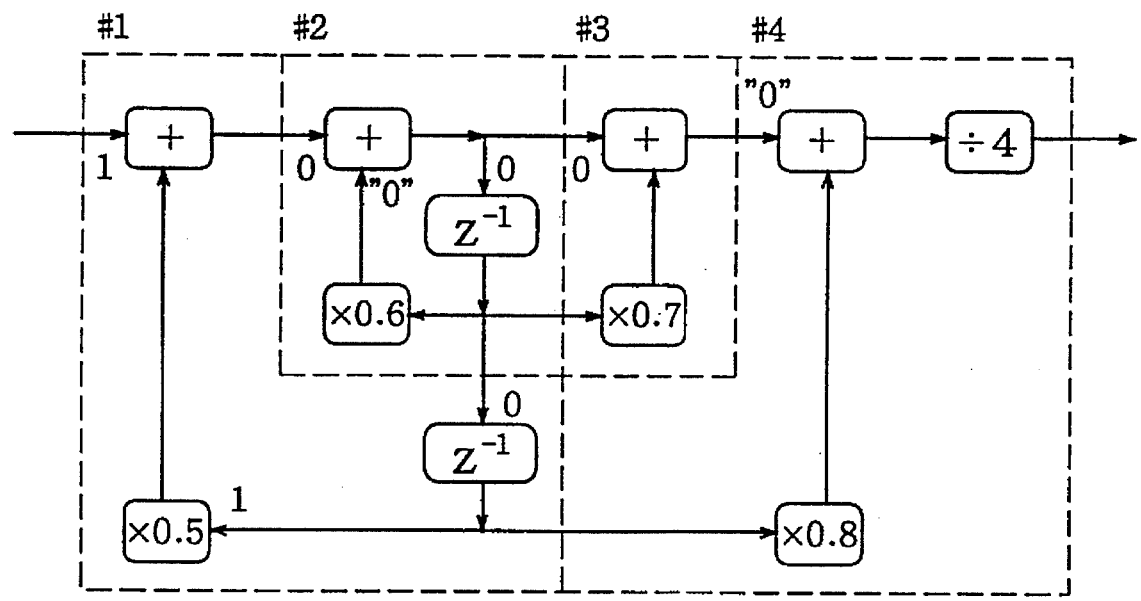
FIGS. 14A and 14B illustrate data stored in the registers a third execution cycle for the IIR filter processing and corresponding data distribution in the digital filter.

FIGS. 14A and 14B illustrate the contents of the registers and data distribution in the digital filter in a third execution cycle. As shown in FIG. 14A, the result of an add/shift arithmetic operation in the third iir instruction is written in the D register of the fourth row, while the data of the A1 and C registers are multiplied by each other in the second row of the iir instruction so that the multiplication result is stored in the X register of the second row.

Namely, the input "0" of the adder in the block #2 enters a definite state, while the input of the adder in the block #4, i.e., the output of the adder in the program #3, is ascertained to "0", as shown in FIG. 14B.

Figures 15A, 15B:
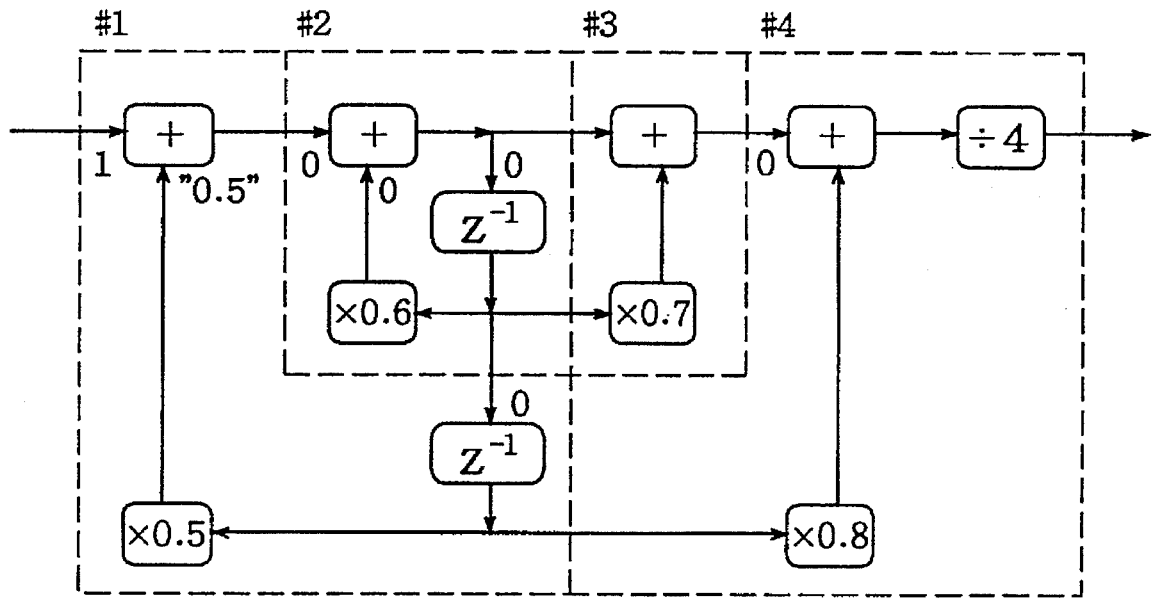
FIGS. 15A and 15B illustrate data stored in the registers in a fourth execution cycle for the IIR filter processing and corresponding data distribution in the digital filter.

FIGS. 15A and 15B illustrate contents of the data registers and current distribution of definite data in the digital filter in a fourth execution cycle. Referring to FIG. 15A, a multiplication is carried out on the data stored in the A1 and C registers of the first row, so that the multiplication result is stored in the X register. Namely, the multiplication result of the multiplier in the block #1 is ascertained while an input of the adder in the block #1 is ascertained, as shown in FIG. 15B. Then, data copy is executed in order to implement operations of delay elements.

Referring to FIG. 15A, data in the B and X registers of the second row have been ascertained. Therefore, it seems that an add/shift arithmetic operation can be executed in parallel with the multiplication of the data in the A1 and C registers of the first row. In this case, however, no add/shift arithmetic operation is carried out on the data of the B and X registers of the second row, along the calculation rule that no later arithmetic operation takes precedence over a former arithmetic operation.

FIGS. 16A to 16C illustrate data movements in the registers for implementing delay operations. Referring to FIG. 16A, the data "0" of the A2 register of the first row is first copied to the A1 registers of the first and fourth rows. Thus, an operation of a delay element included in the block #1 is implemented.

Referring to FIG. 16B, the data of the A2 register of the second row is then copied to the A2 register of the first row and the A1 registers of the second and third rows. Thus, a delay operation of the delay element in the block #2 is implemented. Inputs of the respective multipliers in the digital filter are ascertained.

Referring to FIG. 16C, an add/shift arithmetic operation is carried out on the data of the B and X registers of the second row, so that the result of this arithmetic operation is stored in the A register of the second row and the B register of the third row. This indicates that an addition is carried out in the block #2 and the result of this addition is supplied to the input of the delay element and that of the adder of the block #3 to enter a definite state.

FIGS. 17A to 17C illustrate arrangements of the data in the data registers in operations following those shown in FIGS. 16A to 16C. Referring to FIG. 17A, a multiplication is carried out on the data of the A1 and C registers of the fourth row, so that the result of this multiplication is stored in the X register. This corresponds to such a state that the output of the multiplier in the block #4 is ascertained.

When the aforementioned copy, add/shift and multiply operations are successively carried out, the data of the B register of the third row and that of the X register of the fourth row are finally ascertained, as shown in FIG. 17B. Namely, the input of the adder in the block #3 and the output of the multiplier in the block #4 are ascertained by execution of the aforementioned operations, as shown in FIG. 17C. The aforementioned copy operations are regularly carried out in execution of delay operations. In the following description, the operations shown in FIGS. 16A to 17A are omitted and only the final state shown in FIG. 17B is indicated.

Figures 18A, 18B:
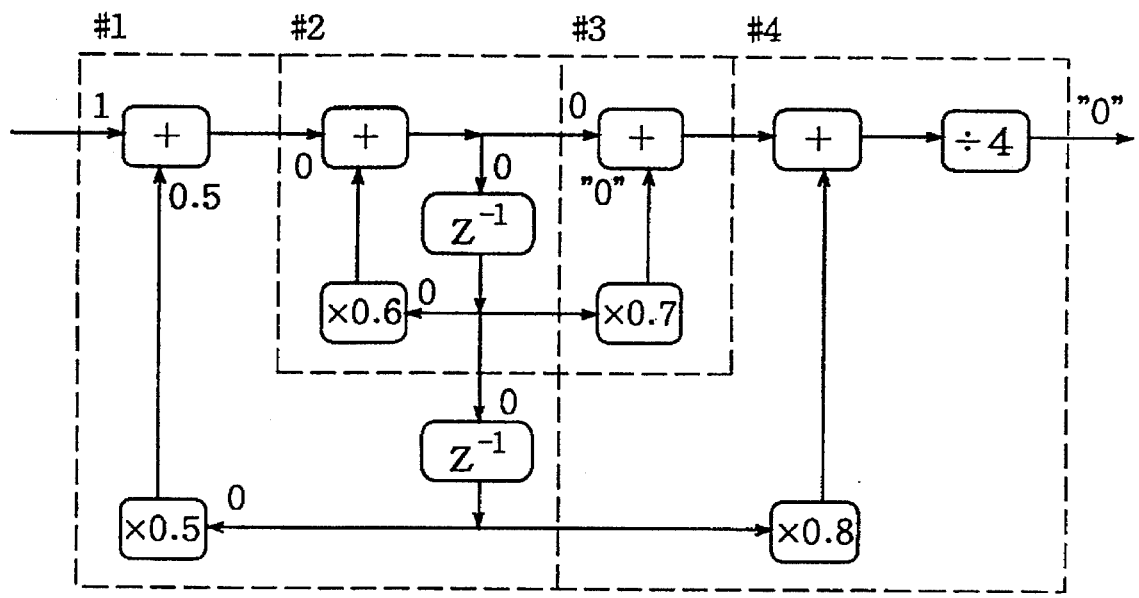
FIGS. 18A and 18B illustrate data stored in the registers in a sixth execution cycle for the IIR filter processing and corresponding data distribution in the digital filter.

FIGS. 18A and 18B illustrate data arrangement in the data registers and states of definite data in the digital filter in a sixth execution cycle. As shown in FIG. 18A, a multiplication is carried out on the data of the A1 and C registers of the third row, so that the result of this multiplication is written in the X register of the third row. In parallel with this multiply operation, an add/shift arithmetic operation is executed using the data in the B and X registers of the fourth row, so that the result of this arithmetic operation, data "0", is outputted as output data (see FIG. 18B).

Figures 19A, 19B:
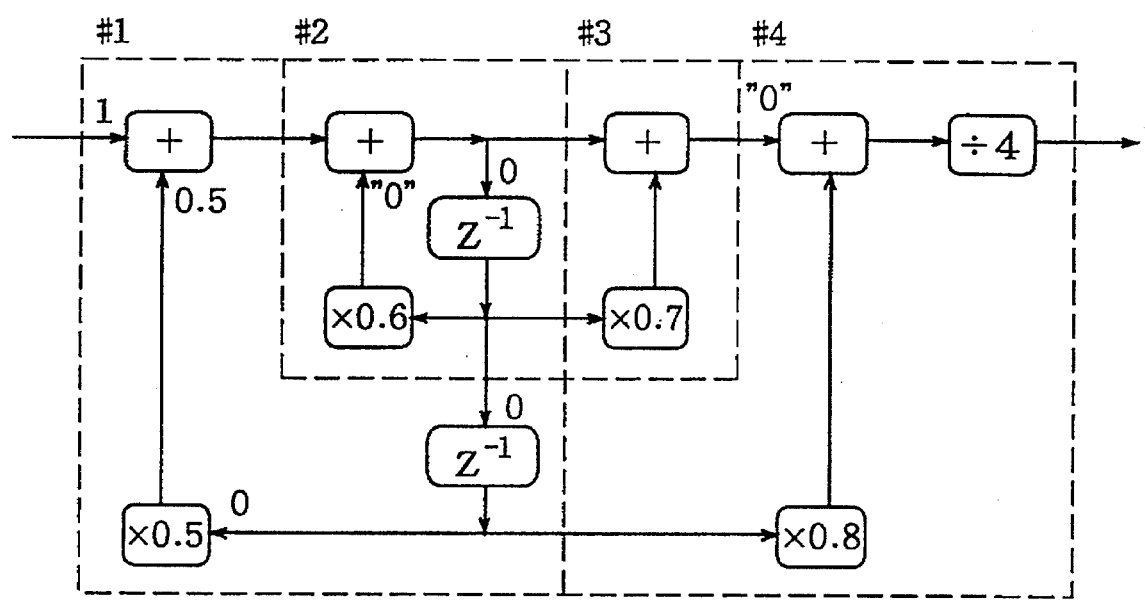
FIGS. 19A and 19B illustrate data stored in the registers in a seventh execution cycle for the IIR filter processing and corresponding data distribution in the digital filter.

FIGS. 19A and 19B illustrate data arrangement in the register file and arrangement states of correspondent data in the digital filter in a seventh execution cycle. As shown in FIG. 19A, a multiplication is carried out using the data of the A1 and C registers of the second row, so that the result of the multiplication is stored in the X register. In parallel with this multiply operation, an add/shift arithmetic operation is carried out on the data of the B and X registers of the third row, so that the result of this arithmetic operation is stored in the B register of the fourth row.

Namely, the input of the adder, i.e., the output of the multiplier, is ascertained in the block #2, while the input of the adder in the block #4, i.e., the output of the adder in the block #3, enters a definite state, as shown in FIG. 19B.

Figures 20A, 20B:
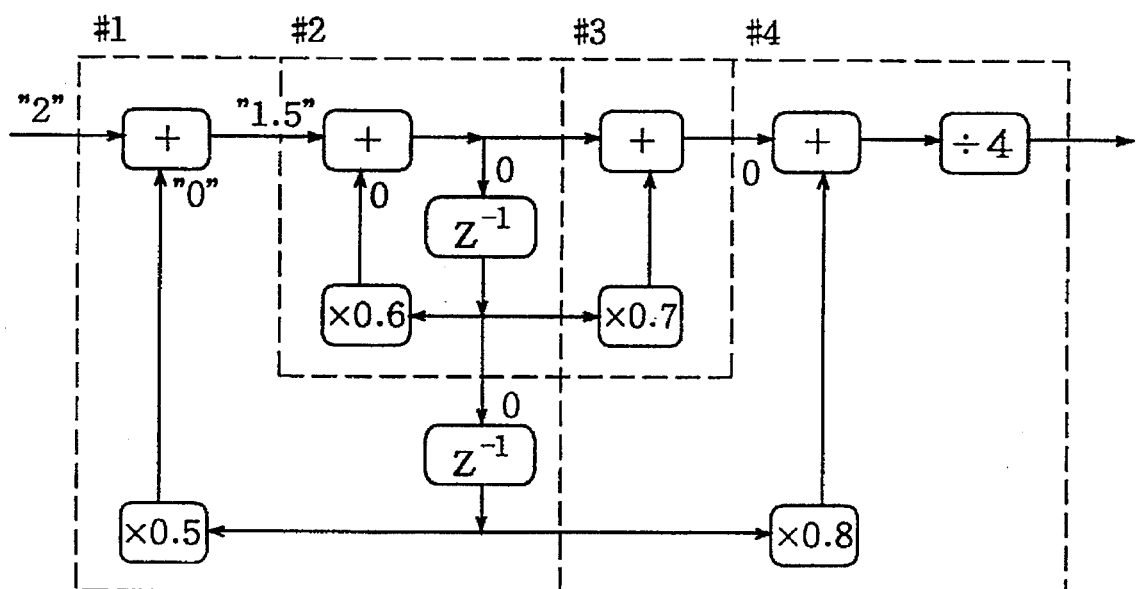
FIGS. 20A and 20B illustrate data stored in the registers in an eighth execution cycle for the IIR filter processing and corresponding data distribution in the digital filter.

FIGS. 20A and 20B illustrate data arrangement in the data registers and data distribution in the digital filter in an eighth execution cycle. Referring to FIG. 20A, next input data "2" is stored in the B register of the first row. In parallel with this storage, a multiplication is carried out on the data stored in the A1 and C registers of the first row, so that the result of this multiplication is written in the X register of the first row. At the same time, an add/shift arithmetic operation is carried out on the data of the B and X registers of the first row, so that the result of this arithmetic operation is stored in the B register of the second row. Namely, a multiplication and an add/shift arithmetic operation are carried out on the data registers of the first row, while new input data is stored.

Namely, the output of the adder in the block #1, i.e., the input of the adder in the block #2, is ascertained while the output of the multiplier in the block #1 is ascertained, as shown in FIG. 20B. Thereafter the new input data "2" is employed to repeat operations similar to those described above.

Figure 21:
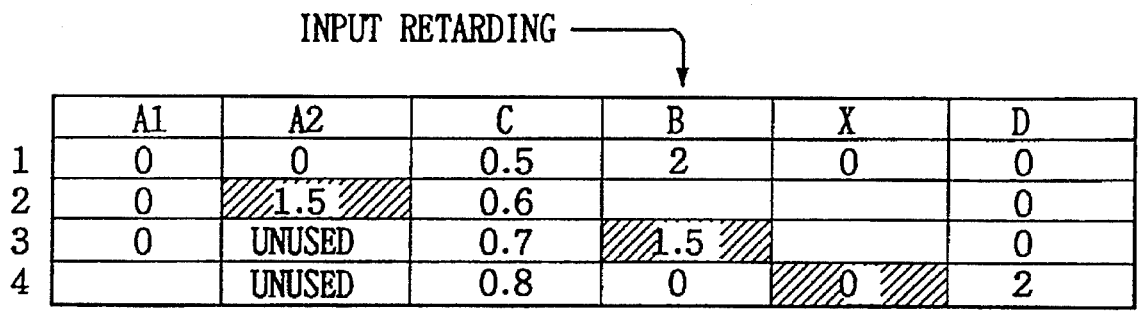
FIG. 21 illustrates data stored in the registers in a ninth execution cycle for the IIR filter processing.

FIG. 21 illustrates arrangement of data in the data registers in a ninth execution cycle. Referring to FIG. 21, an add/shift arithmetic operation using the data in the B and X registers of the second row is carried out so that the result is stored in the B register of the third row and the A2 register of the second row. Then, delay operations of the delay elements are carried out in advance of execution of the operation of the second row. Namely, the data stored in the A2 registers are transferred to the A1 registers. More specifically, the content of the A2 register of the first row is transferred to the A1 registers of the first and fourth rows, while the content of the A2 register of the second row is transferred to the A2 register of the first row and the A1 registers of the second and third rows. The aforementioned add/shift composite arithmetic operation is executed after execution of the transfer operations. In parallel with this add/shift arithmetic operation, a multiplication is carried out on the data in the A1 and C registers of the fourth row, so that the result of this multiplication is stored in the X register of the fourth row.

Figure 22:
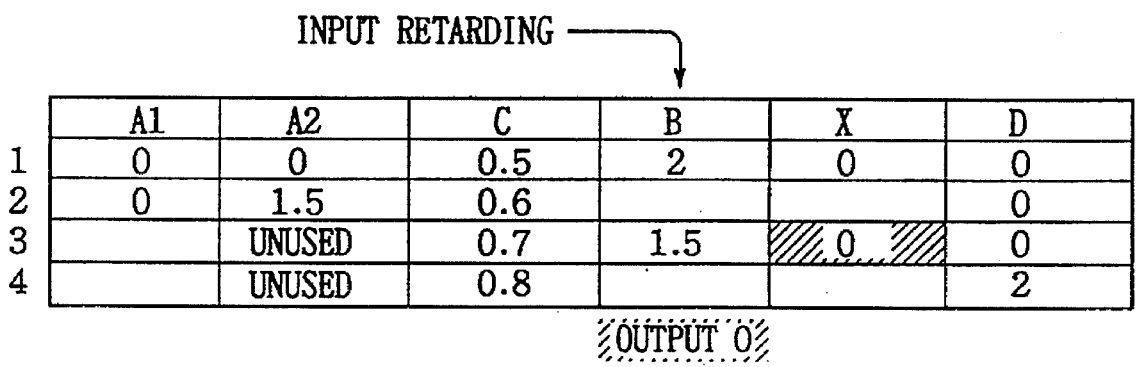
FIG. 22 illustrates data stored in the registers in a tenth execution cycle for the IIR filter processing.

FIG. 22 illustrates data arrangement in the data registers in a tenth execution cycle. Referring to FIG. 22, a multiplication is carried out on the data stored in the A1 and C registers of the third row, so that the result of this multiplication is stored in the X register of the third row. In parallel with this multiply operation, an add/shift arithmetic operation is carried out on the data stored in the B and X registers of the fourth row, so that the result of this composite arithmetic operation is outputted as output data.

Figure 23:
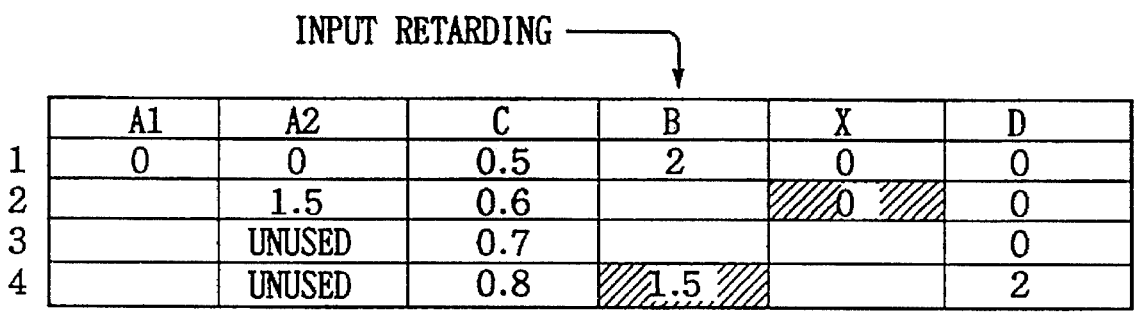
FIG. 23 illustrates data stored in the registers in an eleventh execution cycle for the IIR filter processing.

FIG. 23 illustrates data arrangement in the data registers in an eleventh execution cycle. Referring to FIG. 23, a multiplication is carried out on the data stored in the A1 and C registers of the second row, so that the result of this multiplication is stored in the X register of the second row. In parallel with this multiply operation, an add/shift arithmetic operation is carried out on the data stored in the B and X registers of the third row, so that the result of this arithmetic operation is stored in the B register of the fourth row.

FIG. 24 illustrates data arrangement in the data registers in a twelfth execution cycle. Referring to FIG. 24, next data "3" is newly inputted in the D register of the first row. In parallel with this data input, a multiplication is carried out on the data stored in the A1 and C registers of the first row, so that the result of this multiplication is stored in the X register of the first row. In parallel with such input and multiplication, an add/shift composite arithmetic operation is carried out on the data stored in the B and X registers of the first row, so that the result of this arithmetic operation is stored in the B register of the second row. At this time, the operation of "4(A1)" in the first iir operation is executed by the copy operation shown in FIG. 21.

FIG. 25 illustrates data arrangement in the data registers in a thirteenth execution cycle. The data in the A1 registers of the first to fourth rows have been entirely consumed in the twelfth execution cycle. Therefore, data are transferred (copied) from the A2 registers to the A1 registers. Thus, delay operations are implemented by the delay elements. After the copy operations, the data ("0") of the fourth row is multiplied by the data of the C register of the fourth row, so that the result of this multiplication is stored in the X register of the fourth row. In parallel with this multiply operation, an add/shift arithmetic operation is carried out on the data stored in the B and X registers of the second row, so that the result of this arithmetic operation is stored in the B register of the third row and the A2 register of the second row.

FIG. 26 illustrates data arrangement in the data registers upon completion of a fourteenth execution cycle. An add/ shift arithmetic operation is carried out on the data stored in the B and X registers of the fourth row, so that the result of this arithmetic operation is outputted as output data. In parallel with this add/shift arithmetic operation, a multiplication is carried out using the data stored in the A1 and C registers of the third row, so that the result of this multiplication is stored in the X register of the third row.

FIG. 27 illustrates data arrangement in the data registers upon completion of a fifteenth execution cycle. Referring to FIG. 27, a multiplication is carried out on the data stored in the A1 and C registers of the second row, so that the result of this multiplication is stored in the X register of the second row. In parallel with this multiply operation, an add/shift arithmetic operation is carried out on the data stored in the B and X registers of the third row, so that the result of this arithmetic operation is stored in the B register of the fourth row. In parallel with this add/shift arithmetic operation, a multiplication is carried out on the data stored in the A1 and C registers of the second row, so that the result of this multiplication is stored in the X register of the second row.

FIG. 28 illustrates data arrangement in the data registers upon completion of a sixteenth execution cycle. Referring to FIG. 28, an add/shift arithmetic operation is first carried out on the data stored in the B and X registers of the first row, so that the result of this arithmetic operation is written in the B register of the second row. Then, a multiplication is carried out on the data stored in the A1 and C registers of the first row, so that the result of this multiplication is stored in the X register of the first row. In parallel with or after such data storage in the X register, new input data "4" is stored in the B register of the first row.

Thereafter the aforementioned operations are repeatedly executed. Namely, when the data stored in the A1 register of the first row is consumed (read) twice, new input data is stored in the B register of the first row. When the data in the A1 registers of the first to fourth rows are all consumed once, data are copied from the A2 registers.

In the aforementioned operations, arithmetic operations are carried out when desired data are completely collected in the respective entries (rows). Determinations as to whether or not such operation data are completely collected are made by detecting that write control circuits for the respective data registers carry out writing. When data are written in required two data registers, the data are read so that desired arithmetic operations are carried out. When data are simultaneously ascertained in a plurality of rows with respect to the same arithmetic operation, the arithmetic operation is carried out along priority, i.e., from that for a larger row number.

The following structure is conceivable for this: Read/write control circuits are provided in correspondence to the respective registers, so that data are transmitted to the computing elements and detection is also made as to complete collection of desired data under control by the read/write control circuits. The registers in which the data are written are decided by the data programmed in the E and F registers. Therefore, write control circuits write data in corresponding data registers along the programmed data. Also in this case, read control circuits are provided in correspondence to the respective registers to write supplied data when destination information from the E registers matches with addresses (register position specifying information) allotted thereto. In this case, the read control circuits read contents of the corresponding E or F registers in data reading. In execution of iir instructions, the contents of the E registers are also read when those of the A1 and C registers are read, while the contents of the F registers are also read when those of the B and X registers are read. The storage destinations of the multiplication results are fixedly set so that X registers of the same entries as registers selected for multiplications are brought into writable states so that the data are written therein.

The aforementioned operations, the calculation rules and the like are implemented by the sequence controller SC and the read/write control part RWC shown in FIG. 2.

FIG. 29 illustrates operating states of the respective computing elements in the aforementioned execution cycles 2 to 16. Referring to FIG. 29, circles denote operating states, while blanks denote data wait states, i.e., idling states of the computing elements.

It is clearly understood from FIG. 29 that all multipliers and add/shift composite computing elements are in operating states in the cycles 5 to 16, to attain full operating states with 100% operations of the computing elements in stable states excluding initial operations. Namely, the computing elements are driven in the respective execution cycles without overhead being otherwisely caused by waiting for execution of operations, whereby filter processing can be carried out at a high speed.

The aforementioned filter processing is implemented with single multipliers and single add/shift composite computing elements. Description is now made on operations for carrying out filter processing with quaternary computing elements, i.e., four multipliers and four add/shift composite computing elements.

Figures 30A, 30B:
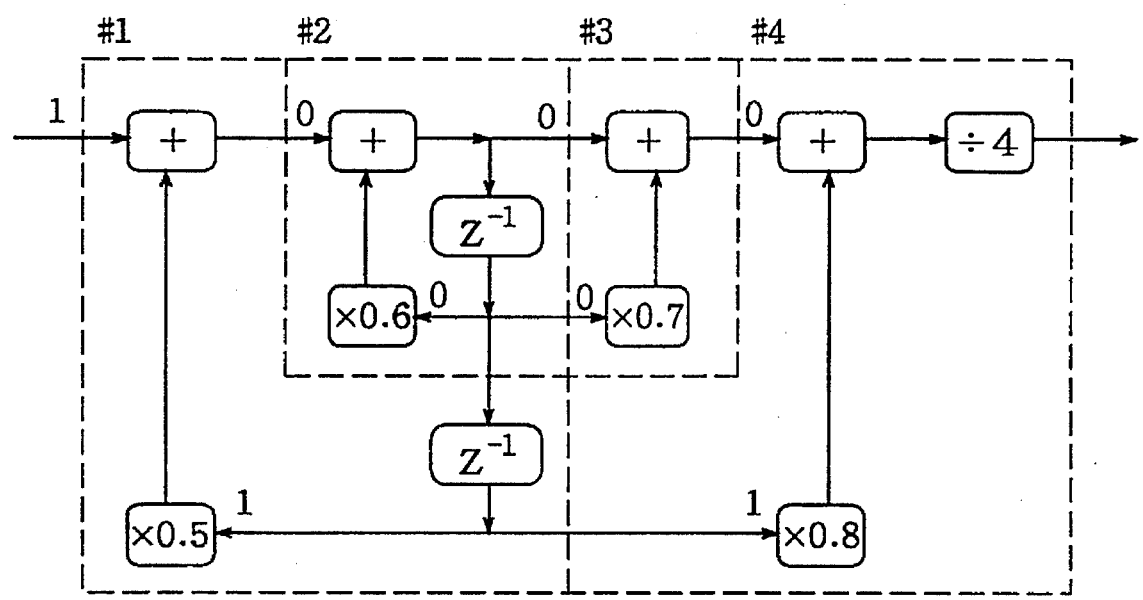
FIGS. 30A and 30B illustrate data stored in the registers in execution of IIR filter processing with a plurality of computing elements and corresponding data distribution in the digital filter.

FIG. 30A illustrates data arrangement in the data registers in execution of the filter processing with quaternary computing elements. Referring to FIG. 30A, states similar to those in FIG. 12A are initialized. In this state, input data "1" is stored in the B register of the first row. In this state, inputs of the adders in the blocks #1 to #4 are initialized respectively as shown in FIG. 30B, while inputs of the multipliers are also initialized. In the following description, an operation of one cycle is divided into a state (a) showing add/shift composite computing elements and a state (b) showing multipliers, in order to observe operations of the computing elements.

Figure 31A:
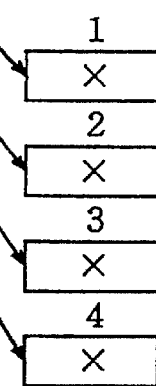
FIGS. 31A and 31B illustrate data stored in the registers in a first execution cycle for the IIR filter processing with a plurality of computing elements and corresponding data distribution in the digital filter.
Figure 31B:
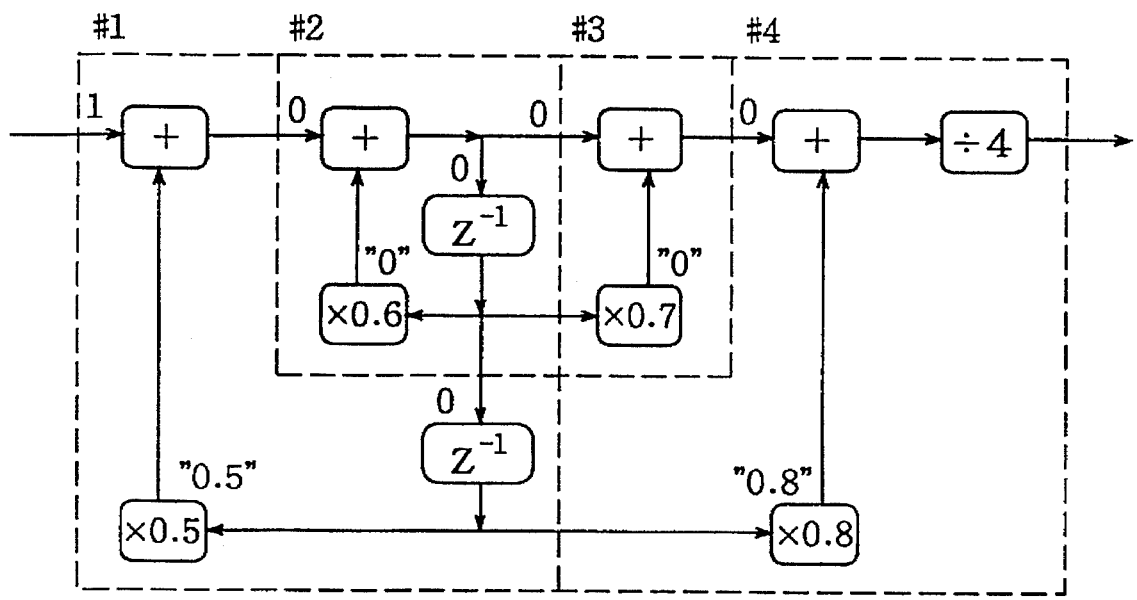

FIGS. 31A and 31B illustrate data arrangement in the data registers and data distribution states in the digital filter in a first execution cycle. As shown in FIG. 31A, multiplications of the data in the A1 and C registers of the first to fourth rows are parallelly carried out in the first execution cycle, so that the results of the multiplications are stored in the corresponding X registers. Add/shift arithmetic operations are not carried out since no available data are stored in the X registers.

In this state, the multipliers in the blocks #1 to #4 execute multiplications in parallel so that the results of the multiplications are ascertained, as shown in FIG. 31B.

Figures 32A, 32B, 32C:
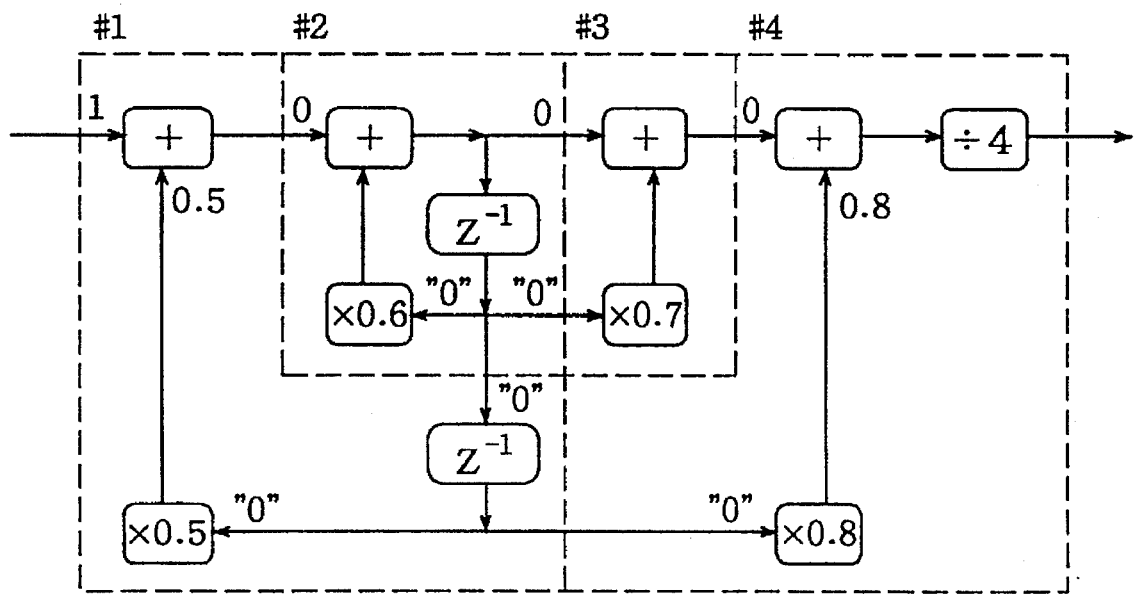
FIGS. 32A, 32B and 32C illustrate data stored in the registers in a second execution cycle for the IIR filter processing with a plurality of computing elements and corresponding data distribution in the digital filter.

FIGS. 32A to 32C illustrate data arrangement in the data registers and states of the data in the digital filter in a second execution cycle. When the data of the A1 registers are all consumed, copy operations from the A2 registers to the A1 registers are carried out. As shown in FIG. 32A, the data stored in the A2 register of the first row is first stored in the A1 registers of the first and fourth rows. Then, the data stored in the A2 register of the second row is transferred to the A2 register of the first row and the A1 registers of the second and third rows, as shown in FIG. 32B. Outputs of the delay elements are ascertained as shown in FIG. 32C. Then, an add/shift arithmetic operation is carried out on the data stored in the B and X registers of the first row.

Figures 33A, 33B:
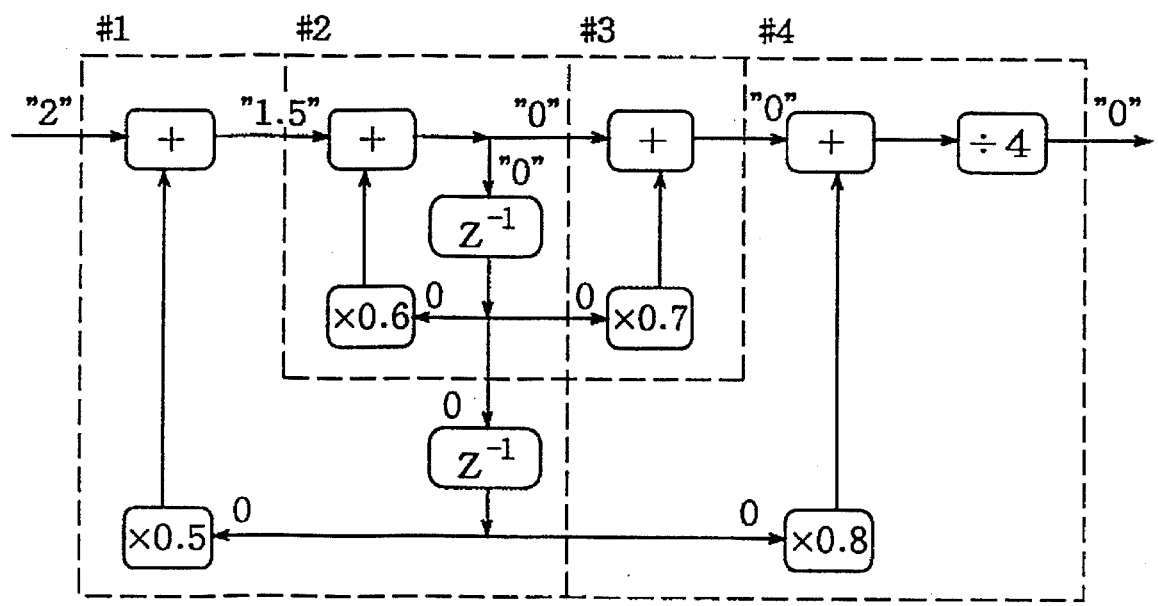
FIGS. 33A and 33B illustrate data stored in the registers in a third execution cycle for the IIR filter processing with a plurality of computing elements and corresponding data distribution in the digital filter.

FIGS. 33A and 33B illustrate states executed following the execution cycle shown in FIGS. 32A to 32C. Referring to FIG. 33A, the contents of the B and X registers of the first to fourth rows are transferred to corresponding add/shift computing elements respectively after completion of copy operations. The arithmetic results are stored in registers indicated by destination information stored in corresponding E registers. The result of the add/shift arithmetic operation on the data in the B and X registers of the first row is stored in the B register of the second row. The result of the arithmetic operation on the data in the B and X registers of the second row is stored in the B register of the third row and the A2 register of the second row. The result of add/shift arithmetic operation on the data stored in the B and X registers of the third row is stored in the B register of the fourth row. The result of the arithmetic operation on the data of the B and X registers of the fourth row is outputted as output data. In this case, data are written in the B registers of next larger row numbers. Only the result of the arithmetic operation in the second row is also written in the A2 register of the second row.

At this time, next input data ("2") is written in the B register of the first row.

Thus, inputs of the adders in the blocks #1 to #4 enter definite states while the content of the A2 register of the second row (delay element input in the block #2) enters a definite state, as shown in FIG. 33B.

Figures 34A, 34B:
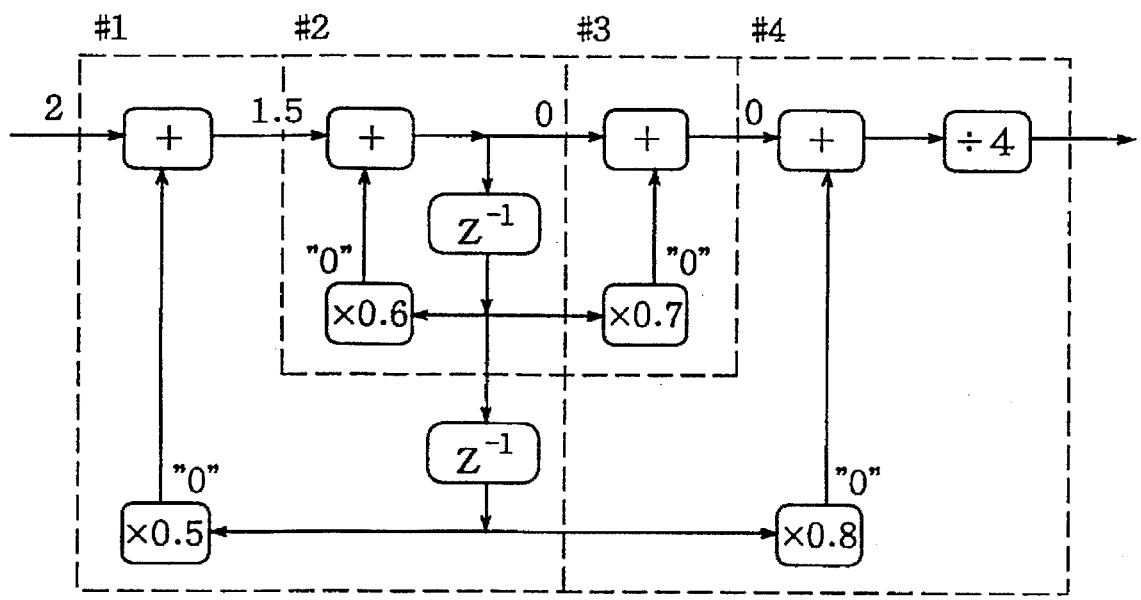
FIGS. 34A and 34B illustrate data stored in the registers upon completion of multiply operations for the IIR filter processing with a plurality of computing elements and corresponding data distribution in the digital filter.

FIGS. 34A and 34B illustrate data arrangement in the data registers and the filter upon completion of the add/shift arithmetic operations. As shown in FIG. 34A, multiplications are carried out on the data stored in the A1 and B registers, so that the results of the multiplications are stored in the X registers. Thus, the outputs of the multipliers in the blocks #1 to #4 are all ascertained to "0", as shown in FIG. 34B. The calculation rule is applied, along which the add/shift arithmetic operation takes precedence over a multiplication.

Figures 35A, 35B, 35C:
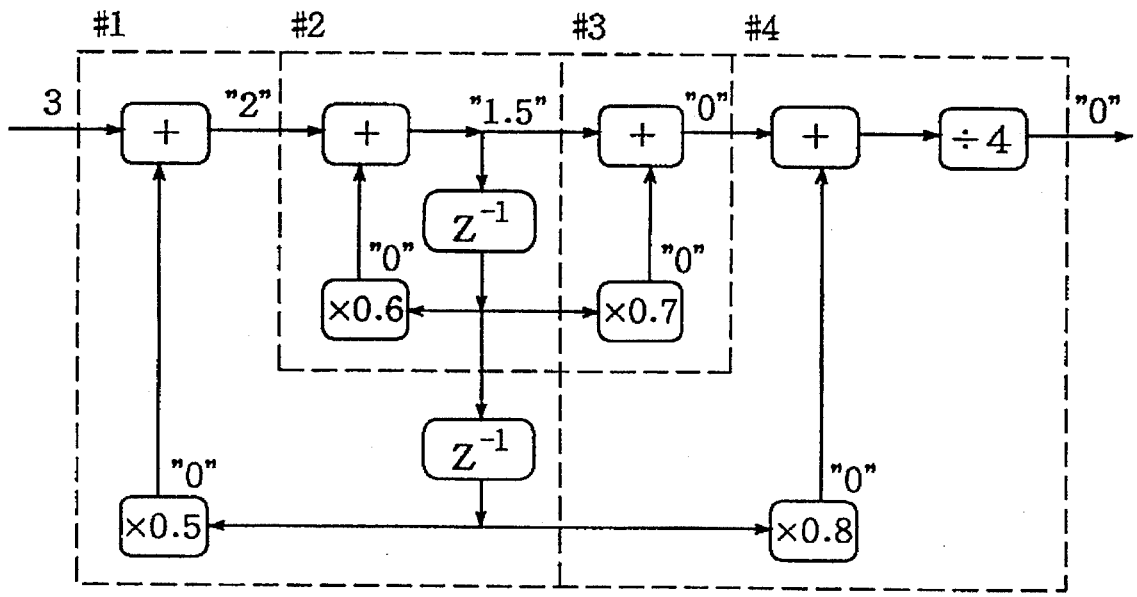
FIGS. 35A to 35C illustrate data stored in the registers in the third execution cycle for the IIR filter processing with a plurality of computing elements and corresponding data distribution in the digital filter.

FIGS. 35A to 35C illustrate data arrangement in the data registers and data states in the digital filter upon completion of a third execution cycle. FIG. 35A shows data arrangement in the data registers upon completion of add/shift arithmetic operations, and FIG. 35B illustrates data arrangement in the data registers upon completion of multiplications. In the state shown in FIG. 35A, input data "3" is newly written in the B register of the first row. Add/shift arithmetic operations are carried out on the data of the B and X registers, so that output data is outputted.

Referring to FIG. 35B, multiplications are carried out on the data stored in the A1 and C registers, so that the results of the multiplications are stored in the X registers.

Figures 36A, 36B, 36C:
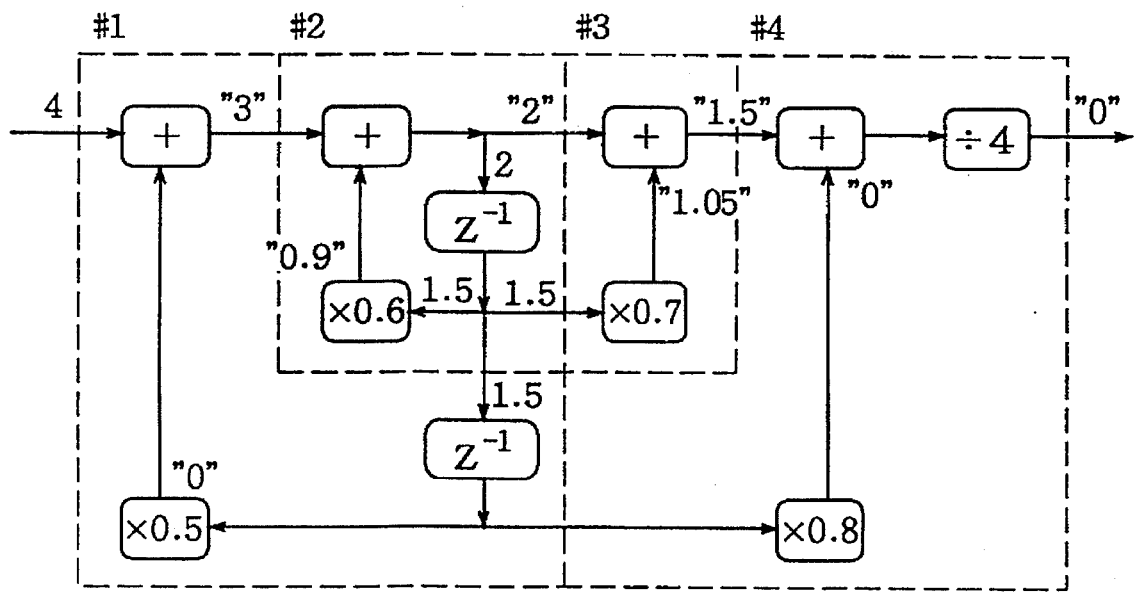
FIGS. 36A to 36C illustrate data stored in the registers in the third execution cycle for the IIR filter processing with a plurality of computing elements and corresponding data distribution in the digital filter.

Due to the aforementioned operations, output data "0" is obtained as shown in FIG. 35C, while inputs of the adders in the blocks #1 to #4 enter definite states. Then, data "4" is written in the B register of the first row as shown in FIG. 36A, and the contents of the B registers of the respective rows are shifted to respective next higher rows, and data "0" is outputted. Also in FIG. 36A, add/shift arithmetic operations are carried out on the data of the B and X registers, while the data are copied from the A2 registers to the A1 registers. The add/shift arithmetic operations are carried out after completion of the copy operations. After completion of the state shown in FIG. 36A, multiplications are carried out on the contents of the A1 and C registers shown in FIG. 36B. The results of the multiplications are stored in the respective X registers. FIG. 36C illustrates data distribution in the digital filter in the state shown in FIGS. 36A and 36B. The operations are thereafter repeated.

When the above multiplications are carried out in parallel with each other, the data are parallelly read from and written in the respective registers. In this case, data are read after completion of writing of preceding data in the respective registers. Thus, reading of the data is not executed unless writing of valid data is completed.

Figure 37:
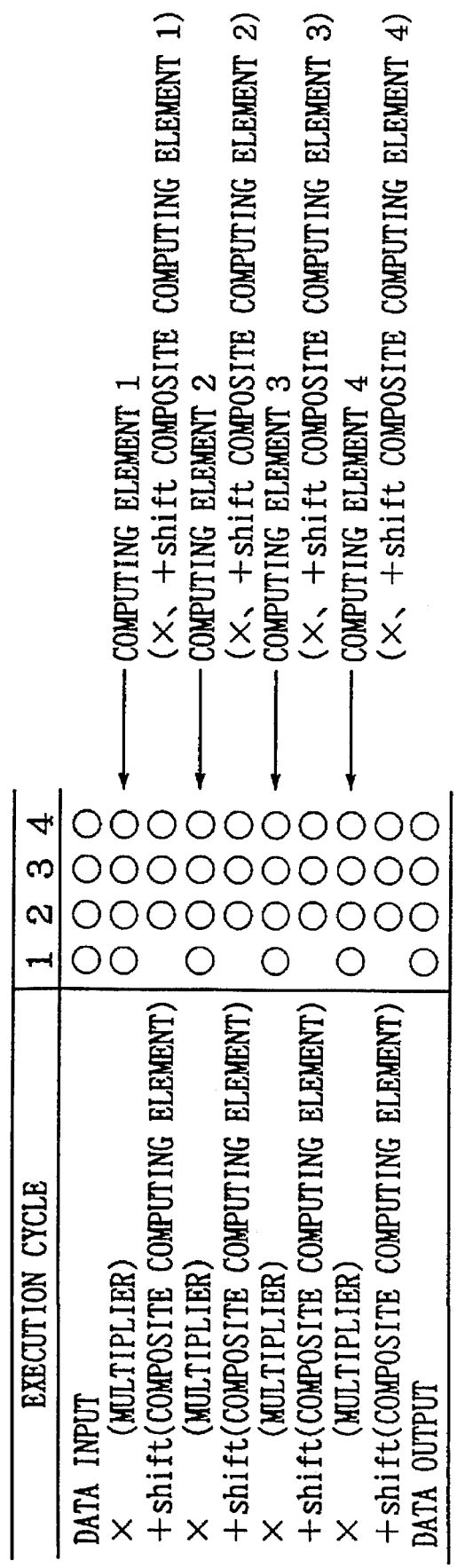
FIG. 37 illustrates operating states of the computing elements in the respective execution cycles for the IIR filter processing with a plurality of computing elements.

FIG. 37 illustrates operating states of the respective ones of the quaternary computing elements, i.e., four multipliers and four add/shift composite computing elements. Referring to FIG. 37, X represents multiplications and "+shift" represents add/shift arithmetic operations, while circles denote operating states of the computing elements and blanks denote nonoperating states, i.e., data input wait states. It is clearly understood from FIG. 37 that all computing elements are in operating states in the execution cycles 2 to 4, so that the filter processing is carried out at a high speed.

[Program Embodiment of FIR Filter]

A fourth order FIR filter is now considered as to an example of a typical FIR filter structure.

Figure 38:
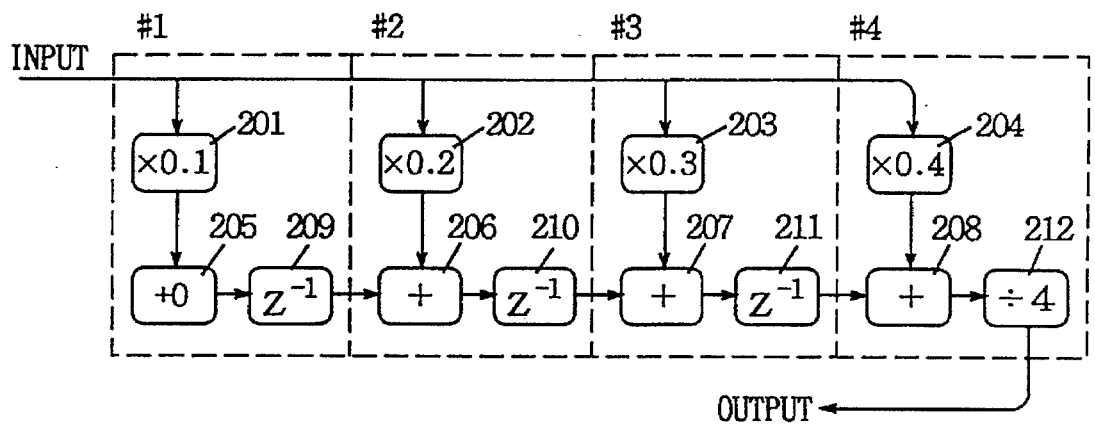
FIG. 38 illustrates a structure of a fourth order FIR filter and a procedure of decomposition to fir instructions.

FIG. 38 illustrates a structure of a fourth order FIR digital filter. The fourth order FIR digital filter shown in FIG. 38 is also called a reverse transversal filter. Referring to FIG. 38, the FIR filter includes multipliers 201, 202, 203 and 204 which multiply input data by prescribed multiplication factors, adders 205, 206, 207 and 208, delay elements 209, 210 and 211, and a divider 212. The multipliers 201 to 204 are arranged in parallel with each other, while the adders 205 to 208 and the delay elements 209 to 211 are alternately arranged.

The adder 205 adds an output of the multiplier 201 to data 0. The delay element 209 delays an output of the adder 205 by a prescribed period (one sampling period). The adder 206 adds an output of the multiplier 202 to an output of the delay element 209. The delay element 210 delays an output of the adder 206 by a prescribed period (one sampling period). The adder 207 adds an output of the delay element 210 to an output of the multiplier 203. The delay element 211 delays an Output of the adder 207 by a prescribed period. The adder 208 adds an output of the multiplier 204 to that of the delay element 211. The divider 212 divides an output of the adder 208 by a factor 4 and generates output data.

In the FIR filter shown in FIG. 38, a plurality of the same structures are cascade-connected with each other. This FIR filter is divided into blocks in accordance with an fir instruction. The fir instruction, which is a four-input two-output instruction, includes multiply, add, shift and delay operations in its internal structure. Therefore, the FIR filter shown in FIG. 38 is divided into units of blocks each including one multiplier, one adder and one delay element. The FIR filter is divided into blocks #1 to #4, each of which is expressed by an fir instruction.

Figure 39:
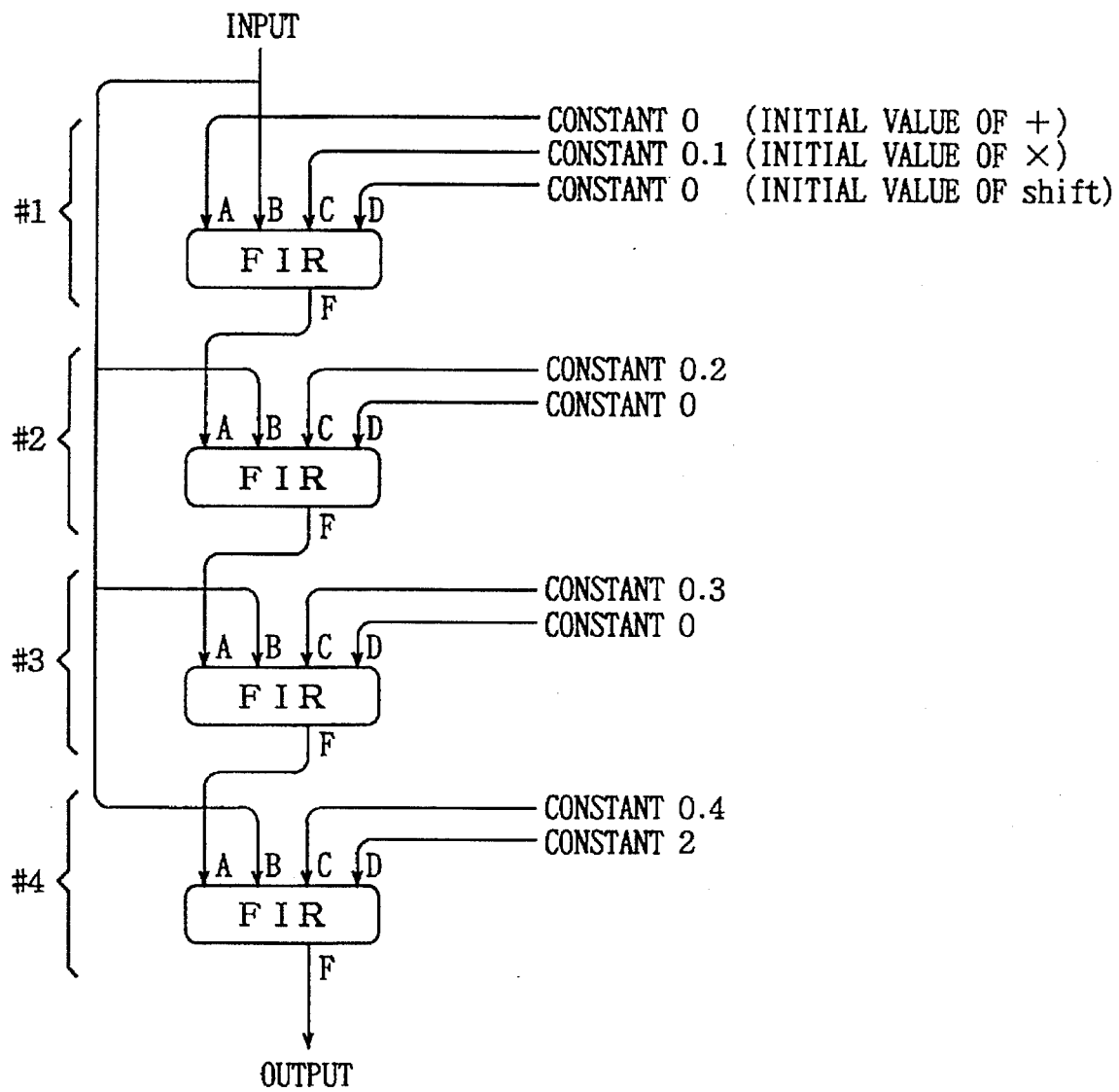
FIG. 39 illustrates a flow graph of the fourth order FIR filter, shown in FIG. 38, described in fir instructions.

FIG. 39 illustrates a flow graph of the digital filter described by fir instructions. Referring to FIG. 39, a first fir instruction #1 receives a constant 0, input data, a constant 0.1 and a constant 0 in its A, B, C and D inputs respectively. A second fir instruction #2 receives an F output of the first fir instruction #1, input data, a constant 0.2 and a constant 0 in its A, B, C and D inputs respectively. A third fir instruction #3 receives an F output of the second fir instruction #1, input data, a constant 0.3 and a constant 0 in its A, B, C and D inputs respectively. A fourth fir instruction #4 receives an F output of the third fir instruction #3, input data, a constant 0.4 and a constant 2 in its A, B, C and D inputs respectively. An F output of the fourth fir instruction #4 outputs the processed output data.

FIG. 40 illustrates programs describing the flow graph shown in FIG. 39 in a text format. The programs are now described with reference to FIG. 40.

Referring to FIG. 40, numerals on the left end denote row numbers in one-to-one correspondence to rows of entries in the register file. On the other hand, numbers on the right end denote program numbers.

Program 1:

In the program 1, "initial" indicates declaration of an initial value. "2(A)=0" indicates that data stored in the A register of the second row is initialized at "0". Namely, this indicates that the A input of the second fir instruction #2, i.e., an input initial value of the adder, is "0". Similarly, "3(A) =4(A)=0" indicates that the A inputs of the third and fourth fir instructions #3 and #4, i.e., input values of the adders thereof are initialized at "0".

Program 2:

In the program 2, "input" indicates data input from an exterior. "1(B), 2(B), 3(B), 4(B)" indicates that the input data are supplied to the B inputs of the first to fourth fir instructions #1 to #4. In other words, this indicates that external input data are stored in the B registers of the first to fourth rows in the register file.

Program 3:

In the program 3, "fir" indicates fir instructions. "Fir(0, , 0. 1.0" indicates constants in the fir instructions. The values in the parenthesis indicate input constants, i.e., respective constants in A, B, C and D inputs in fir(A, B, C, D). In the fir instructions of the program 3, the constant value of the A input is 0 and the B input is supplied not with a constant value but with a variable, while a constant value of the C input is set at 0.5 and that of the D input is set at 0. The constants are not changed in the register file. Reading is executable on these constant a plurality of times. The B input is supplied with input data, and the rule of single substitution/single readout is applied to the B register storing this data.

"Absorb!2(A)" denotes destinations of E and F outputs. In this case, "absorb!2(A)" indicates that the E output is transferred to no instruction while the F output is supplied to the A input of the second fir instruction, i.e., the A register of the second row in the register file. "!" distinguishes the E and F outputs from each other.

Programs 4 and 5:

Constants of fir instructions are defined in the same manner as the program 3, with the same destinations. Namely, the F output of the second fir instruction is supplied to the A input of the third fir instruction, while the F output of the third fir instruction is supplied to the A input of the fourth fir instruction.

Program 6

Constants of the fir instructions are identical to the above. "Output" in the F output indicates that the F output of the fourth fir instruction is outputted to the exterior of the unit and used as output data.

[Specific Operation of FIR Filter Processing]

The following rules are applied also to FIR filter processing:

[Basic Rules]
(1) The A register of the entry of the first row stores a constant. The A registers of the second to fourth rows have initial values, which are updated by newly supplied data. The C and D registers of the first to fourth rows store constants, which are not updated.
(2) As to data other than the constants, the rule of single writing/single readout, i.e., single substitution/single readout, is applied to all registers.
(3) A plurality of arbitrary destination registers can be specified by destination information stored in the E and F registers (programmable). In this FIR filter processing, data stored in the B registers are transferred to destinations specified by the destination information of the E registers, while the same are not outputted due to "absorb". Results of shift operations are transferred to registers specified by the destination information stored in the F registers.
(4) There are a single computing element which carries out a multiplication, and a single computing element which includes an add/shift computing element.

[Calculation Rules]

The calculation rules are similar to those for iir instructions, as follows:
(1) Arithmetic operations are successively carried out from that having required data completely collected, regardless of the row numbers.
(2) The arithmetic operations are carried out with priority of addition/shifting and then multiplication.
(3) When data for the same arithmetic operation are simultaneously completely collected, the arithmetic operations are carried out in reverse order of the row numbers. In other words, an arithmetic operation for an operation having a larger row number is carried out in advance.
(4) An arithmetic operation having a plurality of destinations is not carried out unless all destinations are empty.
(5) No later arithmetic operation takes precedence over a former arithmetic operation (no passing-over is caused in the order of arithmetic operations).

Concrete operations are now described.

(0) Initialization

Figure 41A:
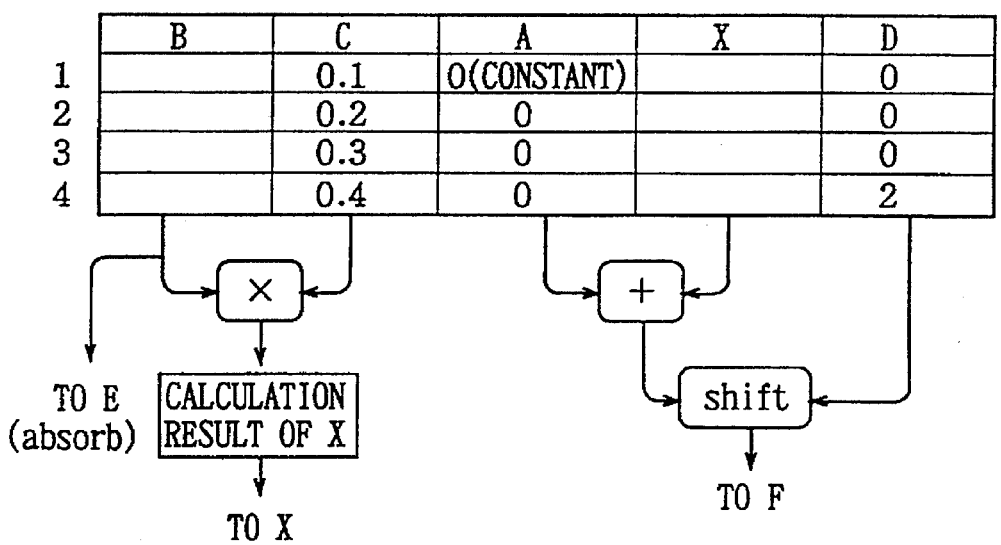
FIGS. 41A and 41B illustrate connection between data stored in respective registers in an initial state for implementation of FIR filter processing and computing elements, and corresponding data distribution in the digital filter.
Figure 41B:
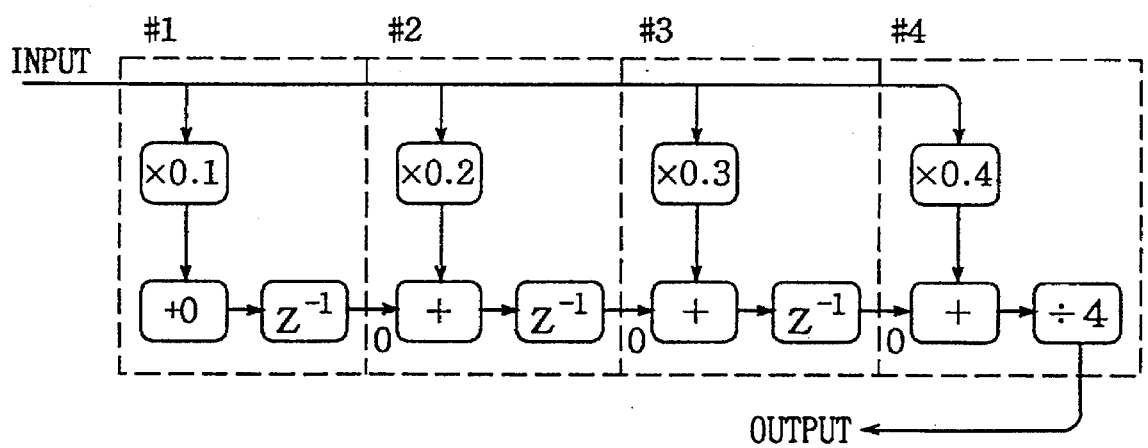

FIGS. 41A and 41B illustrate initial states of the registers in the register file, relation between the registers and the computing elements, and data arrangement in the FIR digital filter.

Referring to FIG. 41A, the C registers of the first to fourth rows store multiplication factors as constant data while the D registers of the first to fourth rows store data for indicating shift bit numbers in shift operations as constant data in initial states.

In the FIR filter processing, data stored in the B and C registers are supplied to the multipliers, to be subjected to multiplications. The data in the A and X registers are subjected to additions and then to shift operations. The results of the multiplications are stored in the X registers. The results of the add/shift arithmetic operations are written in registers which are specified by the destination information stored in the F registers.

As shown in FIG. 41B, multiplication factors (filter factors) in the multipliers are set and a division factor of the divider in the block #4 is initialized in the initial states. Since the division is carried out with a factor 4, the data are shifted to a lower bit direction by two bits through a shift operation.

The data stored in the A registers are data supplied to one single input of the adder. One input of the adder in the block #1 is fixed at a constant "0".

(1) Execution Cycle 1

FIGS. 42A and 42B illustrate data arrangement in the respective registers and data distribution in the digital filter in an execution cycle 1. In this execution cycle (execution state 1), input data "1" is supplied from the exterior and stored in the B registers of the first to fourth rows (FIG. 42A). In this state, the inputs of the multipliers are ascertained as shown in FIG. 42B.

(2) Execution Cycle 2

FIGS. 43A and 43B illustrate data arrangement in the registers of the register file (execution state 2) and current data distribution in the register file in an execution cycle 2.

In the execution cycle 2, a multiplication is first carried out on the data stored in the B and C registers of the fourth row, along the calculation rule that data required for a multiplication are completely collected and the multiplication is carried out on the row having the largest number. The result of this multiplication is stored in the X register of the fourth row, as shown in FIG. 43B. Namely, the output of the multiplier is ascertained in the block #4, as shown in FIG. 43B.

(3) Execution Cycle 3

Figures 44A, 44B:
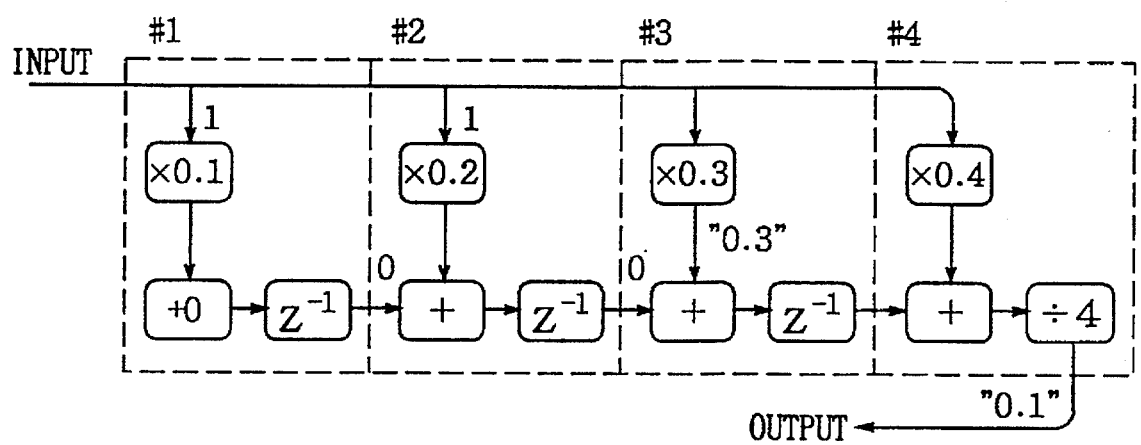
FIGS. 44A and 44B illustrate data stored in the registers in a third execution cycle for the FIR filter processing and corresponding data distribution in the digital filter.

FIGS. 44A and 44B illustrate data arrangement in the registers and data distribution in the digital filter in an execution cycle 3 (execution state 3). In the execution cycle 3, the data are first completely collected in the A and X registers in the entry of the fourth row, whereby an add/shift arithmetic operation is carried out on these data, thereby generating output data. In parallel with this add/shift arithmetic operation, a multiplication is carried out on the data stored in the B and C registers of the third row, so that the result of this multiplication is stored in the X register of the third row (FIG. 44A). As shown in FIG. 44B, an addition and a division are carried out in the block #4, to generate output data "0.1". In parallel with this, a multiplication is carried out in the block #3, so that the result "0.3" of this multiplication is stored in the X register.

(4) Execution Cycle 4

FIGS. 45A and 45B illustrate data storage states of the register file and data distribution in the digital filter in an execution cycle 4 (execution state 4). As shown in FIG. 45A, a multiplication is carried out on the data stored in the B and C registers of the second row, so that the result of the multiplication is stored in the X register of the second row. In parallel with this multiply operation, an add/shift arithmetic operation is carried out on the data of the A and X registers of the third row, so that the result of this arithmetic operation is stored in the A register of the fourth row.

Namely, an addition and a delay operation in the block #3 are carried out as shown in FIG. 45B.

In the case of an iir instruction, delay operations are implemented by data transfer between registers. In this fir instruction, on the other hand, delay operations are equivalently expressed since an addition and a shift operation of a preceding stage are executed within a delay by one cycle.

Similarly, a multiplication is carried out in the block #2, so that an output of its multiplier is ascertained.

(5) Execution Cycle 5

FIGS. 46A and 46B illustrate data stored in the registers of the register file and data distribution in the digital filter upon completion of an execution cycle 5 (execution state 5).

As shown in FIG. 46A, a multiplication is first carried out on data stored in the B, A and C registers of the first row, so that the result of this multiplication is stored in the X register of the first row. In parallel with this multiplication, an add/shift arithmetic operation is carried out on the data stored in the A and X registers of the second row, so that the result of this arithmetic operation is stored in the A register of the third row.

In parallel with the multiplication and the add/shift arithmetic operation, new input data "2" are stored in the B registers of the first to fourth rows.

Namely, the output of the multiplier in the block #1, that of the delay element in the block #2, and the inputs of the multipliers in the blocks #1 to #4 are ascertained, as shown in FIG. 46B.

(6) Execution Cycle 6

Figures 47A, 47B:
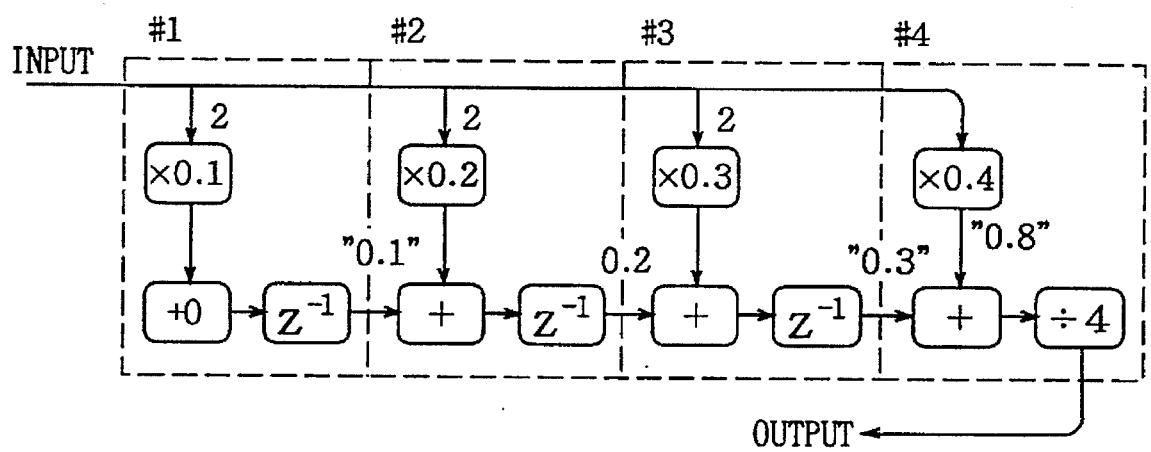
FIGS. 47A and 47B illustrate data stored in the registers in a sixth execution cycle for the FIR filter processing and corresponding data distribution in the digital filter.

FIGS. 47A and 47B illustrate data stored in the registers and data distribution in the digital filter in an execution cycle 6 (execution state 6). As shown in FIG. 47A, a multiplication is carried out on the data stored in the B and C registers of the fourth row, so that the result of this multiplication is stored in the X register of the fourth row. In parallel with this multiply operation, an add/shift arithmetic operation is carried out on the data stored in the A and X registers of the first row, so that the result of this arithmetic operation is stored in the A register of the second row.

Namely, the output of the delay element in the block #1 is newly ascertained, while the output of the multiplier is ascertained in the block #4, as shown in FIG. 47B.

(7) Execution Cycle 7

Figures 48A, 48B:
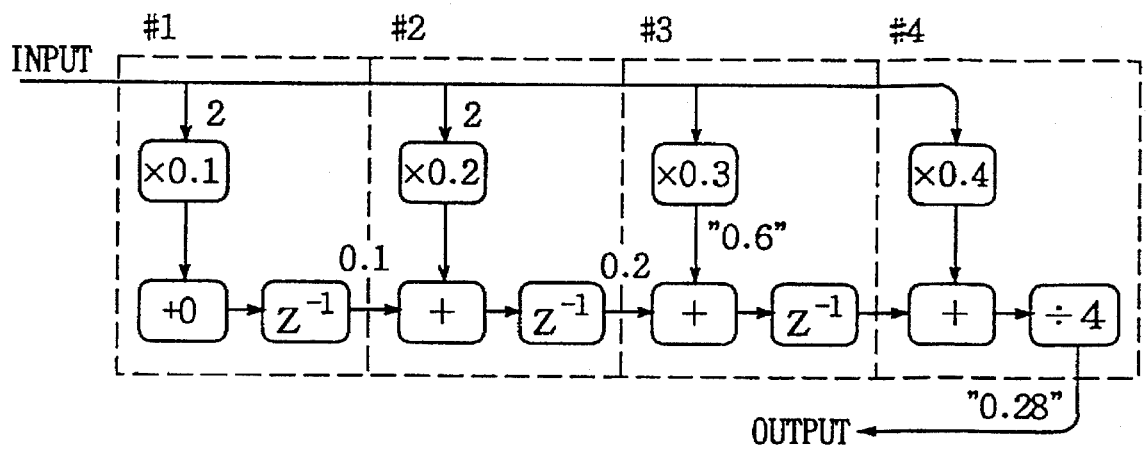
FIGS. 48A and 48B illustrate data stored in the registers in a seventh execution cycle for the FIR filter processing and corresponding data distribution in the digital filter.

FIGS. 48A and 48B illustrate data stored in the registers and data distribution in the digital filter in an execution cycle 7. As shown in FIG. 48A, an add/shift arithmetic operation is carried out on the data stored in the A and X registers of the fourth row, so that the result of this arithmetic operation is outputted as output data.

In parallel with this add/shift arithmetic operation, a multiplication is carried out on the data stored in the B and C registers of the third row, so that the result of this multiplication is stored in the X register of the third row.

Namely, the output of the multiplier is ascertained in the block #3, while an addition and a division are carried out in the block #4 to generate output data, as shown in FIG. 48B.

(8) Execution Cycle 8

FIGS. 49A and 49B illustrate data stored in the registers of the register file and data distribution in the digital filter in an execution cycle 8 (execution state 8).

As shown in FIG. 49A, an add/shift arithmetic operation is carried out on the data stored in the A and X registers of the third row, so that the result of this arithmetic operation is stored in the A register of the fourth row. In parallel with this add/shift arithmetic operation, a multiplication is carried out on the data stored in the B and C registers of the second row, so that the result of this multiplication is stored in the X register of the second row.

Namely, the output data of the multiplier is ascertained in the block #2 and that of the delay element is ascertained in the block #3, as shown in FIG. 49B.

(9) Execution Cycle 9

FIGS. 50A and 50B illustrate data stored in the registers and data distribution in the digital filter in an execution cycle 9 (execution state 9). As shown in FIG. 50A, a multiplication is carried out on the data stored in the B and C registers of the first row, so that the result of this multiplication is stored in the X register of the first row. An add/shift arithmetic operation is carried out on the data stored in the A and X registers of the second row, so that the result of this arithmetic operation is stored in the A register of the third row. In parallel with these arithmetic operations, next input data are stored in the B registers of the first to fourth rows.

Namely, the data in the multiplier of the block #1 and the output data of the delay element in the block #2 are ascertained while inputs of the multipliers in the blocks #1 to #4 enter definite states, as shown in FIG. 50B.

(10) Execution Cycle 10

Figures 51A, 51B:
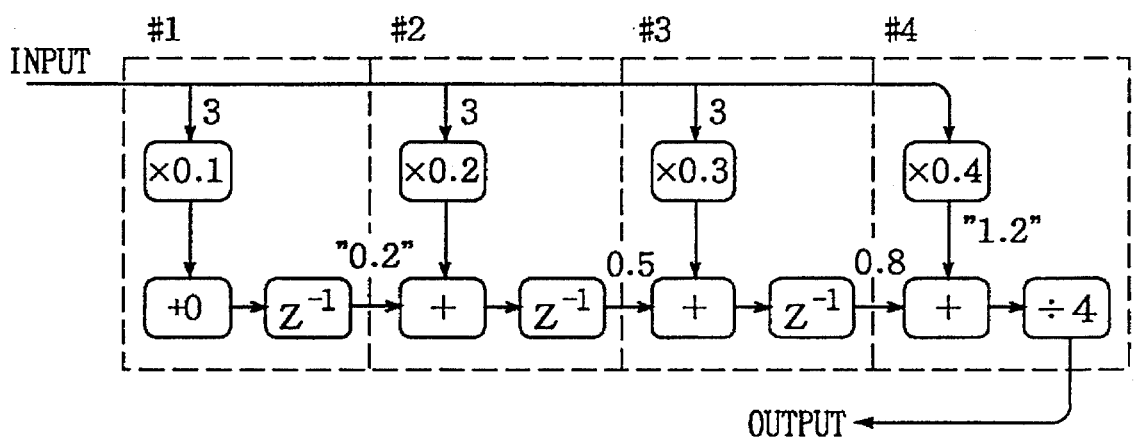
FIGS. 51A and 51B illustrate data stored in the registers in a tenth execution cycle for the FIR filter processing and corresponding data distribution in the digital filter.

FIGS. 51A and 51B illustrate data stored in the registers and data distribution in the digital filter in an execution cycle 10 (execution state 10). As shown in FIG. 51A, a multiplication is first carried out on the data stored in the B and C registers of the fourth row, so that the result of this multiplication is stored in the X register of the fourth row.

Further, an add/shift arithmetic operation is carried out on the data stored in the A and X registers of the first row, so that the result of this arithmetic operation is stored in the A register of the second row.

Namely, the output data of the delay element in the block #1 enters a definite state, while the output data of the multiplier in the block #4 also enters a definite state, as shown in FIG. 51B.

(11) Execution Cycle 11

Figures 52A, 52B:
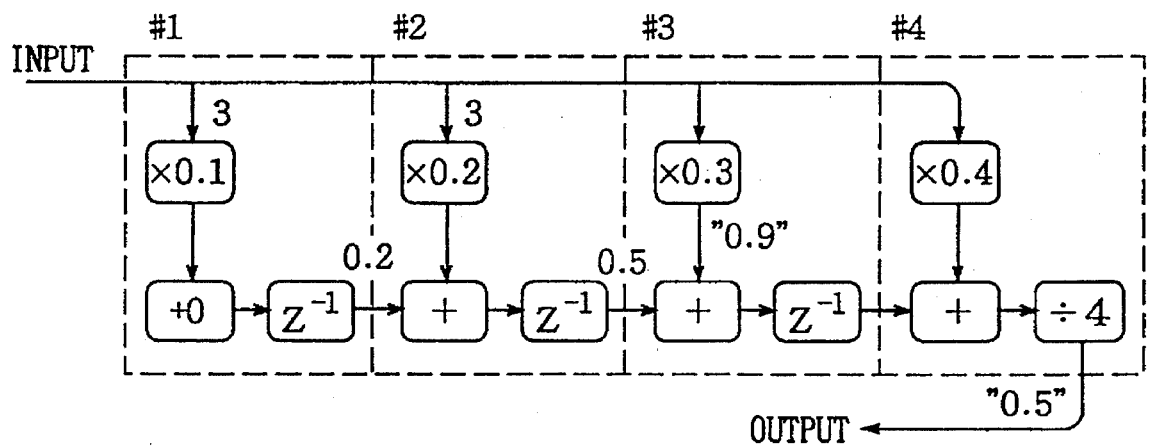
FIGS. 52A and 52B illustrate data stored in the registers in an eleventh execution cycle for the FIR filter processing and corresponding data distribution in the digital filter.

FIGS. 52A and 52B illustrate data stored in the registers and data distribution in the digital filter in an execution cycle 11 (execution state 11). As shown in FIG. 52A, an add/shift arithmetic operation is first carried out on the data stored in the A and X registers of the fourth row, so that the result of this arithmetic operation is outputted as output data. In parallel with this add/shift arithmetic operation, a multiplication is carried out on the data stored in the B and C registers of the third row, so that the result of this multiplication is stored in the X register of the third row.

Namely, the output data of the multiplier in the block #3 is ascertained while the block #4 outputs output data.

(12) Execution Cycle 12

FIGS. 53A and 53B illustrate data stored in the registers and data distribution in the digital filter in an execution cycle 12 (execution state 12). As shown in FIG. 53A, a multiplication is first carried out on the data stored in the B and C registers of the second row, so that the result of this multiplication is stored in the X register of the second row. In parallel with this multiply operation, an add/shift arithmetic operation is carried out on the data of the A and X registers of the third row, so that the result of this arithmetic operation is stored in the A register of the fourth row.

Namely, the output of the multiplier in the block #2 is ascertained while the output of the delay element in the block #3 enters a definite state, as shown in FIG. 53B.

(13) Execution Cycle 13

FIGS. 54A and 54B illustrate data stored in the registers and data distribution in the digital filter in an execution cycle 13 (execution state 13). Referring to FIG. 54A, a multiplication is carried out on the data stored in the B and C registers of the first row, so that the result of this multiplication is stored in the X register of the first row. In parallel with this multiplication, an add/shift arithmetic operation is carried out on the data stored in the A and X registers of the second row, so that the result of this arithmetic operation is stored in the A register of the third row. In parallel with these arithmetic operations, new input data are stored in the B inputs of the first to fourth rows.

Namely, the inputs of the multipliers in the blocks #1 to #4 enter definite states, while the output of the multiplier in the block #1 is ascertained and that of the delay element in the block #2 enters a definite state, as shown in FIG. 54B.

(14) Execution Cycle 14

Figures 55A, 55B:
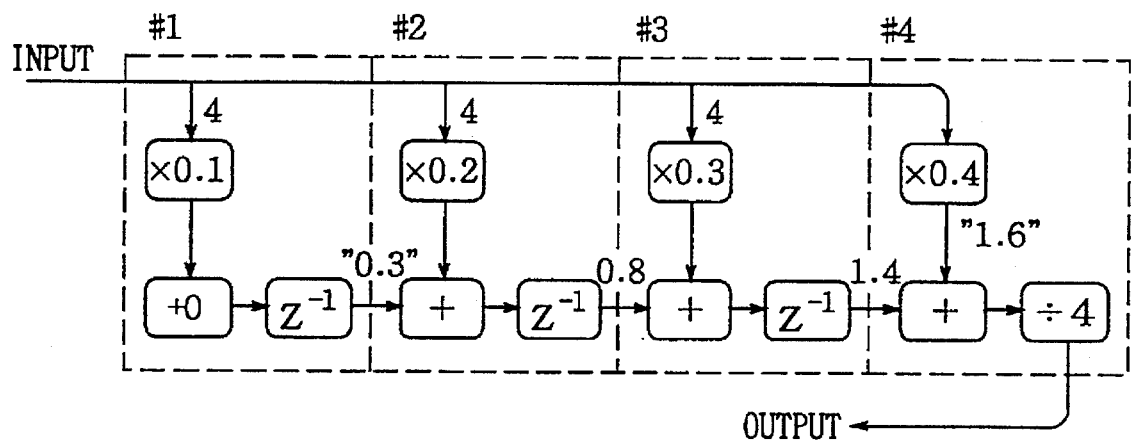
FIGS. 55A and 55B illustrate data stored in the registers in a fourteenth execution cycle for the FIR filter processing and corresponding data distribution in the digital filter.

FIGS. 55A and 55B illustrate data stored in the registers and data distribution in the digital filter in an execution cycle 14 (execution state 14). Referring to FIG. 55A, a multiplication is carried out on the data stored in the B and C registers of the fourth row, so that the result of this multiplication is stored in the X register of the fourth row. In parallel with this multiplication, an add/shift arithmetic operation is executed on the data stored in the A and X registers of the first row, so that the result of this arithmetic operation is stored in the A register of the second row.

Namely, the outputs of the delay element in the block #1 and the multiplier in the block #4 enter definite states, as shown in FIG. 55B.

(15) Execution Cycle 15

Figures 56A, 56B, 57:
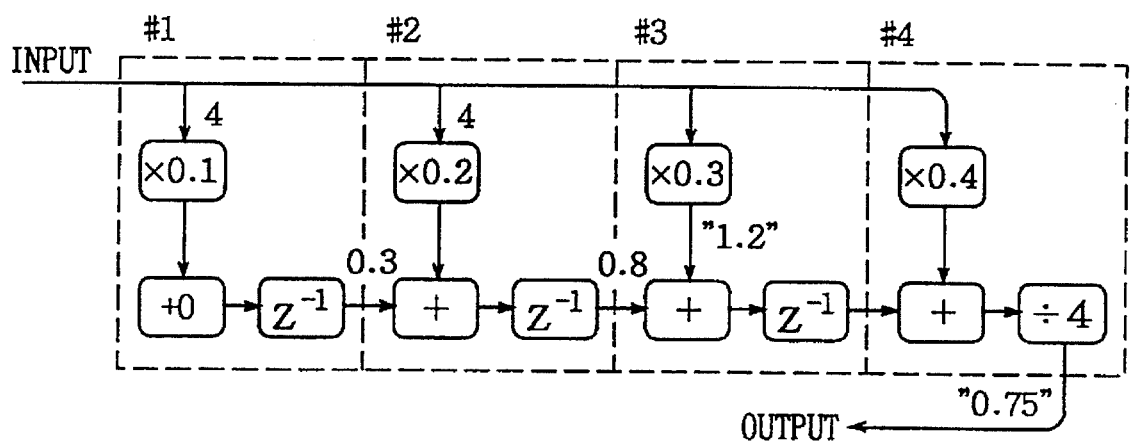
FIGS. 56A and 56B illustrate data stored in the registers in a fifteenth execution cycle for the FIR filter processing and corresponding data distribution in the digital filter.
FIG. 57 illustrates operating states of respective computing elements in the second to sixteenth execution cycles for the FIR filter processing.

FIGS. 56A and 56B illustrate data stored in the registers and data distribution in the digital filter in an execution cycle 15 (execution state 15). Referring to FIG. 56A, an add/shift arithmetic operation is first carried out on the data stored in the A and X registers of the fourth row, so that the result of this arithmetic operation is outputted as output data. In parallel with this add/shift arithmetic operation, a multiplication is carried out on the data stored in the B and C registers of the third row, so that the result of this multiplication is stored in the X register of the third row.

Namely, the block #4 generates output data and outputs the same while the output of the multiplier enters a definite state in the block #3, as shown in FIG. 56B.

In the structure employing a single multiplier and a single add/shift computing element as described above, a multiplication is first carried out on data in an entry having a large row number, and then an add/shift arithmetic operation is carried out. As to such arithmetic operations, add/shift arithmetic operations are carried out in parallel with multiplications successively until all data stored in the B registers are consumed. Thus, the FIR filter processing Can be carried out at a high speed. The functions of the delay elements are equivalently implemented by waiting since the addition is not executed until one input (X registers) of add operation receive a definite data.

FIG. 57 illustrates operating states of the respective computing elements in the aforementioned cycles 2 to 16. Referring to FIG. 57, circles denote operating states, while blanks denote data wait states. As shown in FIG. 57, all multipliers (X) and add/shift composite computing elements (+shift) are in operating states in the cycles 4 to 16, so that the computing elements are in 100% full operating states in stable periods except initial operations, to carry out the filter processing at a high speed with no overhead in execution of operations.

The aforementioned description has been made with respect to a single multiplier and a single add/shift computing element. Alternatively, it is possible to execute filter processing with quaternary multipliers and quaternary add/shift computing elements. A structure for such filter processing is now described.

(0) Initial State

FIG. 58 illustrates initial states of the registers in employment of quaternary multipliers and quaternary add/shift computing elements. In the initial states, input data are stored in the B registers of the first to fourth rows. At this time, multiplication factors and shift factors are initialized at the C and D registers as constant data. Further, initial values are set in the A registers.

(1) Execution Cycle 1

FIGS. 59A and 59B illustrate data stored in the registers and data distribution in the digital filter in an execution cycle 1. In the execution cycle 1 (execution state 1), no add/shift arithmetic operations are carried out (data are not completely collected) but only multiplications are carried out. Namely, multiplications are carried out on the data stored in the B and C registers of the first to fourth rows, so that the results of the multiplications are stored in the corresponding X registers, as shown in FIG. 59A.

As shown in FIG. 59B, the multiplications are carried out in parallel with each other in the blocks #1 to #4, so that output data of the respective multipliers enter definite states.

(2) Execution Cycle 2

Figure 60A:
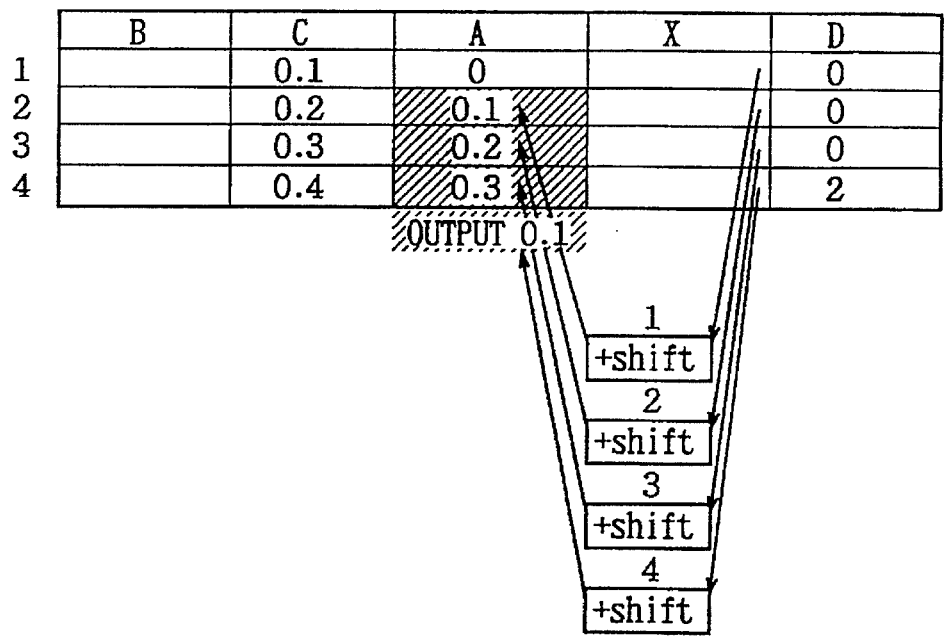
FIGS. 60A and 60B illustrate data stored in the registers in a second execution cycle for the FIR filter processing with a plurality of computing elements and corresponding data distribution in the digital filter.
Figure 60B:
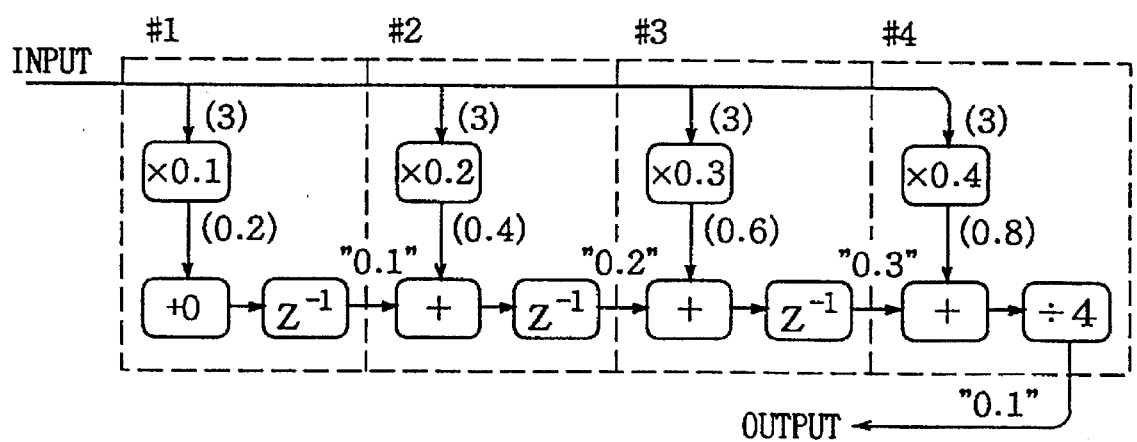

FIGS. 60A and 60B illustrate data stored in the registers and data distribution in the digital filter in an execution cycle 2. Referring to FIG. 60A, add/shift arithmetic operations are carried out on the data stored in the A and X registers of the first to fourth rows. At this time, the results of the arithmetic operations are stored in the A registers of subsequent entries (subsequent rows). The result of the multiplication on the data in the A and C registers of the fourth row is outputted as output data.

Namely, output data of the delay elements enter definite states in the blocks #1 to #4 while the output of the divider enters a definite state in the block #4 to generate output data, as shown in FIG. 60B.

In this cycle 2, no multiplications are carried out since no valid data are stored in the B registers. When a plurality of multipliers and a plurality of add/shift computing elements are employed, a multiplication is carried out followed by an add/shift arithmetic operation, along the rule that processing is carried out from an arithmetic operation having required data completely collected. Such operations are repeatedly carried out on new input data.

In the cycle 2, storage of data in the B registers and multiplications are carried out in parallel with the add/shift arithmetic operations. Namely, when the multiplications are carried out in the cycle 1, then data are inputted in the B registers of the first to fourth rows. In this case, therefore, the multipliers and the add/shift computing elements thereafter enter regularly operating states so that these computing elements will not enter input data waiting states, whereby the filter processing can be carried out at a high speed.

Referring to FIGS. 59B and 60B, data shown with parentheses are those obtained as the results of the operations parallelly carried in the respective cycles.

[Bus Connection]

Connection between the registers and buses (those coupling the registers with the computing elements) is decided by the programs. In the structure employing a plurality of computing elements, i.e., a plurality of multipliers and a plurality of add/shift computing elements, connection between the registers of the respective rows and the computing elements is uniquely fixed by the programs, due to the parallel operations of the respective rows. In this case, it is not necessary to particularly determine the priority of the rows in the same types of arithmetic operations.

In the structure of employing a single multiplier and a single add/shift composite computing element, however, it is necessary to determine the priority in each row in order to carry out a single arithmetic operation (a multiplication or an add/shift arithmetic operation). Description is now made on a structure for determining the priority and reading required data when the data are completely collected.

Figure 61:
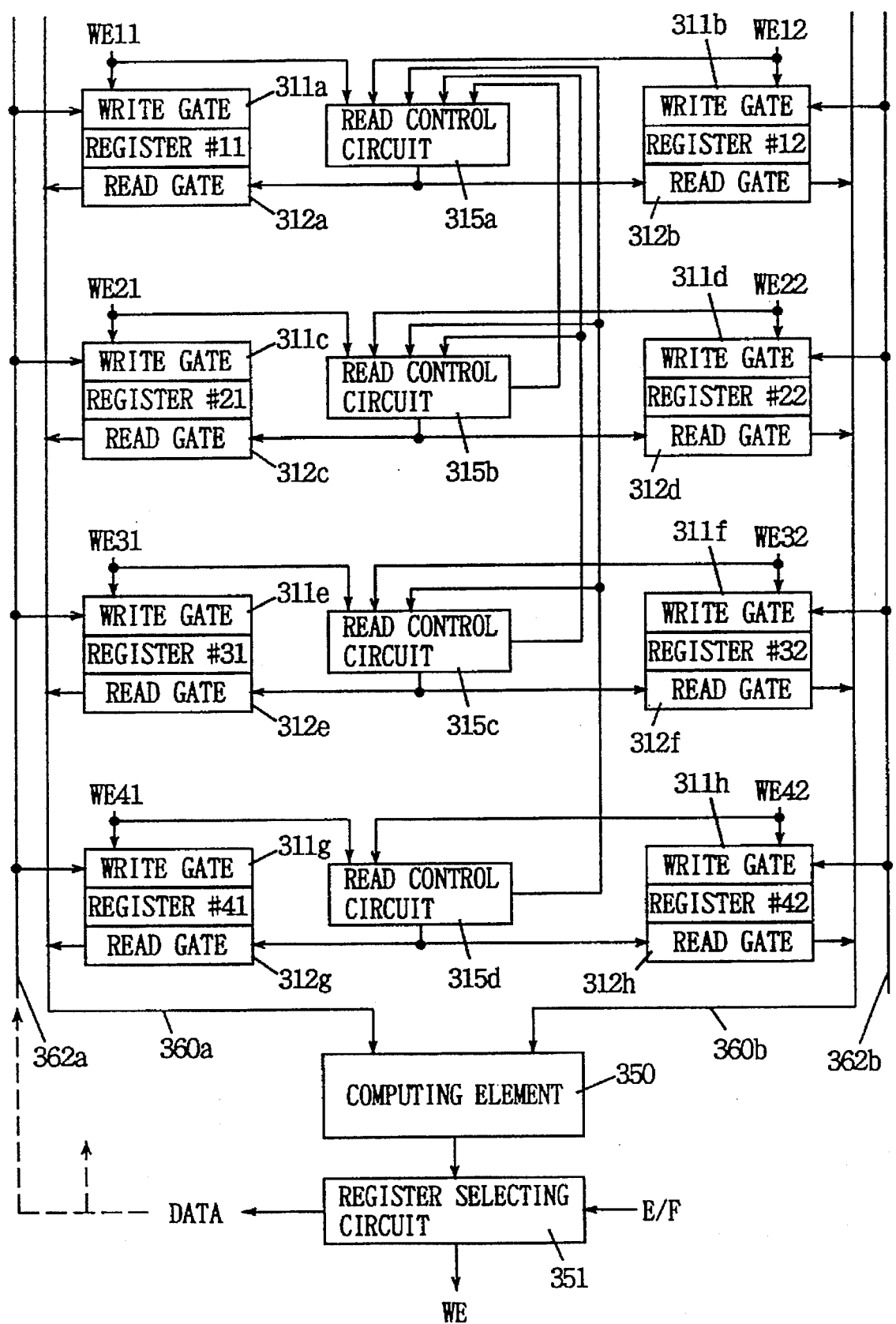
FIG. 61 illustrates an exemplary structure for controlling the reading to the registers provided in the register file.

FIG. 61 shows a structure for carrying out read/write control of the respective registers in the register file. FIG. 61 illustrates the structure of the read/write control part RWC shown in FIG. 2 in more detail.

Two types of registers are typically shown in FIG. 61. The two types of registers store data which are employed for the same arithmetic operations.

In the first row, a write gate 311a and a read gate 312a are provided for a register #11, while a write gate 311b and a read gate 312b are provided for a register #12.

In the second row, a write gate 311c and a read gate 312c are provided for a register #21, while a write gate 311d and a read gate 312d are provided for a register #22.

In the third row, a write gate 311e and a read gate 312e are provided for a register #31, while a write gate 311f and a read gate 312f are provided for a register #32.

In the fourth row, a write gate 311g and a read gate 312g are provided for a register #41, while a write gate 311h and a read gate 312h are provided for a register #42.

The write gates 311a to 311h enter active states in response to write enable signals WE11, WE12, WE21, WE22, WE31, WE32, WE41 and WE42 respectively, to write data on a related write data bus 362a or 362b in the corresponding registers.

Read control circuits 315a to 315d are provided on the respective rows, in order to control reading of the registers.

The read control circuit 315d of the fourth row enters an active state when both of the write enable signals WE41 and WE42 enter active states to write data in the registers #41 and #42, for enabling the corresponding read gates 312g and 312h and connecting the registers #41 and #42 to read data buses 360a and 360b respectively.

The read data buses 360a and 360b are connected to a computing element 350, which is a multiplier or an add/shift composite computing element.

The read control circuit 315c of the third row is activated when both of the write enable signals WE31 and WE32 enter active states and the read control circuit 315d indicates no data reading, to bring the read gates 312e and 312f into active states.

The read control circuit 315b of the second row is activated when both of the write enable signals WE21 and WE22 enter active states and both of the read control circuits 315c and 315d indicate no data reading, to bring the corresponding read gates 312c and 312d into active states.

The read control circuit 315a of the first row enters an active state when the write enable signals WE11 and WE12 enter active states and the read control circuits 315b, 315c and 315d indicate no data reading, to bring the corresponding read gates 312a and 312b into active states.

An output of the computing element 350 is transferred to a desired data bus through a register selecting circuit 351. The data bus to which the Output of the computing element 350 is transferred is decided by a program. The register selecting circuit 351 decodes the content of an E or F register, to generate a write enable signal WE for activating a corresponding write gate while transferring data from the computing element 350 onto a corresponding write data bus. The write data bus onto which the output of the computing element 350 is transferred is decided by the structure of the filter as implemented. When the computing element 350 is a multiplier, its output is outputted to an X register and hence transferred to a write data bus corresponding to the X register. The register selecting circuit 351 may be formed by another structure, to transfer data to a corresponding X register in response to the outputs of the read control circuits 351a to 351d regardless of the E or F register.

In the aforementioned structure, the read control circuits 351a to 351d enable the read gates in response to the write enable signals only when downstream read control circuits (those having larger row numbers) carry out no data reading. Thus, it is possible to regularly carry out data reading along the priority while arithmetic operations can be immediately carried out when data required for the arithmetic operations are completely collected.

Figure 62A:
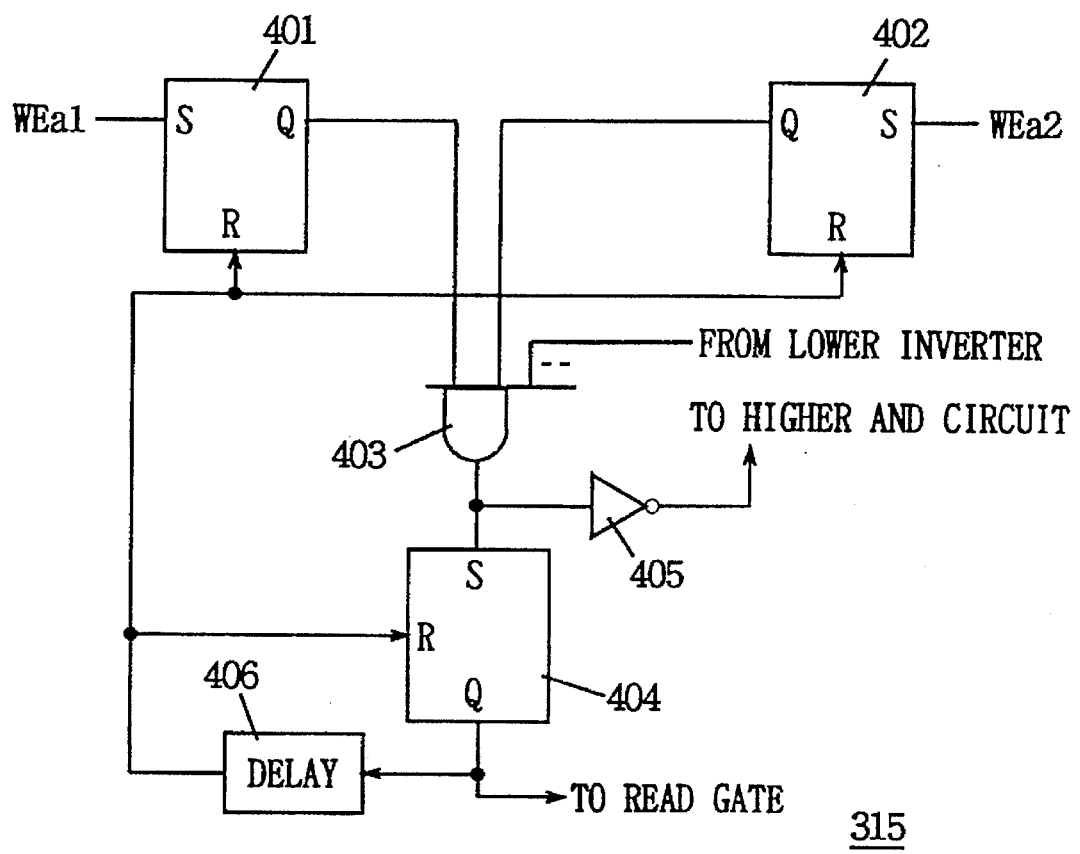
FIGS. 62A and 62B illustrate a structure and operations of a read control circuit shown in FIG. 61.

FIG. 62A illustrates an exemplary structure of each read control circuit 315. Referring to FIG. 62A, the read control circuit 315 includes a set/reset (SR) flip-flop 401 which receives a write enable signal WEa1 in its set input S, another SR flip-flop 402 which receives another write enable signal WEa2 in its set input S, an AND circuit 403 which receives outputs of the SR flip-flops 401 and 402 and an output of an inverter circuit of a lower read control circuit, an inverter circuit 405 which inverts an output of the AND circuit 403 to supply the same to an input of an AND circuit included in a higher read control circuit, still another SR flip-flop 404 which receives the output of the AND circuit 403 in its set input S, and a delay circuit 406 which delays a Q output of the SR flip-flop 404 by a prescribed time.

Figure 62B:
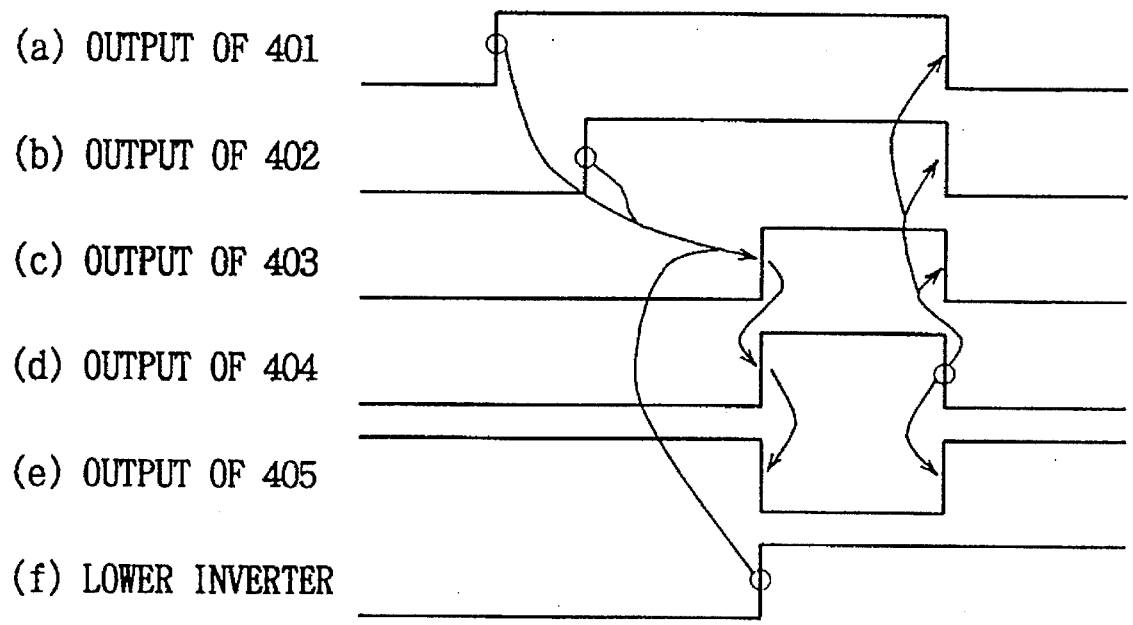

An output of the delay circuit 406 is supplied to reset inputs R of the flip-flops 401, 402 and 404. The Q output of the flip-flop 404 is supplied to the corresponding read gates as the read enable signal. Operations of this read control circuit 315 are now described with reference to a waveform diagram shown in FIG. 62B.

When the output of the lower inverter circuit is at a low level, this means that data are completely collected in lower registers (registers having a larger row number) and arithmetic operations are precedingly carried out on the lower side. Therefore, the output of the AND circuit 403 remains in a low-level state when both of the write enable signals WE1a and WEa2 enter active states so that valid data are written in the corresponding registers and the flip-flops 401 and 402 enter set states.

When the output of the lower inverter circuit rises to a high level, this means that an arithmetic operation may be carried out on the data stored in the registers of this row. At this time, the output of the AND circuit 403 rises to a high level, while the output of the inverter circuit 405 falls to a low level. The output of the inverter circuit 405 is supplied to the input of a higher AND circuit. Thus, arithmetic operations on the higher side are inhibited.

When the output of the AND circuit 403 rises to a high level, the Q output of the flip-flop 404 rises to a high level, so that the corresponding read gates enter enable state and the contents of the registers are transferred to the read data bus. After a lapse of a prescribed time, the flip-flops 401, 402 and 404 are reset by the output of the delay circuit 406, so that the read gates are disabled and the output of the AND circuit 403 falls to a low level, thereby setting the higher read control circuit in a readable state (the output of the inverter circuit 405 goes high). In the structure shown in FIG. 62A, the flip-flop 404 receives a high-level signal in the reset input R to enter a reset state when the same receives a high-level signal of the AND circuit 403 in its set input S. This structure is implemented by setting drivability of a transistor for implementing a reset state as compared with a driving transistor for implementing a set state. In other words, reset ability is made higher than set ability.

When one of the registers stores constant data in this structure, it is necessary to regularly set the Q output of the flip-flop 401 or 402 in a high-level state. This structure is set by a program so that the output of the delay circuit 406 is not transferred to the reset input R of the flip-flop corresponding to the register storing the constant data. In other words, a switching circuit is provided between the delay circuit 406 and the flip-flop 401 or 402, so that conduction/cutoff of this switching circuit is decided by a program indicating whether or not the data is a constant value.

According to the aforementioned structure, it is possible to carry out arithmetic operations when required data are completely collected, without disturbing the priority. As to multiply and add/shift arithmetic operations, the add/shift arithmetic operation takes precedence. In this case, the output of the read control circuit for the register which is employed for the add/shift arithmetic operation may be employed as a signal indicating activation/inactivation of a read control circuit which is provided for the register storing data required for a multiplication circuit (i.e., the output may be supplied to the input of the AND circuit 403).

[Exemplary System Structure]

The aforementioned filter unit carries out arithmetic operations when required data are completely collected in the register file. Such a data processing system is called a "data driven system".

On the other hand, a data driven type processor having parallel processing ability is known as a technique for increasing the throughput in a data processing system. In the data driven type processor, the processing progresses along such a rule that certain processing is carried out when all data required for this processing are completely collected and resources such as computing elements required for the processing are available.

Both of the data driven type processor and the data driven filter unit execute processing along the "data driven system". When these units are combined with each other to construct an information processor, implemented is a data driven information processor which carries out all processing along the "data driven system".

When such a data driven information processor is employed, it is possible to efficiently carry out a complicated program at a high speed, even if the program includes filter processing such as image data processing including Fast Fourier Transform (FFT). The Fast Fourier Transform (FFT) is basically formed by butterfly operations, which include delay and addition as basic operation. Such butterfly operation can be described by fir instructions, whereby Fast Fourier Transform processing can be carried out by combination of fir instructions. Description is now made on a structure obtained by combining a data driven filter with a data driven type processor.

Figure 63:
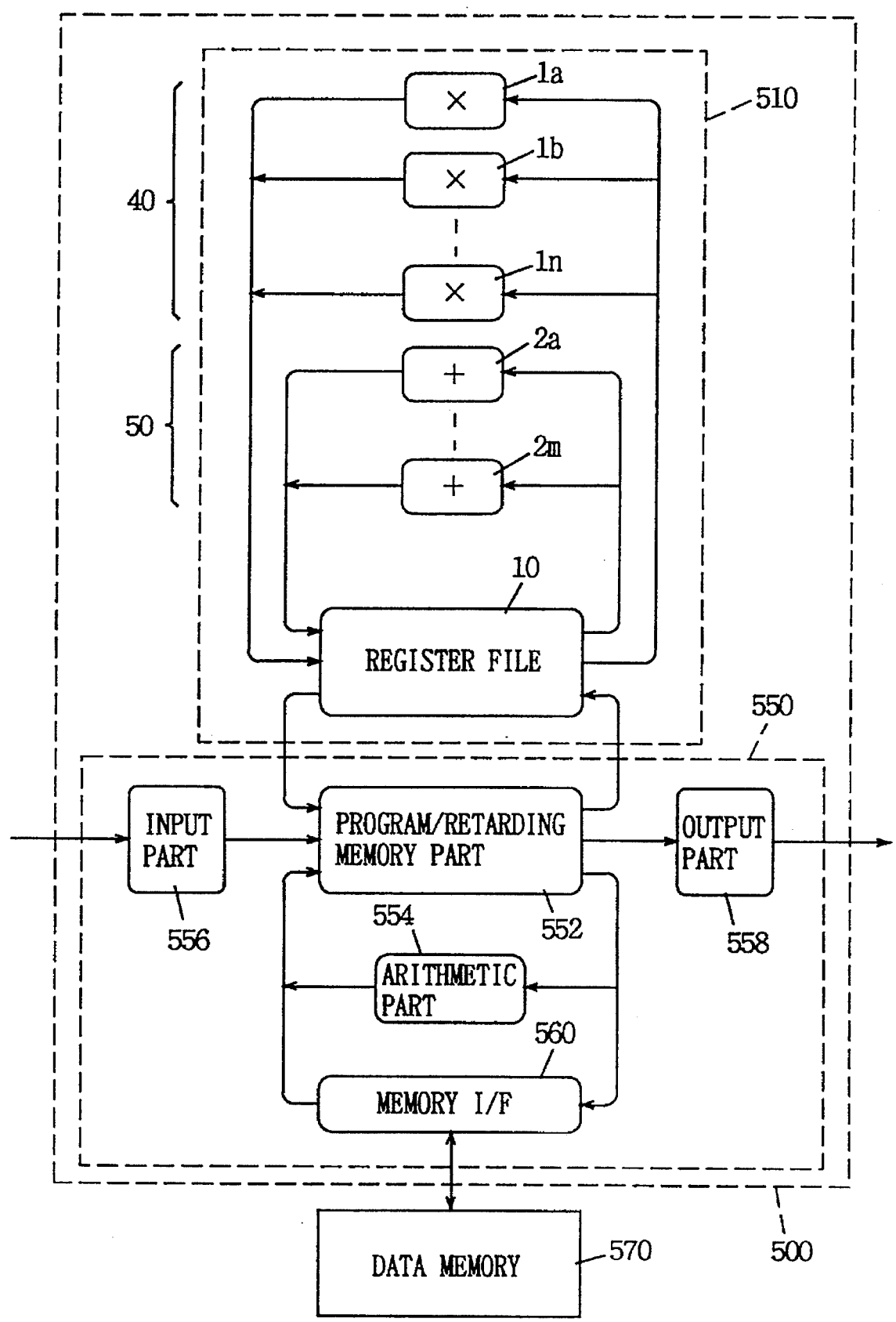
FIG. 63 illustrates a structure of a data driven type information processor according to a second embodiment of the present invention.

FIG. 63 schematically illustrates an overall structure of a data driven type information processor 500 according to a second embodiment of the present invention. Referring to FIG. 63, the data driven type information processor 500 includes a data driven filter unit part 510 and a data driven type processor part 550.

The data driven filter unit part 510 includes a first computing element group 40 including a plurality of multipliers $1a$ to $1n$, a second computing element group 50 including a plurality of add/shift computing elements $2a$ to $2m$, and a register file 10 which transfers data with the first and second computing element groups 40 and 50. This data driven filter unit part 510 shown in FIG. 63 is substantially similar in structure to the filter unit shown in FIG. 1. The register file 10 is similar in structure to that shown in FIG. 2 (this structure is described later again).

The data driven type processor part 550 includes an input part 556 which receives externally supplied data packets and forms internal data packets, a program/retarding memory part 552 including a program memory which stores operations of programs to be executed in correspondence to nodes of the programs and a retarding memory which stores information as to whether or not the input data are in firing states, an arithmetic part 554 which carries out arithmetic operations on firing arithmetic operation data from the program/retarding memory part 552, a memory interface (memory I/F) 560 which accesses a data memory 570 along a memory access request operation from the program/ retarding memory part 552, and an output part 558 which receives data packets outputted from the program/retarding memory part 552 and outputs the same to an exterior of the unit.

In a data driven type processor, data are generally propagated in the form of packets. The packets include operations, node numbers indication of destinations (program nodes) for the input data, and information such as generation numbers for identifying sets of input data for firing detection. When all data required for a certain processing are completely collected, this state is called "firing". As to detection of such firing, a system allowing only a set of input data for certain processing is called a static data driven system, while a system allowing two or more sets of input data is called a dynamic data driven system. The program/retarding memory part 552 has a function of shifting an operation code and destination information (node specifying numbers) required for fetching a next operation, and a function of detecting complete collection of data required for certain processing (firing).

Information for shifting of the operation code and the node numbers is stored in the program memory part, while information required for firing detection is stored in the retarding memory. Data as to which firing is detected in the program/retarding memory part 552 is transferred to the arithmetic part 554, the memory interface 560 or the register file 10 in the filter unit part 510 in response to its destination. On the other hand, data requiring no processing is outputted to the exterior through the output part 558. The operations are now briefly described.

An input data packet which is received in the input part 556 is supplied to the program/retarding memory part 552. In the program/retarding memory part 552, a corresponding instruction is read from the program memory so that executability/non-executability of this instruction is determined by data stored in the retarding memory. When the instruction is executable (firing state), this operation is transferred to the register file 10 of the filter unit part 510 if the same is for execution of filter processing. Otherwise the instruction is transferred to the arithmetic part 554 to carry out an arithmetic/logical operation, supplied to the memory interface part 560 to read/write data in/from the data memory 570, or transmitted to the exterior of the processor 550 through the output part 558.

Upon supply of input data, data to be processed in the data driven filter unit part 510 is filtered in the filter unit part 510 so that only resultant data is again transferred to the program/retarding memory part 552. On the other hand, data to be processed in the processor 550 is transferred along a loop of the program/retarding memory part 552, the arithmetic part 554 and the memory interface 560, so that processing progresses along presence/absence of firing. An instruction to be carried out in the filter unit part 510 is unconditionally brought into a firing state in this program/retarding memory part 552, so that a firing packet is formed and transferred to the register file 10. The structures of the respective parts are now successively described in detail.

Figure 64:
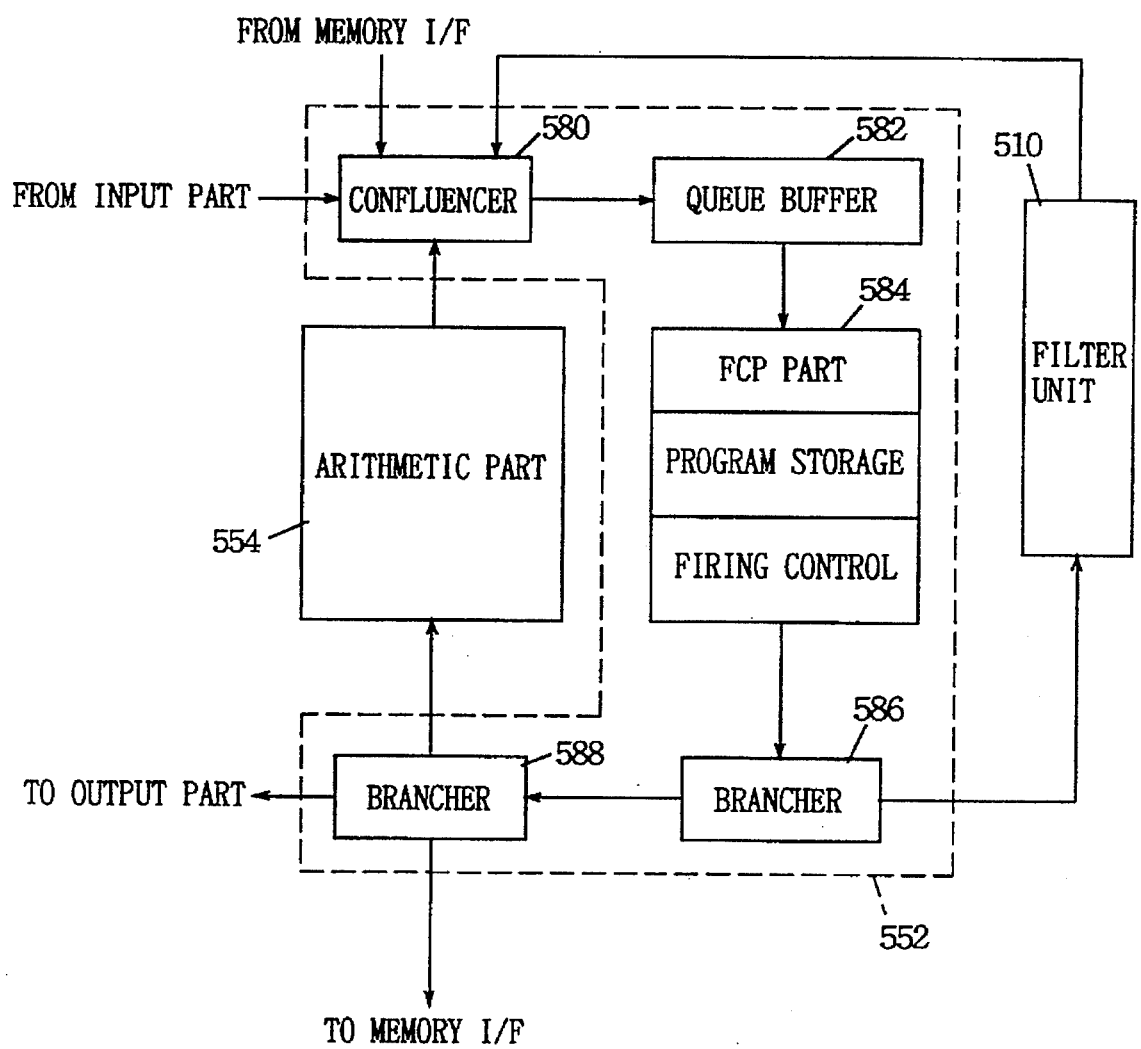
FIG. 64 illustrates a specific structure of a program/retarding memory section shown in FIG. 63.

FIG. 64 schematically illustrates the program/retarding memory part 552 shown in FIG. 63. Referring to FIG. 64, the program/retarding memory part 552 includes a confluencer 580 for confluencing the data packets from the input part 556, the memory interface (I/F) 560, the filter unit 550 and the arithmetic part 554 shown in FIG. 63, a queue buffer 582 for absorbing fluctuation of data flow, a firing control part (FCP part) 582 provided with a program function for shifting operation codes and node specifying numbers and detecting firing with respect to data from the queue buffer 582, a brancher 586 for branching data from the FCP part 584 to the filter unit part 510 or another brancher 588, and the brancher 588 for branching the data packet from the brancher 586 to the arithmetic part 554, the output part 558 or the memory interface 560. The confluencer 580, which is a four-input one-output unit, outputs data received in its inputs on condition that its output is empty.

The branchers 586 and 588 sort supplied data in accordance with destination node specifying numbers included in the data packet.

Figure 65:
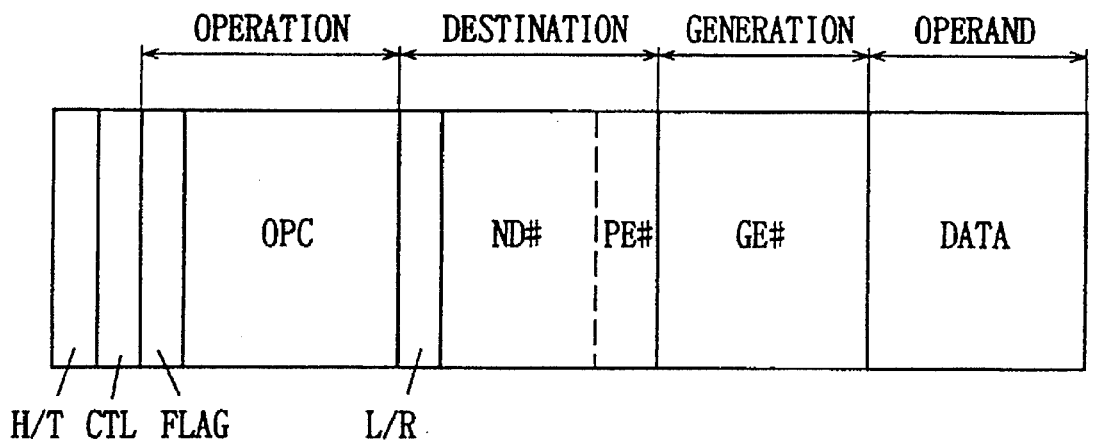
FIG. 65 illustrates a structure of a data packet supplied to the data driven type processor.

FIG. 65 illustrates the format of each data packet which is supplied to the confluencer 580 shown in FIG. 64. Referring to FIG. 65, the data packet includes a word identifying flag H/T showing a head position of a word, and an external control system transfer flag CTL indicating data to be transferred to an external control system in its head bit position. The data packet further includes an operation code OPC and flags FLAG indicating the contents of this operation. These flags FLAG include those indicating whether or not the operation is a memory access operation, whether or not the operation is a filter arithmetic operation, and whether or not the operation is to be carried out in the arithmetic part 554 in this data driven type processor. Namely, these flags FLAG are formed by a plurality of bits. The flags FLAG further include a flag indicating whether or not the operation indicated by the operation code OPC is a two-term arithmetic operation or a single term arithmetic operation.

The data packet further includes a destination field storing destination data indicating the destination of this data packet, a generation field storing a generation number for identifying the set of the data, and an operand field storing the data. The destination field includes a flag L/R indicating left/right identification for two input nodes as to whether this data packet is supplied to a left node or a right node, a node number ND# indicating a node specifying number of a program executed in this processor, and a processor number PE# for specifying a processor in a multi-processor system. The generation field includes a generation number GE#. This generation number GE# is employed since a dynamic data driven type processor is assumed as the processor. Firing is determined when retarded data having the same destinations and the same generation numbers are completely collected.

The operand field includes operand data DATA, which is processed data.

In the structure shown in FIG. 64, the data packets are first confluenced with each other in the confluencer 580 to be supplied to the queue buffer 582, and successively supplied to the FCP part 584. In the FCP part 582, Hush addresses which are formed by the node number ND# and the generation number GE# of the destination field are employed as addresses of the program and retarding memories to read the corresponding operation and a node number to be reached after completion of the operation, so that an operation to be subsequently executed is decided.

When the retarding memory part determines that waiting for the operation to be subsequently executed is completed and the operation is rendered executable, this operation is supplied to the filter unit part 510 by the brancher 586, or transferred to the arithmetic part 554, the memory interface 560 or the output part 558 through the brancher 588. While firing conditions are described later in detail, the operation which is supplied to the filter unit part 510 to be executed is unconditionally brought into a firing state, so that a new operation code (filter operation) is allotted to the data packet with its node number, and supplied to the filter unit part 510. A determination as to whether the operation is to be executed in the filter unit part 510, to be executed in the arithmetic part 554, or to be transferred to the memory interface 560 or the output part 558 is made by recognizing the flags FLAG included in the operation field.

The filter unit part 510 decodes the operation code OPC included in this operation field (filter operation is implemented in the form of function call), and the sequence controller SC reads programs corresponding to filter arithmetic operations specified by the operation code OPC from the program memory PM shown in FIG. 2 and sets the same in the register file, so that filter processing along the operation are successively executed.

Figure 66:
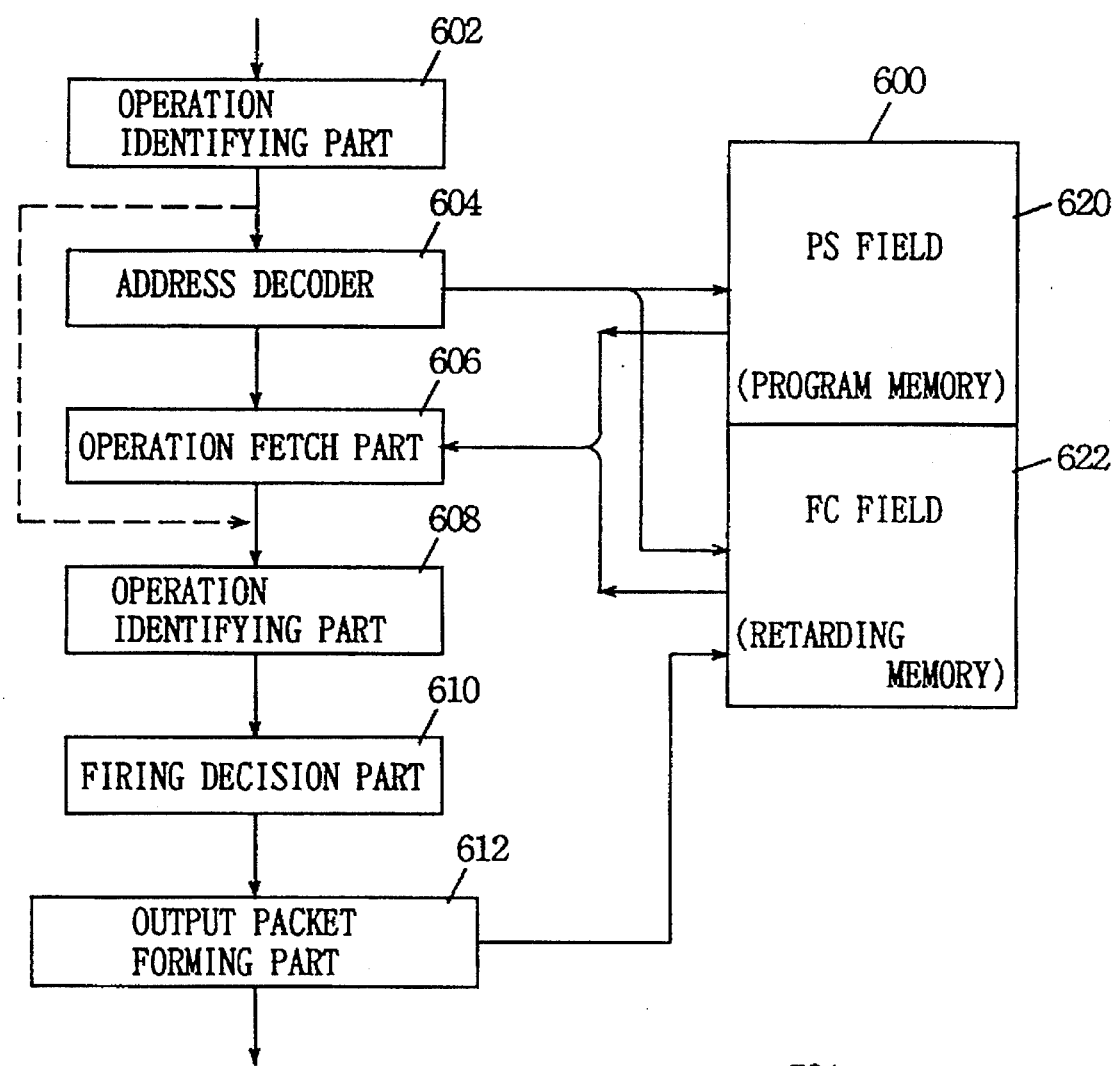
FIG. 66 illustrates a specific structure of an FCP section shown in FIG. 64.

FIG. 66 illustrates the structure of the FCP part 582 shown in FIG. 64 in more detail. Referring to FIG. 66, the FCP part 582 includes an FCP memory 600 which is formed by an associative memory, for example, and control logic which is arranged to form a six-stage micropipeline. The FCP memory 600 includes a PS field (program memory) 620 which stores an operation code for a destination node included in an input data packet and the number of a destination node to which the result of an arithmetic operation in this node is transferred, and an FC field (retarding memory) 622 which stores information indicating whether or not an operation read from the PS field 620 fires.

Figure 67:
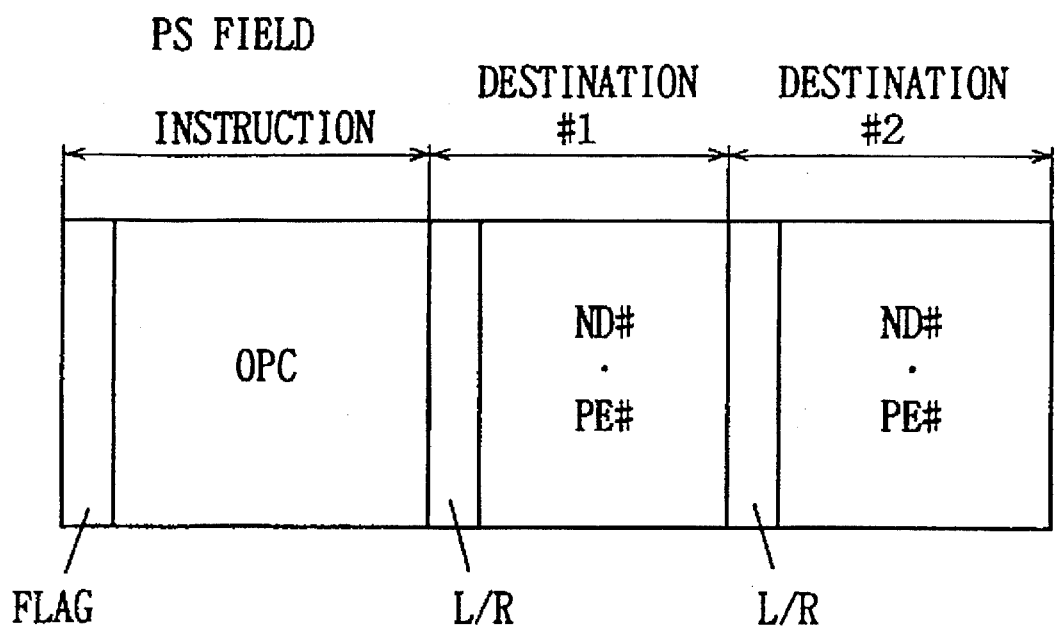
FIG. 67 illustrates a structure of an entry of a PS field shown in FIG. 66.
Figure 68:
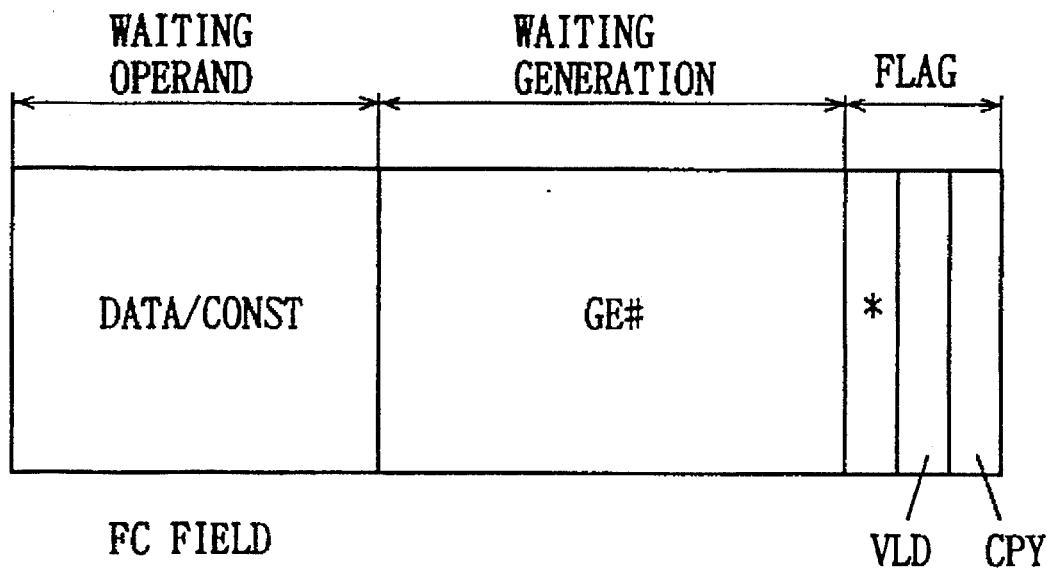
FIG. 68 illustrates a structure of an entry of an FC field shown in FIG. 66.

FIGS. 67 and 68 illustrate structures of data in single entries of the PS and FC fields respectively. Referring to FIG. 67, the PS (program storage) field includes an instruction field and a destination field. The instruction field includes an operation code OPC, and flags FLAG which identify the contents of the operation code OPC. The flags FLAG, which are similar to the flags FLAG shown in the input data packet (see FIG. 65), indicate whether the arithmetic operation indicated by the operation code OPC is a two-term arithmetic operation, a single term arithmetic operation, a memory access operation or a filter arithmetic operation.

Storable is information on two destinations, to which the result of the arithmetic operation is written upon execution of the operation of this operation code OPC, at the maximum. First and second destination nodes #1 and #2 include left-right identifying flags L/R, node numbers ND# and processor numbers PE# of two input nodes respectively. When two destination nodes are present, a flag CPY indicating copying of output data in outputting becomes "1".

Referring to FIG. 68, an FC (firing control) field includes a waiting operand DATA/CONST which is in a waiting state for counter data, a waiting generation field indicating a generation which is in a waiting state, and various control flags. The waiting operand may indicate operand data DATA or a constant CONST. The waiting generation field stores the generation number GE#. A flag region includes a valid flag VLD which indicates whether or not data being in a waiting state in this FC field is valid, and a copy flag CPY indicating that a copy operation must be carried out when two destinations are present.

In order to determine firing/non-firing, waiting generation numbers GE# are compared with each other on condition that the valid flag VLD is "1". When the generation numbers GE# match with each other, a firing packet is formed. Namely, the waiting operand of this FC field and the operand data of the input data packet are subjected to an arithmetic operation in accordance with the operation code OPC of the PS field.

When the operation code OPC indicates an arithmetic operation in the filter unit part 510, the flags FLAG indicate a filter operation. In this case, a firing state is unconditionally attained due to absence of waiting data, and an output data packet is formed from the operand data DATA (data included in the input data packet) and the operation and the destination node number read from this PS field, and transferred to the filter unit part 510 through the brancher 586 (see FIG. 64).

Referring again to FIG. 66, the FCP part 584 includes an operation identifying part 602 which identifies whether or not an operation received from the queue buffer 582 is an execution operation (operation other than a load/damp operation for the FCP memory 600), an address decoder 604 which accesses the FCP memory 600 with Hush addresses of the node number ND# and the generation number GE# included in the data packet received from the operation identifying part 602, an operation fetch part 606 which reads fields (PS and FC fields) addressed by the address decoder 604, a second operation identifying part 608 which identifies the type of the operation read by the operation fetch part 606, a firing decision part 610 which decides firing/non-firing of the data packet along the result of identification by the operation identifying part 608, and an output packet forming part 612 which forms a packet along the result of decision in the firing decision part 610. The processings are now described.

First, the FCP part 584 carries out the following operation: When the result of the arithmetic operation indicated by the operation code read from the PS field must be transferred to two nodes as described above, the flag CPY of the corresponding FC field becomes "1".

With respect to an operand having one input of constant data, the constant data (CONST) is written in the FC field of the same address while "1" is written in a constant flag CST (shown in FIG. 68). When an operand which is paired with the constant data is inputted, a firing packet is unconditionally formed.

In principle, the content of a precedently inputted one of left and right operands is written in the waiting operand (DATA) of the FC field and a flag VLD indicating valid data which is in a waiting state is brought into "1" in a two-term arithmetic operation having no constant data. The generation number GE# is written at this time. As to a subsequently inputted operand, the contents of the two operands are referred to each other on condition that the valid flag VLD is "1" so that a firing packet is formed when the generation numbers GE# of these operands match with each other, and the valid flag VLD is brought into "0" to indicate that the operand which is in a waiting state is consumed. When the generation numbers GE# mismatch with each other in Hush collision, on the other hand, the data, which are not paired, are transferred onto the pipeline forming a loop in FIG. 64 (this processor forms a micropipeline for internal arithmetic operations), to wait for formation of an empty region in this retarding memory 622.

When the operation code OPC of the instruction field indicates a filter operation, a firing state is unconditionally attained with no reference to the content of the FC field, and a firing packet is formed. An operation of the FCP part 584 in execution of the program is now described.

The operation identifying part 602 decodes the operation code OPC which is included in the data packet received from the queue buffer 582. In such decoding, a determination is made as to whether the operation code OPC indicates an execution operation, an external control operation or a load/damp operation for the FCP memory 600. If the operation code OPC indicates an execution operation, a determination is made as to whether the operand is to access the same address as that included in the preceding data packet (through the node number ND# and the generation number GE#). When the operand is to continuously access the same address (address of the FCP memory 600), no memory access is carried out, in order to avoid overhead of access to the FCP memory 600. Alternatively, a firing packet, which is a pair of operands, is formed in the output packet forming part 612 (the technique of forming a firing packet is called prefiring).

The address decoder 604 executes address decoding with Hush addresses of the node number ND# and the generation number GE# which are included in the data packet supplied from the operation identifying part 602 in order to fetch a next operation, and forms an address of the FCP memory 600. Assuming that h represents a proper function (Hush function) and A represents an address of the FCP memory 600, the Hush address is expressed as follows:

$$A = h(ND\#, DE\#)$$

When $h(ND_i\#, GE_i\#) = h(ND_j\#, GE_j\#)$, different generation numbers may specify the same address A of the FCP memory 600. This phenomenon is called Hush collision. The Hush function h( ) is so defined as to minimize such collision. The Hush function may be defined by various methods, such as that of dividing key data (node and generation numbers) in a proper number of digits and adding the divided values to each other (convolution), or a method of squaring the keys and cutting out intermediate bit string. In place of squaring, the keys may be divided.

The contents of the FCP memory 60 can be searched at a high speed by executing the aforementioned Hush operation.

The operation fetch part 606 refers to the PS and FC fields of the FCP memory 600 along the address formed by the address decoder 604. Namely, it reads the operation and the destination information upon execution of this operation from the PS field 620 in the FCP memory, while reading information such as that on whether or not one operand is in a waiting state in the FC field 622 of the FCP memory 600 from the FC field 622 through the valid flag VLD.

The second operation identifying part 608 identifies the content of the arithmetic operation indicated by the operation code OPC read from the PS field 620. Namely, it identifies whether the operation is directed to an arithmetic operation using the filter unit part 510 shown in FIG. 64, an arithmetic operation using the arithmetic part 554, an access to the data memory through the memory interface, or data output.

When the operation is directed to an operation using the filter unit part 510, "1" is written in a flag indicating a filter operation among the flags FLAG. In this case, a firing state is unconditionally attained.

As to an arithmetic operation in the arithmetic part 554, an identification is made as to whether the same is a single term or two-term arithmetic operation. In the case of a two-term arithmetic operation, an identification is further made as to whether the arithmetic operation is directed to a constant arithmetic operation, prefiring (executed in the operation identifying part 602) or a two-variable arithmetic operation.

The firing decision part 610 decides firing/non-firing along the result of identification in the operation identifying part 608. Firing is unconditionally decided when the operation is directed to a two-term arithmetic operation, a constant arithmetic operation, prefiring or a filter operation using the filter unit part 510.

The firing decision part 610 further refers to the content of the FC field and decides whether or not the valid flag VLD is "1", thereby deciding whether or not a paired operand waits in the waiting region (FC field) of the FC memory 600 while further deciding match/mismatch of the generation numbers GE#.

As to an operand having no paired operand waiting for firing in a two-term arithmetic operation (the valid flag VLD of the FC field is "0"), the firing decision part 610 forms a flag for indicating writing in the FC field. As to operands having matching write addresses (Hush addresses) for the FCP memory 600 and valid flags VLD of "1" with mismatching generation numbers GE#, the firing decision part 610 decides Hush collision and forms a flag indicating the result of this decision.

The output packet forming part 612 forms an output packet along the result of decision in the firing decision part 610. Namely, it replaces an operand which is decided to fire with the operation code OPC, the flags FLAG and the destination information (the node number ND#, the processor number PE# and the two input identifying flag L/R) read from the PS field 602 and adds the queuing operand and the flag read from the FC field 622 to form a firing packet, while invalidating the corresponding FC field (zeronizing the valid flag VLD).

As to a data packet for unconditional firing, the output packet forming part 612 forms a data packet along the information read from the PS field 620 and the FC field 622 while carrying out no change in the FC field 622.

When no operand for firing is in a waiting state in an invalid arithmetic operation, the output packet forming part 612 writes the operand data and the generation number GE# included in this data packet in the FC field 620 while writing "1" in the valid flag VLD, for attaining a waiting state for operand data for firing.

In Hush collision, the output packet forming part 612 directly emits the data packet without changing the content thereof by the information from the PS and FC fields 620 and 622.

The data packet formed by the FCP part 584 is transferred to a corresponding part through the branchers 586 and 588 (se FIG. 64). Operand data causing Hush collision is supplied to the queue buffer 582 through the branches 586 and 588, the arithmetic part 554 and the confluencer 580 in the structure shown in FIG. 64. The data packet is circulated this loop until the waiting memory region becomes empty. At this time, no arithmetic operation is carried out in the arithmetic part 554 (possibility/impossibility of arithmetic operation execution is identified by "0"/"1" of the valid flag VLD).

When a filter operation is executed in such a data driven type processor, the firing decision part 610 decides unconditional firing and the output packet forming part 612 forms a firing packet, so that the formed firing packet is supplied to the filter unit part 510 through the brancher 586. Along the operation code OPC included in the data packet which is received from the brancher 586, the filter unit part 510 selects a program operation group to be executed and executes a desired filter operation, for writing the result of the execution in the operand data region of the data packet and again transferring the same to the combiner 580. The structure and operations of the filter unit part 510 are now described.

Figure 69:
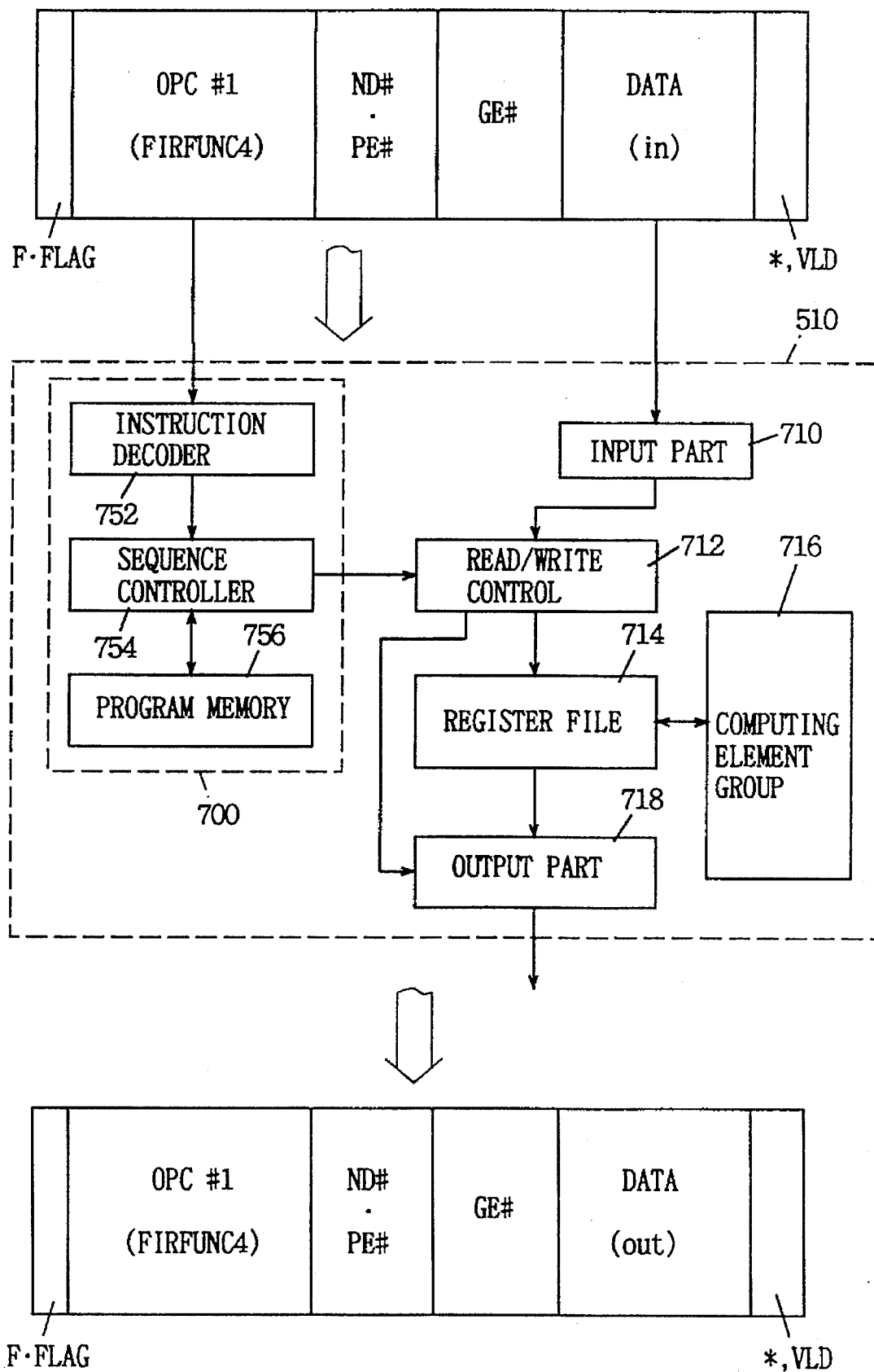
FIG. 69 illustrates structures of a data driven filter unit employed in the second embodiment of the present invention and an input/output data packet for this filter unit.

FIG. 69 illustrates the structures of the filter unit part 510 and an input/output data packet for this filter unit part 510. The filter unit part 510 shown in FIG. 69 is substantially identical in structure to the filter unit shown in FIGS. 1 and 2. Namely, the filter unit part 510 includes an input part 710 which receives operand data, a register file 714, a computing element group 716 including multipliers and add/shift composite computing elements, an output part 718 which outputs data, a program control part 700 which controls arithmetic operations, and a read/write control part 712 which controls data input/output to the register file 714 along programs from the program control part 700. Operations of the input part 710, the read/write control part 712, the register file 714, the output part 718 and the computing element group 716 are similar to those of the filter unit described above with reference to FIGS. 1 to 62B.

The program control part 700 includes an operation decoder 752 which decodes an operation code OPC of a received data packet, and a sequence controller 754 which reads a corresponding program group from the program memory 756 along a filter operation specified by the operation decoder 752 for controlling execution of the operation. The storage content of the program memory 756 is programmable from an exterior, so that the filter operation content thereof is programmed along application. Similarly to the access to the data memory shown in FIG. 63, the program memory 756 may be rendered accessible along an operation from the data driven type processor, so that a required filter operation is stored in this program memory 756.

The instruction decoder 752, which decodes the operation code OPC and specifies a filter operation to be executed, may be included in the sequence controller 754. When a filter operation content set in the register file 714 is identical to a filter operation indicated by a currently received operation code, the instruction decoder 752 informs the sequence controller 754 of this fact. In this case, the sequence controller 754 writes input data and outputs output data with no access to the program memory 756. The operations are now briefly described.

When the data driven type processor supplies a data packet for executing a filter operation, an operation code OPC#1 of this data packet is supplied to the instruction decoder 752. It is assumed here that the instruction decoder 752 decodes the operation code OPC#1, and a determination is made that a filter operation FIRFUNC4 is specified. It is also assumed that this filter operation FIRFUNC4 is the aforementioned fourth order FIR instruction. At this time, the sequence controller 754 reads the aforementioned fourth order FIR operation (fir instruction group) from the program memory 756, and sets required data in the register file 714 through the read/write control part 712.

After this setting, operand data DATA (input data in) included in the data packet is supplied to the register file 714 through the input part 710 and the read/write control part 712, so that the specified fourth order FIR operation is executed. The result of this execution is outputted through the output part 718. The output part 718 outputs a data packet which has the same operation code and destination information as those of the input data packet, while its operand data is changed to output data DATA(out). This output data packet is supplied to the combiner 580 shown in FIG. 64.

In the structure shown in FIG. 69, the data packet is supplied to the operation decoder 752 and the input part 710 respectively. This structure is implemented by separating a data bus from an operation bus, while an alternative structure may be provided with an input/output interface circuit to sort the operation code and the operand data in an input interface part while writing the operand data of this data packet in an output interface part so that a final output data packet is formed.

Referring to FIG. 69, a flag F.FLAG indicates a filter operation.

An exemplary program in combination of a data driven filter unit and a data driven type processor is shown in the following. This program is described in the C language.

| | | |
|---|---|---|
| #define OFFSET 5 | "define value 5 in OFFSET" | |
| main(in) | | |
| { | | |
|   int in, out; | "parameter and definition of | |
|   int a = 0; | type thereof" | |
|   static int b[10]; | | "ensure region of arrangement" |
|   { | | |
|   FIRFUNC4 (in, out); | | "call filter operation in the form of function call" |
|   a = out*OFFSET + a; | | "multiply result of filter operation by OFFSET and add a" |
|   b[5] = a; | | "write a in 5th position of arrangement b" |
|   } | | |
| } | | |

In this example, a value 5 is defined in OFFSET and a main function is then read out so that the processing is executed along the main function. First, arguments (parameters) in, out and a are defined with types thereof, and then an arrangement region is ensured. 10 positions are fixedly prepared in this case. Then, a filter operation is read out in the form of function call. This filter operation is FIRFUNC4(in, out). When this operation is specified, the filter operation is carried out in the filter unit part 510.

Then, an arithmetic operation a=out*OFFSET+a is executed in the arithmetic part 554 (see FIG. 64) of the data driven type processor. The result a of this execution is written in the fifth position of the arrangement b, the region of which is ensured in the data memory shown in FIG. 64, so that the data is written by access to this data memory.

When this program is executed, input data is first supplied to the FCP part 584 through the combiner 580 and the queue buffer 582 shown in FIG. 64. In the FCP part 584, the filter arithmetic operation FIRFUNC4(in, out) is read out along the destination information. This operation, which is a filter operation, is unconditionally brought into a firing state, and supplied to the filter unit part 510 through the brancher 586 shown in FIG. 64. The filter unit part 510 is supplied with operand data with the filter operation FIRFUNC4(in, out). Thus, all input data to be subjected to the filter operation are transmitted to the filter unit part 510, so that the specified filter operation is carried out.

The result of this operation is transferred to the FCP part 584 through the combiner 580 and the queue buffer 582 shown in FIG. 64 again in the form of a data packet. The FCP part 584 reads the arithmetic operation from the destination information of the received data packet to execute the multiplication out*OFFSET, access the data memory 570, read the data from the fifth position b[5] of the arrangement b, adds the same to the result of the multiplication, and re-writes the result of this addition in the fifth position of the arrangement b. The series of arithmetic operations, which are those in the data driven type processor, are executed in the arithmetic part 554 shown in FIG. 64 independently of the filter operation in the filter unit part 510. The arithmetic operation for writing the resultant data a in the fifth position of the arrangement b is carried out by accessing the data memory through the memory interface 560.

Due to the aforementioned series of operations, all arithmetic operations can be executed along the data driven system even if a complicated program includes filter arithmetic operation processing, whereby even such a complicated program can be efficiently executed at a high speed.

In the aforementioned embodiment, the data driven type processor is not restricted to the above structure but may have an arbitrary structure so far as the same executes processing along the data driven system.

[Performance]

When the data driven type information processor according to the present invention is employed for IIR filter processing, it is possible to attain a processing speed 45 to 60 times that of filter processing using only a conventional data driven type processor. Further, it is possible to attain a processing speed of 5 to 10 times that of FIR filter processing using only a data driven type processor.

Further, it is possible to freely set the tap number as compared with a filter unit using a dedicated LSI (the entry number in the register file can be easily increased/decreased by a program). Therefore, the structure of the filter unit can be arbitrarily set according to application, to easily cope with any usage.

While IIR and FIR filters are structured independently of each other in the aforementioned embodiment, it is possible to easily form a combined filter by combining these filters.

When a data driven filter unit is combined with a data driven type processor, it is possible to easily cope with complicated application including filter processing such as image data processing including Fast Fourier Transform. Since both of the data driven filter unit and the data driven type processor execute processing in the data driven system, it is not necessary to employ programs of different systems and the units are in good consistency with each other, while the programs can be easily prepared.

As understood from the above description of the embodiments, the present invention has the following principal effects:

(1) The filter unit is formed by the register file, having a plurality of registers in/from which data, constants and initial values are read/written along the rule of single substitution/single readout, and the computing element group having multipliers and add/shift composite computing elements, whereby basic filter operations in FIR filter processing and IIR filter processing can be expressed as minimum operation units. Thus, the filter unit can execute filter processing using instructions which are related to only the filter processing, so that the filter processing can be executed at a high speed.

(2) The entry number of the register file corresponds to the tap number, whereby the entry number can be set by a program, and a filter of an arbitrary structure can be easily implemented.

(3) The data driven type information processor is formed by the data driven filter unit which executes a filter operation along the data driven system and the data driven type processor which executes an arithmetic operation along the data driven system, whereby it is possible to easily cope with complicated application including a filter operation in its contents. Further, the filter operation currently executed by the data driven filter unit is programmable, whereby an arbitrary filter operation can be easily executed so that it is possible to obtain a data driven type information processor which can flexibly cope with various types of application.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A unit for implementing a digital filter that digitally filters received data under data flow protocol, comprising:

a register file having a plurality of registers and being organized as a plurality of entries, and each entry being partitioned into a data field and a destination field, the data field having at least one register allocated for storing data to be processed and constant data, and the destination field having at least one register allocated for storing destination information specifying one of a register in said data field and an output node, and both the data field and the destination field also having at least one register allocated to a discrete operation necessary for the digital filter;

arithmetic elements including a multiplier, operatively connected to the register file, for multiplication and an add/shift composite computing means, operatively connected to the register file, for addition and shift composite arithmetic operation;

data read means, operatively connected to the register file, for determining whether an entry has fired by detecting whether required data for the entry have been collected in the data field, for reading required data for a corresponding arithmetic operation when the entry has fired, and for supplying that required data to corresponding arithmetic elements upon complete collection of said data in said data field; and processed data write means for writing output data from said corresponding arithmetic elements in a register in said data field being indicated by destination information stored in a register of the destination field portion of the fired entry.

2. A unit in accordance with claim 1, wherein said read means includes means for reading data required for an arithmetic operation upon complete collection of the required data in an entry.

3. A unit in accordance with claim 2, wherein said processed data write means includes means for writing the output data from said arithmetic elements in a register being specified by a destination information stored in the register of said destination field of said entry.

4. A unit in accordance with claim 2, wherein said read means includes means for preferentially reading data required for the add/shift composite arithmetic operation for supply to said arithmetic elements when both of data required for the multiplication and said data required for said add/shift composite arithmetic operation are completely collected in a single entry.

5. A unit in accordance with claim 2, wherein said entries are prioritized into an order to implement said digital filter so that said read means reads data from an entry having a higher priority when data required for a common arithmetic operation has been completely collected in a plurality of said entries.

6. A unit in accordance with claim 1, further including means for transferring said output data from said arithmetic elements to said output node when said destination information of said destination field specifies said output node, said data transferred to said output node being outputted as filter-processed data.

7. A unit in accordance with claim 1, wherein:

each entry corresponds to a basic instruction that dictates:
at least four inputs and two outputs,
a delay operation node for delaying data on a second input being supplied as an alternative to data on a first input;
a multiplication node for multiplying data on one of said first input and an output from said delay operation node by data on a third input;
an addition node for adding data on an output of said multiplication node to data on a fourth input;
a shift node for bit shifting data on an output of said addition node by an amount specified by data on a fifth input;
a first output for outputting data on said first input or data on an output of said delay operation node;
and a second output for outputting data on an output of said shift node; and a single entry includes data registers for storing data of said first to fifth inputs and destination registers for storing destination information specifying destinations of data on said first and second outputs, add said data registers, and said destination registers being included in said data field and said destination field, respectively.

8. A unit in accordance with claim 1, wherein a basic instruction dictates a multiplication node for carrying out a multiplication of a first input and a second input, an addition node for carrying out an addition of an output of said multiplication node and a third input, a shift node for bit shifting of an output of said addition node by an amount specified by a fourth input, a delay node for delaying an output of said shift node, a first output for outputting said first input, and a second output for outputting an output of said delay node, and a single said entry includes data registers for storing data indicating said first to fourth inputs and destination registers for storing data indicating destinations of said first and second outputs, said data registers and said destination registers being included in said data field and said destination field respectively.

9. A unit in accordance with claim 1, further including means for inhibiting said read means from rereading data excluding a constant from a register file when said data is written in said a register of said data field and said data is read from said a register by said read means.

10. A unit in accordance with claim 1, further including data input means for writing said received data in a specific register in said data field.

11. A unit in accordance with claim 1, wherein said data field includes a first register region for storing data employed for said multiplication, a second register region for storing the result of said multiplication, and a third register region including said second register region and being-employed for said add/shift composite arithmetic operation.

12. A unit in accordance with claim 1, wherein said arithmetic elements include only a single multiplier and a single add/shift composite computing means.

13. A unit in accordance with claim 1, wherein said arithmetic elements include a single multiplier and a single add/shift composite computing means in correspondence to each said entry, data of respective entries being processed in parallel with each other.

14. A unit in accordance with claim 1, further comprising:

program storage means for storing a group of programs for executing filter processing, each said program including a basic filter processing instruction including a multiply operation, an add/shift composite arithmetic operation and a delay operation, and means for reading the program group from said program storage means and initializing data in said register of said register file along the read program group.

15. A unit in accordance with claim 14, wherein said means for reading and initializing includes means for reading corresponding program group from said program storage means in accordance with a filter processing operation being supplied from a data driven type information processor in the form of a data packet.

16. A unit in accordance with claim 15, wherein said filter processing operation is included in said data packet in the form of function call, said program storage means storing respective said program groups of a plurality of filter operations in correspondence to function names.

17. A unit in accordance with claim 15, wherein said destination field includes a register for storing output specifying data indicating an output node to which data to be outputted is transferred, said unit further including means for transforming the data being transferred to said output node to a data packet of a form suitable for processing by said data driven type information processor for transfer to said data driven type information processor.

18. A unit for carrying out filter processing of received data in accordance with a data driven system, comprising:

a register file having a plurality of registers, the registers of said register file being organized into a data field for storing data to be processed and processed data and into a destination field for storing destination information specifying a register in said data field, the register file also being partitioned into a plurality of entries, each entry of said register file including a portion of said data field and a portion of said destination field;

data input means, operatively connected to the register file, for writing said received data in a prescribed register in said data field of said register file;

arithmetic elements including a multiplier, operatively connected to the register file, for multiplication and an add/shift composite computing means, operatively connected to the register file, for add and shift composite arithmetic operation;

read means for reading the content of a data register in said data field portion of a firing entry, in which all required data for an arithmetic operation dictated by the entry are available, of said register file and for supplying that content to said arithmetic means;

write means for writing an output of said arithmetic elements in a register in said data field of said register file, said write means including means for writing said output of said arithmetic elements in a data register being indicated by said destination information stored in a destination register of said destination field; and output means for reading the content of prescribed register in said data field of said register file and outputting the same to an exterior of said unit.

19. A unit in accordance with claim 18, wherein said entry corresponds to a single basic filter processing instruction, said basic filter processing instruction expressing a unit of filter operation of either a finite impulse filter or an infinite impulse response filter.

20. A data driven information processor for implementing a digital filter comprising:

a register file having a plurality of registers, the registers of said register file being organized into a data field for storing data to be processed and processed data and into a destination field storing destination information for specifying a register in said data field, the register file also being partitioned into a plurality of entries, a single entry of said register file including a portion of said data field and a portion of said destination field;

arithmetic elements including a multiplier, operatively connected to the register file, for multiplication and an add/shift composite computing means, operatively connected to the register file, for addition and shift composite arithmetic operation;

program memory means, operatively connected to the register file, for storing operations in correspondence to a node being assigned to a program to be processed;

operation read means for accessing said program memory means in response to a data packet at least including an operand and a node specifying number and reading an operation corresponding to said node;

decision means for deciding whether or not said operation being read by said operation read means specifies an operation employing said arithmetic elements;

transmission means, operatively connected to the operation read means and the decision means, for transmitting a data packet to the register file, the data packet including said read operation with a node specifying number and operand data being read in linkage with said operation, when the result of said decision in said decision means indicates employment of said arithmetic elements;

data input means for writing said operand data in a prescribed register in said data field of said register file in response to said data packet from said transmission means;

data read means for reading the content of a register in said data field of an entry of said register file in response to said data packet from said transmission means and for supplying that content to said arithmetic elements when that entry has fired;

data write means, operatively connected to the register file, for writing an output of said arithmetic elements in a register in said data field portion of the fired entry in response to said operation of said data packet, said data write means including means for writing said output of said arithmetic elements in a data register being indicated by destination information stored in a destination register in said destination field portion of the fired entry; and data output means for reading the content of a prescribed data register in said data field of said register field in response to said data packet from said transmission means for supply to said operation read means in the form of a data packet.

21. A method of driving a unit, the unit comprising a register file having a plurality of registers, the registers of said register file being organized into a data field for storing data to be processed and processed data and into a destination field for storing destination information for specifying a register in said data field, the register file also being partitioned into a plurality of entries, a single entry of said register file including a portion of said data field and a portion of said destination field, and arithmetic means including a multiplier and an add/shift composite computing element, for filtering processing of received data in accordance with a data driven system, said method comprising the steps of:

writing said received data in a prescribed register in said data field of said register file;

reading the content of a data register in said data field portion of a firing entry in said register file and supplying that content to said arithmetic means;

writing an output of said arithmetic means in a register in said data field portion of the firing entry, said step of writing including a step of writing said output of said arithmetic means in a data register being indicated by destination information stored in the destination register of said destination field portion of the firing entry; and reading the content of a prescribed data register in said data field of said register file for outputting to an exterior of said unit.

22. A method in accordance with claim 21, further comprising a step of writing initial data in said register file in accordance with a program group for executing said filter processing.

23. A method of driving a unit, the unit comprising a register file having a plurality of registers, the registers of said register file being organized into a data field for storing data to be processed and processed data and into a destination field storing destination information for specifying a register in said data field, the register file also being partitioned into a plurality of entries, a single entry of said register file including a portion of said data field and a portion of said destination field, arithmetic means including a multiplier and an add/shift composite computing element, and program memory means for storing an operation in correspondence to a node being assigned to a program to be processed, for executing digital filtering in accordance with a data driven system, said method comprising the step of:

accessing said program memory means in response to a data packet at least including an operand and a node specifying number for reading out an operation corresponding to the specified node;

deciding whether or not the read out operation specifies an arithmetic operation employing said arithmetic means;

transmitting a data packet into the register file, the data packet including said read out operation with a node specifying number and operand data being read in linkage with said read operation, when the result of said decision indicates employment of said arithmetic means;

writing said operand data in a prescribed register in said data field of said register file in response to the transmitted data packet;

reading the content of firing register in said data field of an entry of said register file in response to said transmitted data packet and supplying that content to said arithmetic means when that entry has fired;

writing an output of said arithmetic means in a register in said data field portion of the fired entry in response to said operation of said data packet, said writing step including a step of writing said output of said arithmetic means in a data register being indicated by a destination information stored in an associated destination register of said destination field portion of the fired entry; and reading the content of a prescribed data register in said data field of said register file in response to said transmitted data packet for outputting in the form of a data packet in order for accessing said program memory means.

24. A method in accordance with claim 23, wherein said data driven information processor includes filter operation storage means for storing a group of programs for executing filter processing, each said program corresponding to a single entry, said method further including the steps of:

reading said group of programs from said filter operation storage means in response to said transmitted data packet, and initializing said register file in accordance with the read program group.

25. A computer-implemented method of implementing a filter for removing noise from a signal, including an Infinite Impulse Response (IIR) filter on a data driven computer, the filter including a register file having a plurality of registers and being organized as a plurality of entries, each entry being partitioned into a data field and a destination field, the data field having at least one register allocated for storing data to be processed and the destination field having at least one register allocated for storing destination information, the computer-implemented method comprising the steps of:

a) decomposing the filter into a set of at least two instructions;

a1) each instruction operating upon a desired set of data from the signal including at least one desired datum;

a2) each instruction including at least one of a step of multiplying, a step of unit delay, a step of adding, and a step of bit shifting;

b) ordering the instructions into a priority;

c) storing the prioritized instructions in the register file;

d) executing, by accessing the register file, the instructions according to the priority;

e) executing, by accessing the register file, each instruction under data flow protocol such that when all members of the instruction's desired data set become available, the instruction is executed, thereby using the filter to process the signal; and f) supplying an output of step e) to a location indicated by destination information stored in the register file.

26. A method as in claim 25, wherein:

the step of bit shifting implements division.

27. A method as in claim 25, wherein:

the filter is an IIR filter; and at least one instruction includes a step of unit delay.

28. A method as in claim 25, wherein:

the filter is a combination of an IIR and an Finite Impulse Response (FIR) filter.

29. A method as in claim 28, wherein:

at least one instruction of the combination IIR and FIR filter is a combination IIR and FIR instruction; and at least one instruction includes a step of unit delay.

30. A method as in claim 25, wherein:

the step of unit delay functions by precluding operation upon a value in memory during an operation cycle.

31. A method as in claim 25, wherein:

at least one group of instructions includes at least two instructions that have the same priority such that these instruction members of the group are executed in parallel, subject to the data flow protocol.

32. A method as in claim 25, wherein said processing includes at least one of waveform shaping and removing noise components from the signal.

33. A method as in claim 25, wherein the signal is at least one of a digital video signal and a digital audio signal.

34. A data drive filter unit for processing a signal having Infinite Impulse Response (IIR) filter capacity, the filter being decomposed into at least two instructions, the filter unit comprising:

a register file having a plurality of registers and being organized as a plurality of entries, each entry being partitioned into a data field and a destination field, the data field having at least one register allocated for storing data to be processed and the destination field having at least one register allocated for storing destination information, one set of registers being allocated for each instruction;

at least one multiplier, operatively connected to at least two registers in at least one of the sets;

at least one adder, operatively connected to at least two registers in at least one of the sets;

at least one set of registers being connected to permit unit delay in at least one of the registers of the set;

each set of registers achieving one of the instructions as a function of its connections to the multiplier and the adder;

the at least one multiplier and adder operating upon the sets of registers according to a priority established for the sets;

the at least one multiplier and adder operating under data flow protocol such that when all members of an instruction's desired data set become available, the instruction is executed, thereby using the filter to process the signal; and write means for writing data output from the executed instruction to a location indicated by said destination information.

35. A filter unit as in claim 34, further comprising:

a bit shift circuit;

each set of registers achieving one of the instructions as a function of its connections to the multiplier, the adder, and the bit shift circuit.

36. A filter unit as in claim 34, wherein:

the bit shift circuit implements division.

37. A filter unit as in claim 34, wherein:

the filter unit is an IIR filter; and at least one instruction includes a step of unit delay.

38. A filter unit as in claim 34, wherein:

the filter unit is a combination of an IIR and an Finite Impulse Response (FIR) filter.

39. A filter unit as in claim 38, wherein:

at least one instruction of the combination IIR and FIR filter is a combination IIR and FIR instruction;

at least one instruction includes a step of unit delay.

40. A filter unit as in claim 34, wherein:

the filter unit performs unit delay in a register by precluding operation upon a value in the register during an operation cycle.

41. A filter unit as in claim 34, wherein:

at least one group, of at least two sets of registers, has the same priority such that the sets in the group are operated upon in parallel, subject to the data flow protocol.

* * * * *